United States Patent [19]
Fujii et al.

[11] Patent Number: 6,108,793
[45] Date of Patent: Aug. 22, 2000

[54] SEMICONDUCTOR DEVICE HAVING TIMING-STABILIZATION CIRCUIT AND METHOD OF TESTING SUCH SEMICONDUCTOR DEVICE

[75] Inventors: Yasuhiro Fujii; Hiroyoshi Tomita; Nobutaka Taniguchi; Yasurou Matsuzaki, all of Kawasaki, Japan

[73] Assignee: Fujitsu Limited, Kanagawa, Japan

[21] Appl. No.: 09/040,288

[22] Filed: Mar. 18, 1998

[30] Foreign Application Priority Data

Jul. 18, 1997 [JP] Japan .................................. 9-194189
Aug. 29, 1997 [JP] Japan .................................. 9-235026

[51] Int. Cl.<sup>7</sup> ............................................... G06F 1/04
[52] U.S. Cl. ........................ 713/400; 713/500; 713/502
[58] Field of Search .................... 713/400, 401, 713/500, 501, 502, 503, 600

[56] References Cited

U.S. PATENT DOCUMENTS

| | | | |
|---|---|---|---|
| 4,893,271 | 1/1990 | Davis et al. | 713/501 |
| 5,731,741 | 3/1998 | Yamamoto et al. | 331/11 |
| 5,845,109 | 12/1998 | Suzuki et al. | 713/401 |
| 5,982,812 | 11/1999 | Mensonides et al. | 375/215 |

*Primary Examiner*—Dennis M. Butler
*Attorney, Agent, or Firm*—Arent Fox Kintner Plotkin & Kahn

[57] ABSTRACT

A method of measuring a time which a timing-stabilization circuit requires in order to complete timing stabilization with regard to a semiconductor device provided with a first function to reset the timing-stabilization circuit and a second function to output a signal indicative of completion of the timing stabilization is disclosed. The method includes the steps of a) activating the timing-stabilization circuit, b) detecting a timing of the completion of the timing stabilization by using the second function, and c) measuring the time which the timing-stabilization circuit requires to complete the timing stabilization based on the timing.

73 Claims, 35 Drawing Sheets

| | Φb | Φc | JST | Φd | Φe |
|---|---|---|---|---|---|
| E ⌐<br>C _⌐ | H | L | H | H | L |
| E _⌐<br>C ⌐ | L | H | H | L | H |
| E ⌐<br>C ⌐_ | L | H | L | H | L |

SEMICONDUCTOR DEVICE HAVING TIMING-STABILIZATION CIRCUIT AND METHOD OF TESTING SUCH SEMICONDUCTOR DEVICE

BACKGROUND OF THE INVENTION

1. Field of the Invention

The present invention generally relates to semiconductor devices, and particularly relates to a method of testing a semiconductor device which is equipped with a timing-stabilization circuit such as a DLL (delay-locked loop) circuit or a PLL (phase-locked loop) circuit.

2. Description of the Related Art

A semiconductor device operating at a high speed is generally equipped with a timing-stabilization circuit such as a DLL/PLL circuit to achieve stable distribution of an external clock to internal circuits. The timing-stabilization circuit is also used for such purposes as improving conditions of a set-up time, a hold time, and a data-access time of the semiconductor device in addition to a purpose of supplying a stable synchronization signal to internal circuits.

The timing-stabilization circuit needs a certain time period (lock-on time) from the time of reception of an input signal before completing stabilization of internal signals by locking on to the input signal. At the time of switching on of a semiconductor device or at the time of a mode transition from a power-down mode for power conservation to a battery-back-up mode or to an active mode, the timing-stabilization circuit first switches from an inactive state to an active state before locking on, and, thus, a required time period before the locking on varies. It is vital to take an accurate measurement of the lock-on time with respect to such a case, therefore, in order to know an exact tolerance level of the timing-stabilization capacity of the semiconductor device.

FIG. 1 is a flowchart of a related-art method of measuring a lock-on time of a timing-stabilization circuit at the time when a semiconductor memory device is switched on.

In order to measure the lock-on time, a check has to be made as to whether the timing-stabilization circuit has locked on or not. The related-art method of FIG. 1 makes this check by using an access time of the semiconductor memory device. In advance, an access time is measured as a time period from the input of a read command to the output of data. This measurement is taken while the timing-stabilization circuit is locking on. When the timing-stabilization circuit is not locking on, the access time becomes longer than that in the lock-on state. A check thus can be made as to whether the timing-stabilization circuit is locking on by finding whether the access time is extended.

At a step S1, the number of clock pulses are counted as to how many clock pulses are necessary for a timing-stabilization circuit of a semiconductor memory device to lock on, and this number is denoted as n. For example, when it is found that the timing-stabilization circuit reliably locks on after receiving 1000 clock pulses, the number n is set to 1000.

At a step S2, the semiconductor memory device is powered on by supplying a power voltage VCC to the semiconductor memory device.

At a step S3, n clock pulses are input to make the timing-stabilization circuit lock on.

At a step S4, a timing of a data strobe STRB is set to 0 ns so as to correspond to a timing at which a read command is input to the semiconductor memory device. The data strobe STRB is a pulse used by a tester for detecting data so that the tester can latch the data read from the semiconductor memory device.

At a step S5, a read command is input by the tester to the semiconductor memory device, and a check is made whether the read data is latched by using the data strobe STRB. If the data is latched, it is ascertained that the access test has succeeded, and the procedure goes to a step S7. If the data is not latched, it is ascertained that the access test has failed, and the procedure goes to a step S6.

At the step S6, the data strobe STRB is delayed by a predetermined delay time, for example, by 0.1 ns. Then, the access test at the step S5 is repeated.

The timing of the data strobe STRB is delayed step by step at the step S6. When the data strobe STRB is finally set to a timing that allows the read data to be latched, it is ascertained that the access test has succeeded. That is, the timing of the data strobe STRB indicates an access time under the condition that the timing-stabilization circuit is locking on, i.e., indicates a time period from the input of the read command to the output of the data.

At the step S7, the timing of the data strobe STRB is stored as an access time AC0 under the lock-on condition of the timing-stabilization circuit. In the following steps, the access time AC0 will be used for measuring a time period that is required by the timing-stabilization circuit to lock on.

At a step S8, the number n of clock pulses is set to zero.

At a step S9, the timing of the data strobe STRB is set to 0 ns.

At a step S10, the power of the semiconductor memory device is cut, and the procedure waits for internal voltages to be discharged. Namely, after the power cut, the procedure waits 10 seconds, for example, before carrying out a next step.

At a step S11, the power voltage VCC is supplied to the semiconductor memory device.

At a step S12, n clock pulses are input.

At a step S13, a read command is input by the tester to the semiconductor memory device, and a check is made whether the read data is latched by using the data strobe STRB. If the data is latched, it is ascertained that the access test has succeeded, and the procedure goes to a step S15. If the data is not latched, it is ascertained that the access test has failed, and the procedure goes to a step S14.

At the step S14, the data strobe STRB is delayed by a predetermined delay time, for example, by 0.1 ns. Then, the procedure goes back to the step S10 to repeat the steps S10 through S13.

The timing of the data strobe STRB is delayed step by step at the step S14. When the data strobe STRB is finally set to a timing that allows the read data to be latched, it is ascertained that the access test has succeeded. That is, the timing of the data strobe STRB indicates an access time under the condition that the timing-stabilization circuit has received n clock pulses.

At the step S15, the timing of the data strobe STRB is stored as an access time ACn under the condition that the timing-stabilization circuit has received n clock pulses.

At a step S16, a comparison is made between the access time ACn and the access time AC0 which is an access time under the lock-on condition of the timing-stabilization circuit. If a difference between these access times is smaller than a predetermined threshold (e.g., 0.2 ns), the procedure goes to a step S18. Otherwise, the procedure goes to a step S17.

At the step S17, the number n of clock pulses is incremented by one. The procedure goes back to a step S9 to repeat the steps S9 through S16.

At the step S18, a lock-on time is obtained as n×tCLK by using n as the number of lock-on cycles based on the understanding that the timing-stabilization circuit locks on when n clock pulses are input. Here, tCLK denotes a cycle of the clock signal. This ends the procedure with measurement of the lock-on time being completed.

FIG. 2 is a flowchart of a related-art method of measuring a lock-on time of a timing-stabilization circuit at the time when a semiconductor memory device is reactivated (by returning from the power-down mode, for example).

The flowchart of FIG. 2 differs from the flowchart of FIG. 1 only in that the step S10 is divided into steps S10-1 through S10-3. At the step S10-1, the timing-stabilization circuit is prompted to lock on. At the step S10-2, the timing-stabilization circuit is deactivated, and changes are made to the power voltage VCC and/or temperature, etc. At the step S10-3, the timing-stabilization circuit is reactivated. By incorporating these steps, measurement of the lock-on time can be made with regard to a case in which the timing-stabilization circuit is reactivated after changes in various conditions are made during the period of inactivation. It should be noted that the step S14 includes, in addition to delaying the data strobe STRB, a step of returning the power voltage VCC and/or temperature, etc., to original conditions as they were before the inactivation.

According to the above procedures, the lock-on time can be measured with respect to a case of switching on of the timing-stabilization circuit and a case of reactivation of the timing-stabilization circuit. Since the steps S9 through S16 should be performed many times by gradually changing the number of input clock pulses, the test is quite time consuming. When there is a need to measure lock-on times under various conditions in terms of the power voltage VCC and the clock cycle tCLK, the above procedures needs to be repeated many times by changing the power voltage VCC and the clock cycle tCLK. This further extends the total test time. Further, the step S10 described above includes waiting for the internal voltages to be discharged after the power cut. This also adds to the total test time.

Accordingly, there is a need for a method of measuring a lock-on time of a timing-stabilization circuit in a short time for a semiconductor device.

SUMMARY OF THE INVENTION

Accordingly, it is a general object of the present invention to provide a method of measuring the lock-on time of a timing-stabilization circuit which can satisfy the need described above.

It is another and more specific object of the present invention to provide a method of measuring a lock-on time of a timing-stabilization circuit in a short time for a semiconductor device.

In order to achieve the above objects according to the present invention, a method of measuring a time which a timing-stabilization circuit requires in order to complete timing stabilization with regard to a semiconductor device provided with a first function to reset the timing-stabilization circuit and a second function to output a signal indicative of completion of the timing stabilization includes the steps of a) activating the timing-stabilization circuit, b) detecting a timing of the completion of the timing stabilization by using the second function, and c) measuring the time which the timing-stabilization circuit requires to complete the timing stabilization based on the timing.

In the above method, the first function to reset the timing-stabilization circuit and the second function to output a signal indicative of completion of the timing stabilization are utilized when these first and second functions are provided for the semiconductor device, such that the timing-stabilization circuit is reset by using the first function at the time of activation, and the time period required for completing the locking on is measured by using the second function. Accordingly, an accurate measurement of the lock-on time can be made in a short time with regard to a case in which the timing-stabilization circuit is activated at the time of switching on.

According to one aspect of the present invention, a time period from reactivation of the timing-stabilization circuit to the completion of locking on is measured by using the second function. Accordingly, an accurate measurement of the lock-on time can be made in a short time with regard to a case in which the timing-stabilization circuit is reactivated at a time of return from the power-down mode or the like.

In this manner, an accurate assessment can be made in a short time with regard to a lock-on capacity of the timing-stabilization circuit at the time of switching on of the semiconductor device or at the time of return from the power-down mode or the like.

Other objects and further features of the present invention will be apparent from the following detailed description when read in conjunction with the accompanying drawings.

BRIEF DESCRIPTION OF THE DRAWINGS

FIG. 1 is a flowchart of a related-art method of measuring a lock-on time of a timing-stabilization circuit at a time when a semiconductor memory device is switched on;

FIG. 7 through 7I are timing charts showing timings of various signals relating to FIG. 5 with regard to the lock-on-time-measurement method of FIG. 6;

DESCRIPTION OF THE PREFERRED EMBODIMENTS

In the following, embodiments of the present invention will be described with reference to the accompanying drawings.

Figure 1:
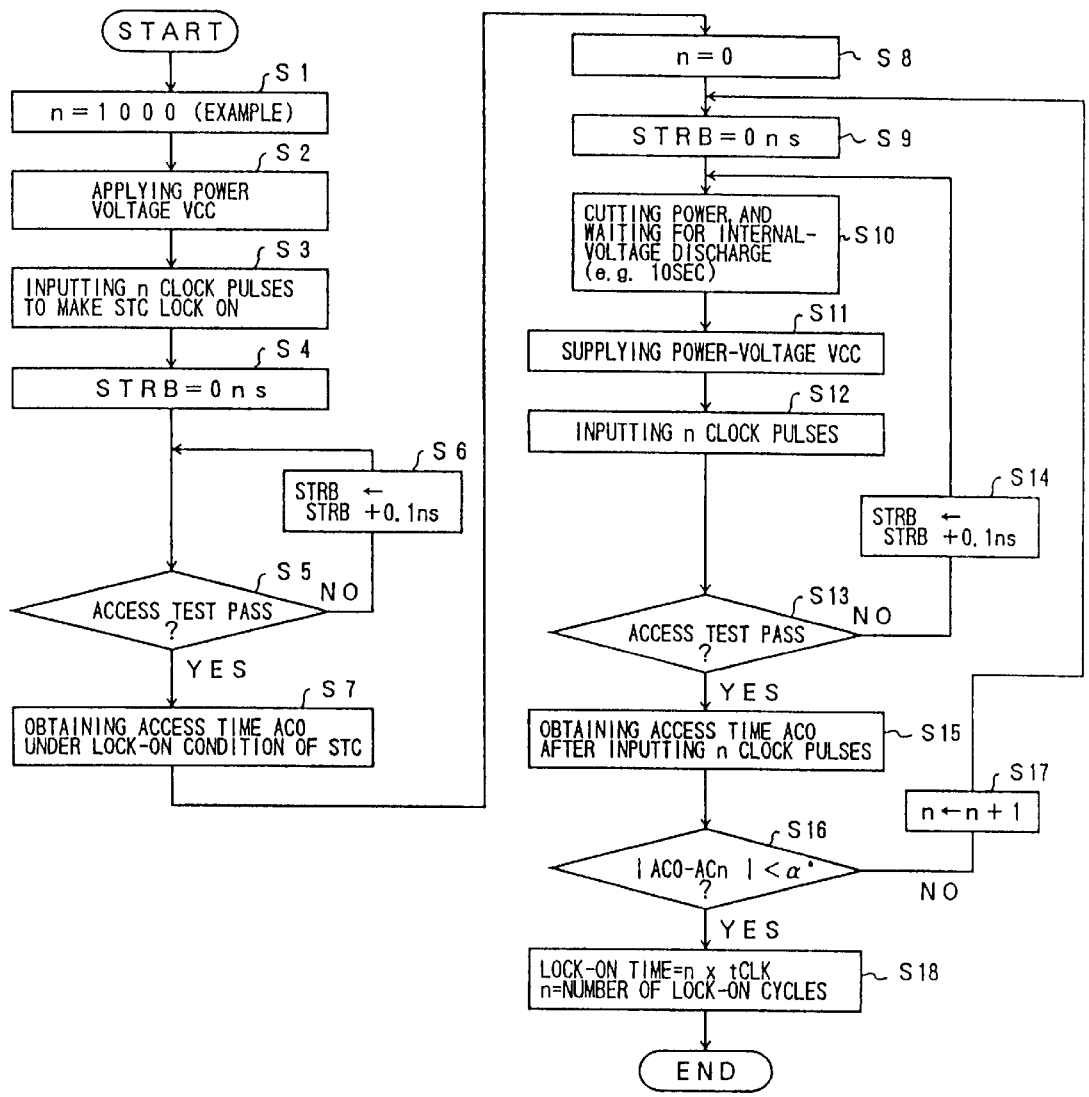
Figure 2:
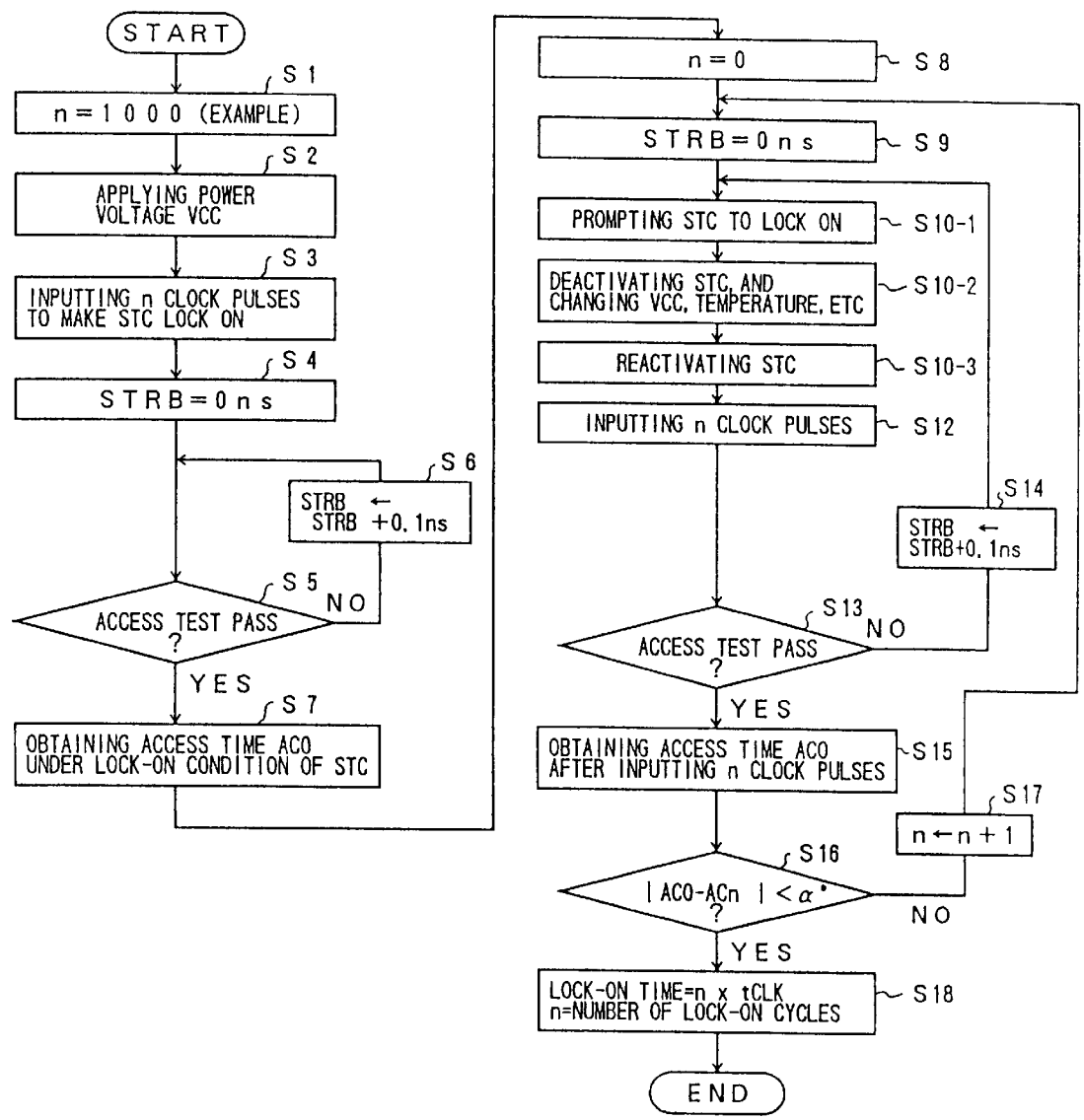
FIG. 2 is a flowchart of a related-art method of measuring a lock-on time of a timing-stabilization circuit at a time when a semiconductor memory device is reactivated (by returning from the power-down mode, for example)
Figure 3:
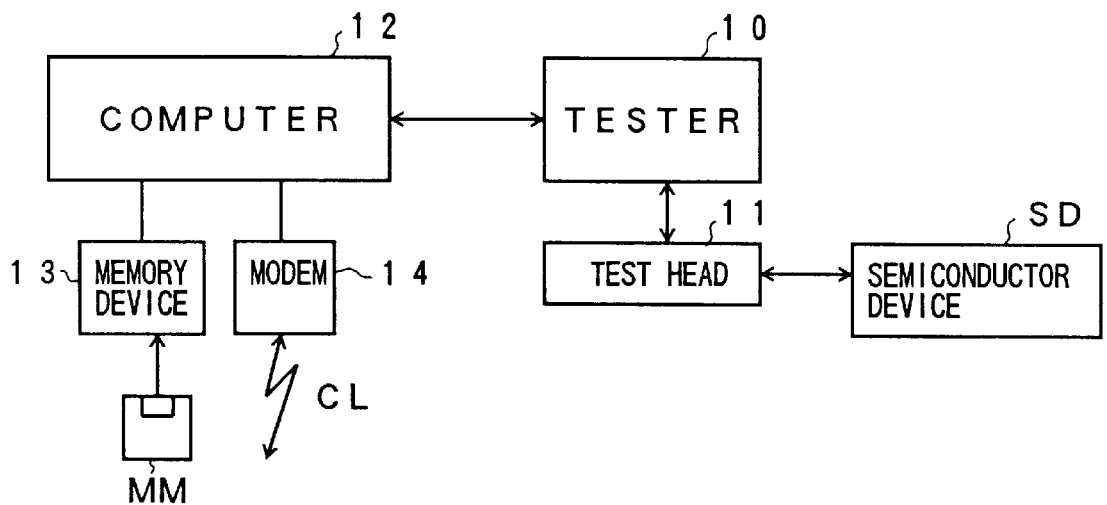
FIG. 3 is a block diagram of a system used for performing a method of measuring a lock-on time of a timing-stabilization circuit according to the present invention.

FIG. 3 is a block diagram of a system used for performing a method of measuring a lock-on time of a timing-stabilization circuit according to the present invention.

The system of FIG. 3 includes a tester 10, a test head 11, a computer 12, a memory device 13, and a modem 14. The tester 10 is a processing device including a processor, ROM, RAM, etc., and performs a test for a semiconductor device SD attached to the test head 11. The test head 11 has input/output nodes for connection. Operations of the tester 10 are controlled by the computer 12 such as a personal computer, a work station, or the like.

The computer 12 receives a program of a lock-on-time-measurement method from the memory device 13 or the modem 14. That is, the memory device 13 reads the program of a lock-on-time-measurement method from a memory medium MM such as a floppy disk, a CD-ROM, etc., and supplies the program to the computer 12. The modem 14 accesses a remote-site storage medium storing the program of a lock-on-time-measurement method via a communication line CL, and supplies the program to the computer 12.

Based on the program of measuring a lock-on time, the computer 12 and the tester 10 measure a lock-on time of a timing-stabilization circuit included in the semiconductor device SD. A configuration of the system of FIG. 3 is within the scope of the prior art, and a description thereof will be omitted. In the method of measuring a lock-on time according to the present invention, however, it should be noted that the semiconductor device SD subjected to the test is equipped with a function to reset the timing-stabilization circuit and a function to output a signal indicating a lock-on status (i.e., whether the timing is stabilized or not) of the timing-stabilization circuit.

Figure 4:
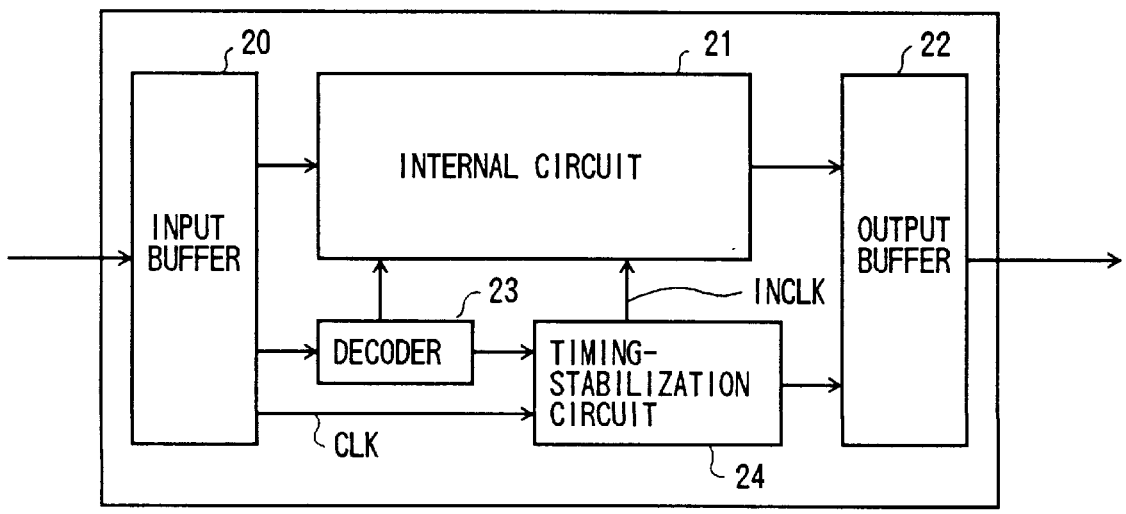
FIG. 4 is a block diagram of a semiconductor device SD.

FIG. 4 is a block diagram of the semiconductor device SD.

The semiconductor device SD of FIG. 4 includes an input buffer 20, an internal circuit 21, an output buffer 22, a decoder 23, and a timing-stabilization circuit 24. The input buffer 20 receives input data, and supplies it to the internal circuit 21. When the semiconductor device SD is a semiconductor memory device such as a DRAM or an SDRAM, the input buffer 20 receives address data and data to be stored, and supplies the data to the internal circuit 21 including address decoders, memory-cell arrays, sense amplifiers, etc.

Command data or the like for controlling operations of the semiconductor device SD is supplied from the input buffer 20 to the decoder 23. The decoder 23 decodes the received command data or the like to control the internal circuit 21 and the timing-stabilization circuit 24.

A clock signal CLK input to the input buffer 20 is supplied to the timing-stabilization circuit 24. The timing-stabilization circuit 24 such as a DLL circuit or a PLL circuit generates an internal clock signal INCLK, and supplies it to the internal circuit 21.

In the present invention, the timing-stabilization circuit 24 is provided with a reset function and a function to output a signal indicative of a lock-on status. The decoder 23 resets the timing-stabilization circuit 24 based on the decoding results of the supplied command data or the like when a reset request is made during a lock-on-time-measurement mode. The timing-stabilization circuit 24 outputs a lock-on signal indicating a lock-on condition via the output buffer 22 when locking on to the supplied clock signal CLK.

The semiconductor device SD of FIG. 4 may be a semiconductor memory device such as a DRAM or an SDRAM which has operations thereof determined by command inputs, or may be a semiconductor memory device such as a Sync-Link DRAM which has operations thereof determined by decoding results of data obtained as packet data. As a matter of fact, the semiconductor device SD may be a semiconductor device of any type as long as the device is equipped with a timing-stabilization circuit having the reset function and the lock-on-signal-output function.

Figure 5:
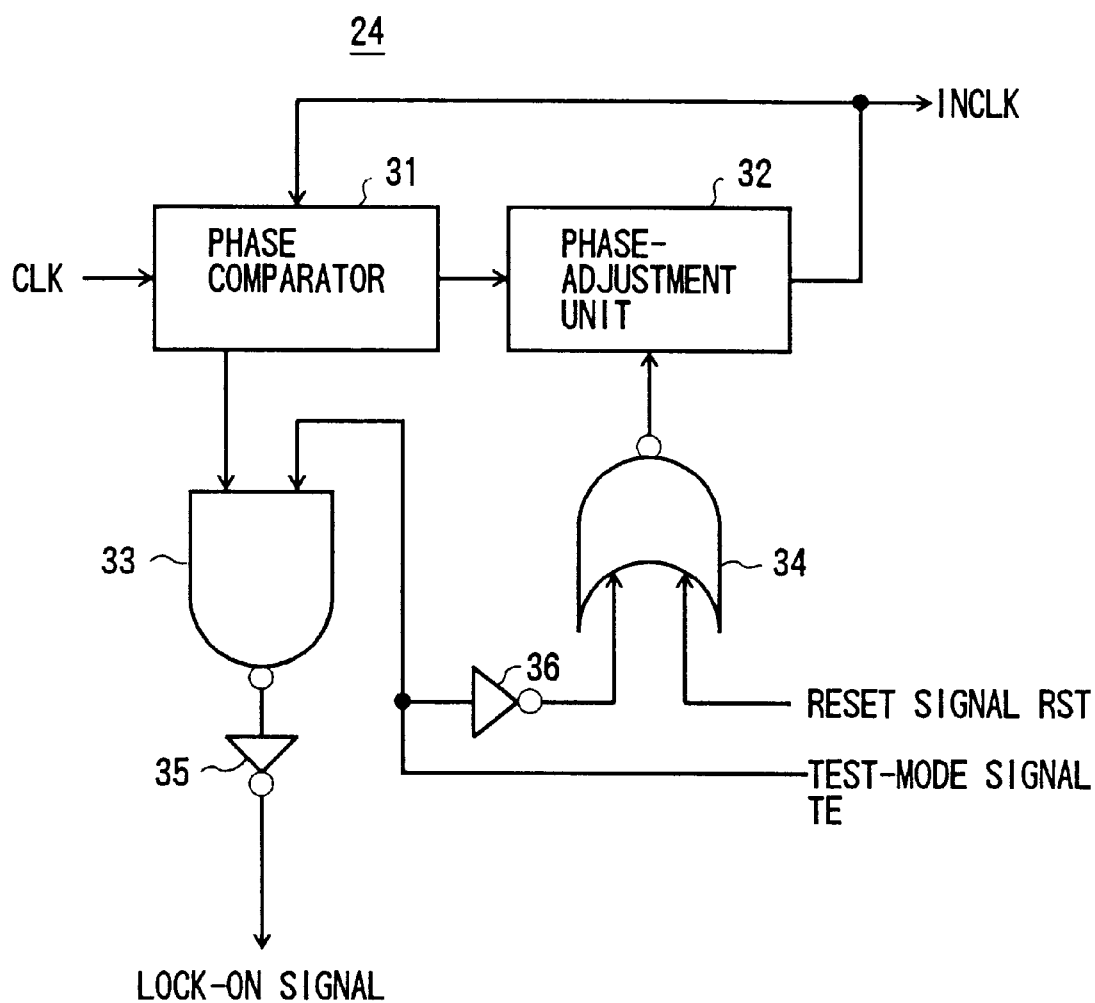
FIG. 5 is an illustrative drawing showing an exemplary configuration of a timing-stabilization circuit equipped with a reset function and a lock-on-signal-output function.

FIG. 5 is an illustrative drawing showing an exemplary configuration of the timing-stabilization circuit 24 equipped with the reset function and the lock-on-signal-output function.

The timing-stabilization circuit 24 of FIG. 5 includes a phase comparator 31, a phase-adjustment unit 32, a NAND circuit 33, a NOR circuit 34, and inverters 35 and 36. A reset signal RST and a test-mode signal TE are supplied from the decoder 23 shown in FIG. 4.

The phase comparator 31 receives the clock signal CLK and the internal clock signal INCLK, and compares phases thereof. The phase-adjustment unit 32 generates the internal clock signal INCLK, and supplies it to the internal circuit 21 (FIG. 4) and the phase comparator 31. The phase comparator 31 controls the phase-adjustment unit 32 to adjust the phase of the internal clock signal INCLK such that the clock signal CLK and the internal clock signal INCLK have no phase difference (or have a predetermined phase relationship). In this manner, the internal clock signal INCLK is locked on to the clock signal CLK via a predetermined phase relationship. When locking on, the phase comparator 31 supplies a HIGH-level signal to the NAND circuit 33.

Only when the test-mode signal TE is HIGH, does a circuit comprised of the NAND circuit 33 and the inverter 35 output the HIGH signal from the phase comparator 31 as a lock-on signal. The NOR circuit 34 generates a HIGH signal to reset the phase-adjustment unit 32 when the reset signal RST becomes LOW during a HIGH period of the test-mode signal TE indicating the test mode. When this happens, the internal clock signal INCLK output from the phase-adjustment unit 32 becomes a signal having no relation with the clock signal CLK.

The semiconductor device SD described with reference to FIG. 4 and FIG. 5 is tested by the system of FIG. 3 to measure a lock-on time of the timing-stabilization circuit 24.

Figure 6:
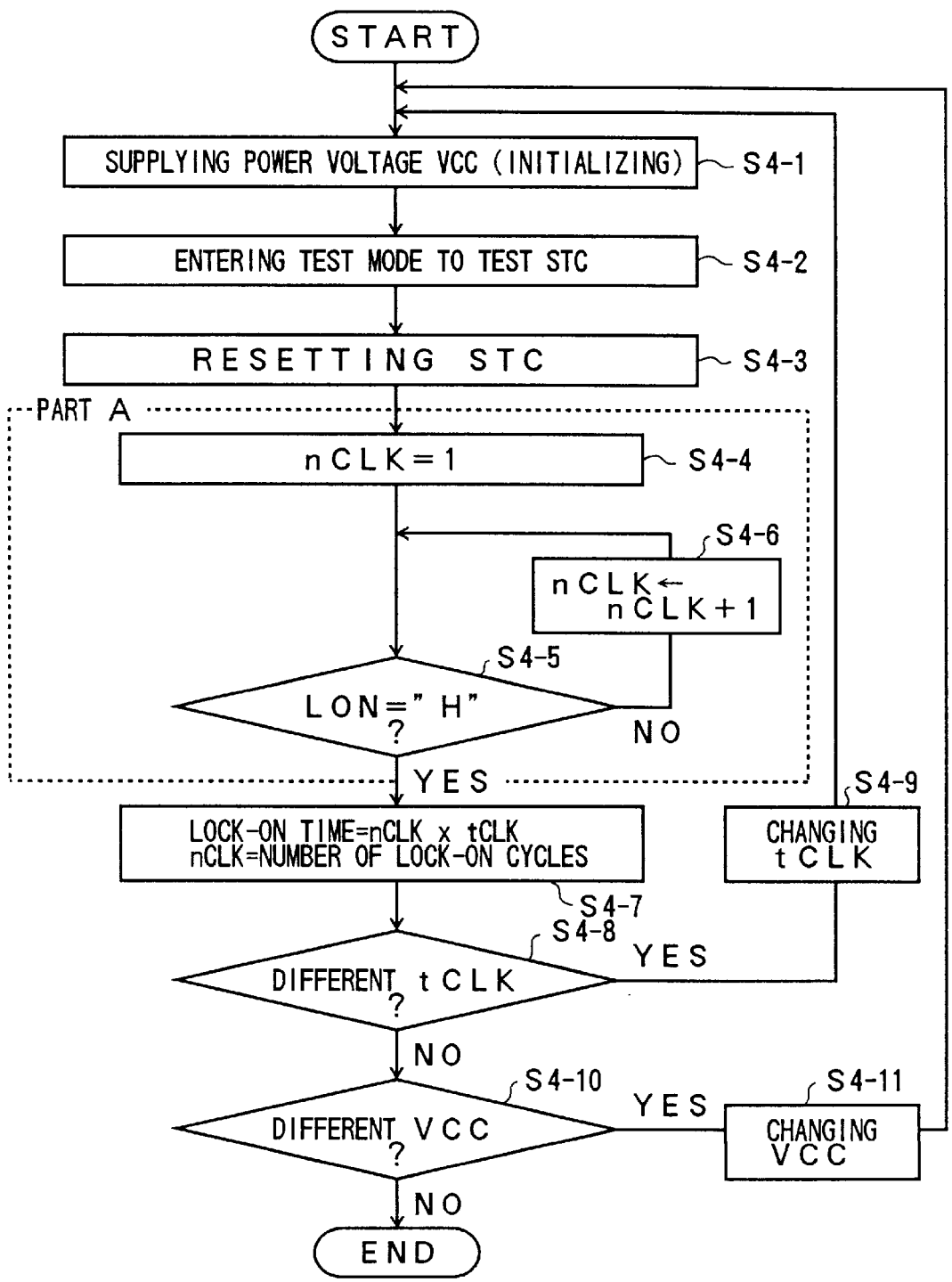
FIG. 6 is a flowchart of a method of measuring a lock-on time at a time of switching on of a device according to the present invention.

FIG. 6 is a flowchart of a method of measuring a lock-on time at the time of switching on of a device according to the present invention.

At a step S4-1, the power voltage VCC is supplied to the semiconductor device SD.

At a step S4-2, command data or the like for indicating a test mode is input to the semiconductor device SD, so that the test-mode signal TE for the timing-stabilization circuit 24 is changed to HIGH.

At a step S4-3, command data or the like for resetting the timing-stabilization circuit 24 is input to the semiconductor device SD, which changes the reset signal RST for the timing-stabilization circuit 24 to LOW, so that the timing-stabilization circuit 24 is reset.

At a step S4-4, the clock-pulse number nCLK is set to 1, and one clock pulse of the clock signal CLK is input.

At a step S4-5, a check is made whether the lock-on signal from the semiconductor device SD is HIGH. If it is HIGH, the procedure goes to a step S4-7. Otherwise, the procedure goes to a step S4-6.

At the step S4-6, the clock-pulse number nCLK is incremented by 1, and one clock pulse of the clock signal CLK is input. Then, the procedure goes back to the step S4-5.

Here, this one clock pulse is not presented as an isolated pulse after some interval from a previous pulse input, but is presented as another pulse in a series of pulses successively following each previous pulse.

Clock pulses are successively input in this manner, and the procedure goes to the step S4-7 when the lock-on signal is detected.

At the step S4-7, the lock-on time is obtained as nCLK× tCLK by using nCLK as the number of lock-on cycles based on the understanding that the timing-stabilization circuit 24 locks on when nCLK clock pulses are input. Here, tCLK denotes a cycle of the clock signal.

At a step S4-8, a decision is made whether a lock-on time is again measured under different conditions with regard to the clock-signal cycle tCLK. If the answer is YES, the procedure goes to a step S4-9. Otherwise the procedure goes to a step S4-10.

At the step S4-9, the clock-signal cycle tCLK is changed, and the procedure goes back to the step S4-1 to repeat the following steps.

At the step S4-10, a decision is made whether a lock-on time is again measured under different conditions with regard to the power voltage VCC. If the answer is YES, the procedure goes to a step S4-11.

At the step S4-11, the power voltage VCC is changed, and the procedure goes back to the step S4-1 to repeat the following steps.

If the answer at the step S4-10 is NO, the procedure ends with regard to the lock-on-time-measurement process.

FIGS. 7A through 7I are timing charts showing timings of various signals relating to FIG. 5 with regard to the lock-on-time-measurement process of FIG. 6.

As shown in the figures, when a test mode is indicated at a given clock cycle, the test-mode signal TE is changed to HIGH. As a reset operation is indicated at a next clock cycle, the reset signal RST becomes LOW while the test-mode signal TE is HIGH. As a result, an output of the NOR circuit 34 turns to HIGH, resetting the timing-stabilization circuit 24. Starting from the outset of the reset condition, a phase of the internal clock signal INCLK is gradually adjusted, and, at a certain cycle, the internal clock signal INCLK is locked on to the clock signal CLK. When this happens, the phase comparator 31 generates a HIGH level as an internal lock-on signal, which is output as a lock-on signal via the NAND circuit 33 and the inverter 35. When detecting the lock-on signal by using lock-on-signal-detection pulses, the tester ends the test mode. As the test mode is finished, the test-mode signal TE is changed to LOW, and so is the lock-on signal.

In FIG. 7I, the pulses for detecting the lock-on signal on the side of the tester may be pulses having the same cycle as the clock signal CLK. When the semiconductor device SD is a DDR (double data rate) SDRAM or the like which operates in synchronism with both rising edges and falling edges of the clock signal CLK, however, the lock-on-signal-detection pulses may have twice as high a frequency as that of the clock signal CLK as shown by dotted lines in FIG. 7I.

In this manner, use of the reset function and the lock-on-signal-output function of the timing-stabilization circuit 24 allows an exact lock-on time to be measured in a short time. This makes it possible to make an accurate assessment of the lock-on capacity of the timing-stabilization circuit in a short time with respect to cases in which the device is switched on, a brief power cut has occurred, etc.

Figure 8:
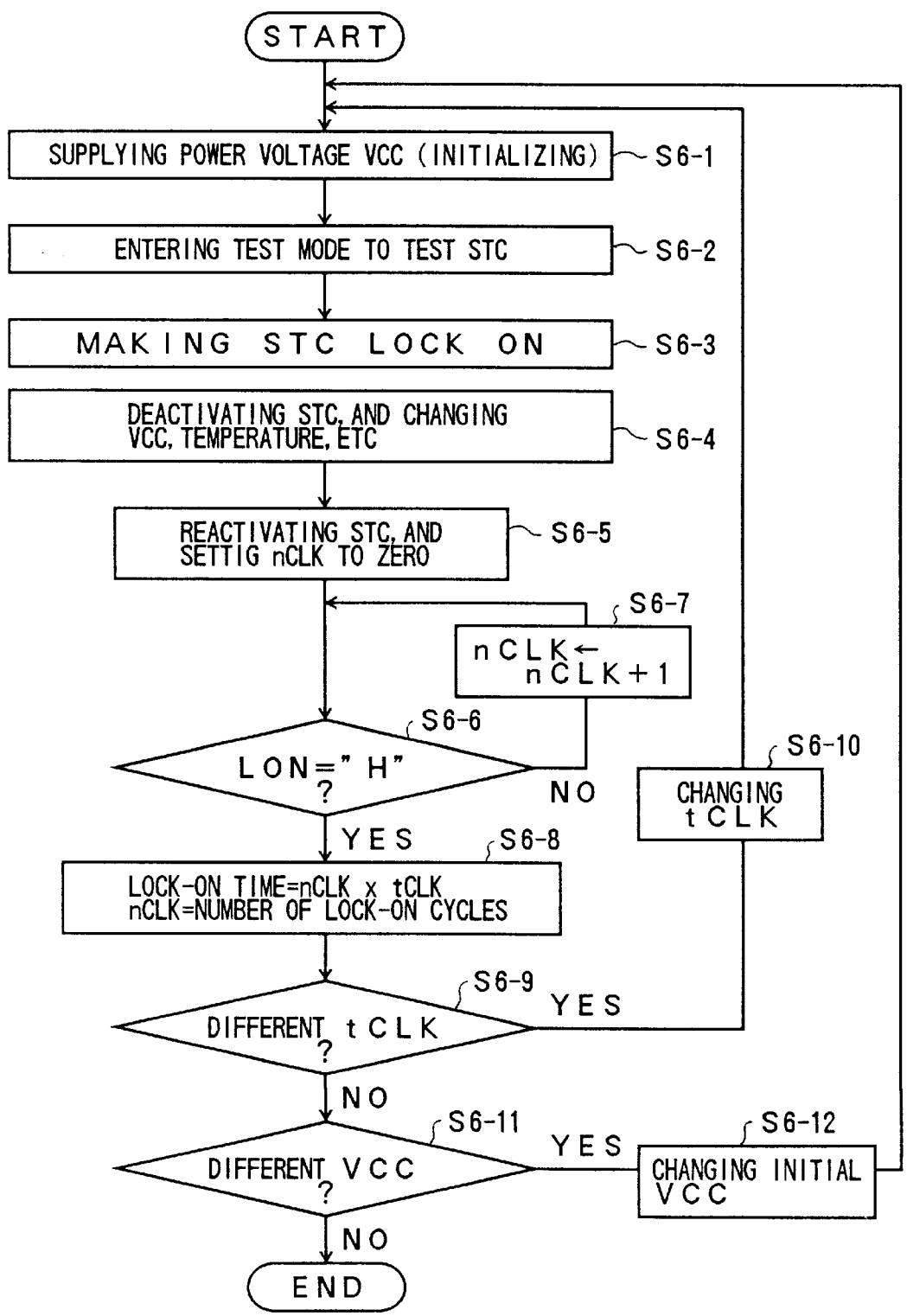
FIG. 8 is a flowchart of a method of measuring a lock-on time at a time of reactivation of a device according to the present invention.

FIG. 8 is a flowchart of a method of measuring a lock-on time at the time of reactivation of a device according to the present invention.

At a step S6-1, the power voltage VCC is supplied to the semiconductor device SD.

At a step S6-2, command data or the like for indicating a test mode is input to the semiconductor device SD, so that the timing-stabilization circuit 24 is set to the test mode.

At a step S6-3, the timing-stabilization circuit 24 is controlled to lock on. In detail, the steps S4-4 through S4-6 shown as a part A in FIG. 6 are performed to make the timing-stabilization circuit 24 lock on.

At a step S6-4, the timing-stabilization circuit 24 is deactivated, and relevant conditions such as the power voltage VCC and/or temperature are changed. Here, a statement that the timing-stabilization circuit 24 is inactive means that the clock signal is not being supplied to the phase comparator 31 of FIG. 5, or that the phase comparator 31 is not in operation or operates only once in an extremely long period (e.g., 128 cycles).

At a step S6-5, the timing-stabilization circuit 24 is reactivated, and the clock-pulse number nCLK is set to 0.

At a step S6-6, a check is made whether the lock-on signal from the semiconductor device SD is HIGH. If it is HIGH, the procedure goes to a step S6-8. Otherwise, the procedure goes to a step S6-7.

At the step S6-7, the clock-pulse number nCLK is incremented by 1, and one clock pulse of the clock signal CLK is input. Then, the procedure goes back to the step S6-6.

Clock pulses are successively input in this manner, and the procedure goes to the step S6-8 when the lock-on signal is detected.

At the step S6-8, the lock-on time is obtained as nCLK× tCLK by using nCLK as the number of lock-on cycles based on the understanding that the timing-stabilization circuit 24 locks on when nCLK clock pulses are input. Here, tCLK denotes a cycle of the clock signal.

At a step S6-9, a decision is made whether a lock-on time is again measured under different conditions with regard to the clock-signal cycle tCLK. If the answer is YES, the procedure goes to a step S6-10. Otherwise the procedure goes to a step S6-11.

At the step S6-10, the clock-signal cycle tCLK is changed, and the procedure goes back to the step S6-1 to repeat the following steps.

At the step S6-11, a decision is made whether a lock-on time is again measured under different conditions with regard to the power voltage VCC. If the answer is YES, the procedure goes to a step S6-12.

At the step S6-12, the power voltage VCC is changed, and the procedure goes back to the step S6-1 to repeat the following steps.

If the answer at the step S6-11 is NO, the procedure ends with regard to the lock-on-time-measurement process.

In this manner, use of the lock-on-signal-output function of the timing-stabilization circuit 24 allows an exact lock-on time to be measured in a short time. This makes it possible to make an accurate assessment of the lock-on capacity of the timing-stabilization circuit in a short time with respect to a case in which the timing-stabilization circuit is reactivated at a return from the power-down mode.

Figure 7:
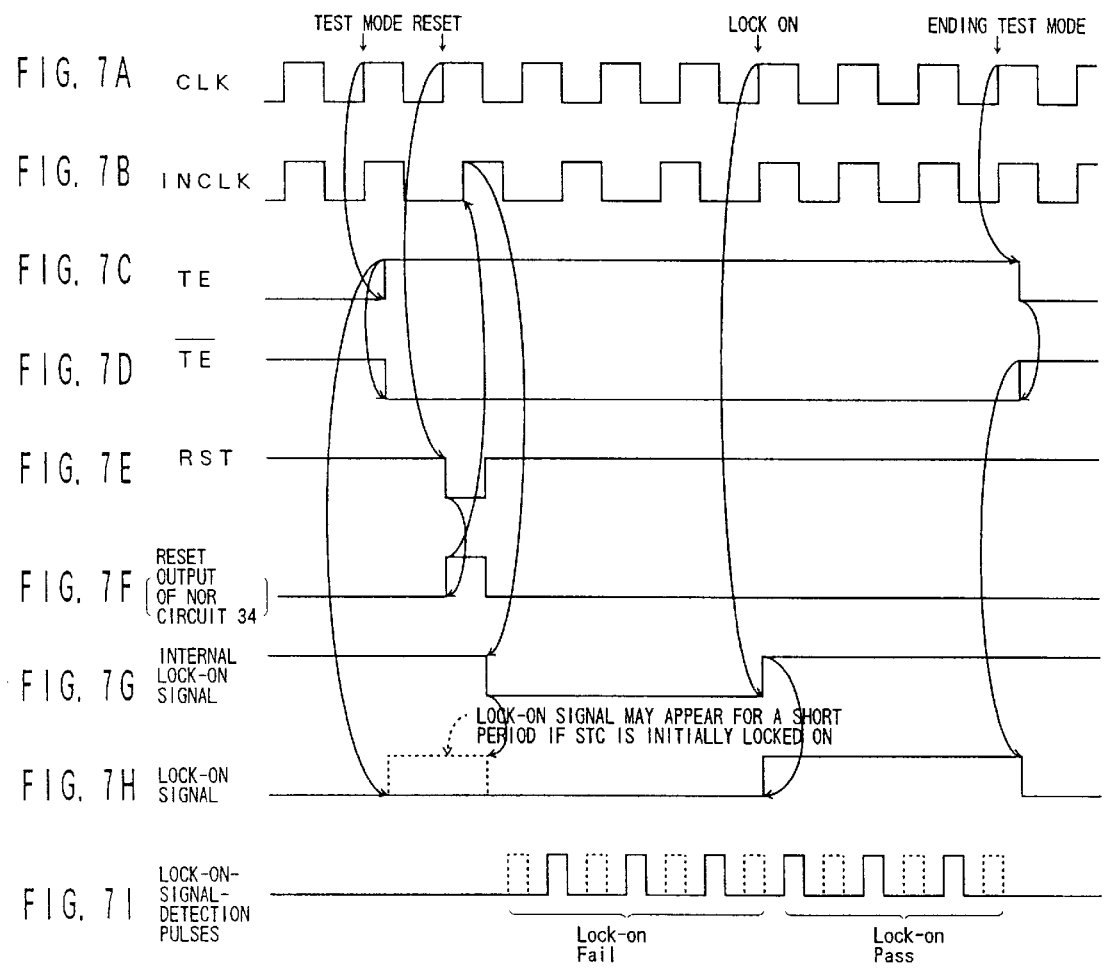

The lock-on-time-measurement methods shown in FIGS. 6 through 8 can be applied not only to semiconductor devices in which a test mode and a reset operation are indicated by command-data input, but also to semiconductor devices in which a test mode and a reset operation are indicated by packet-data input. A Sync-Link DRAM is an example of such semiconductor devices in which a mode, etc., are specified by packet-data input.

FIGS. 9A through 9J are timing charts showing timings of various signals relating to a lock-on-time-measurement method when the method is applied to a Sync-Link DRAM.

As shown in the figures, when a test mode is indicated by a packet TESTin at a given clock cycle, the test-mode signal TE is changed to HIGH. As a packet RESET&check is input at the next clock cycle to indicate a reset operation and a check (test) operation, the reset signal RST becomes LOW while the test-mode signal TE is HIGH. As a result, an output of the NOR circuit 34 turns to HIGH, resetting the timing-stabilization circuit 24. Starting from the outset of the reset condition, a phase of the internal clock signal INCLK is gradually adjusted, and, at a certain clock cycle, the internal clock signal INCLK is locked on to the clock signal CLK. When this happens, the phase comparator 31 generates a HIGH level signal as an internal lock-on signal.

Figure 9:
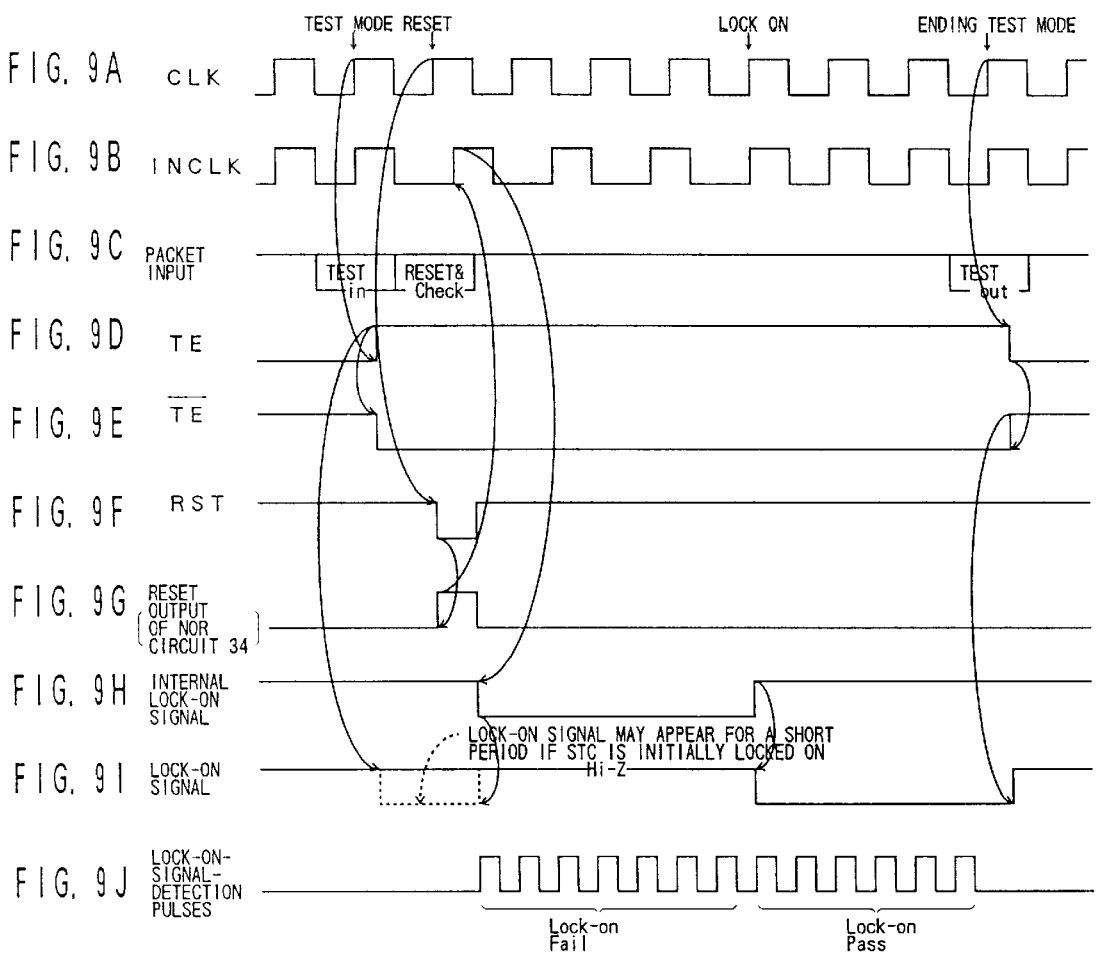
FIGS. 9A through 9J are timing charts showing timings of various signals relating to a lock-on-time-measurement method when the method is applied to a Sync-Link DRAM.
Figure 10:
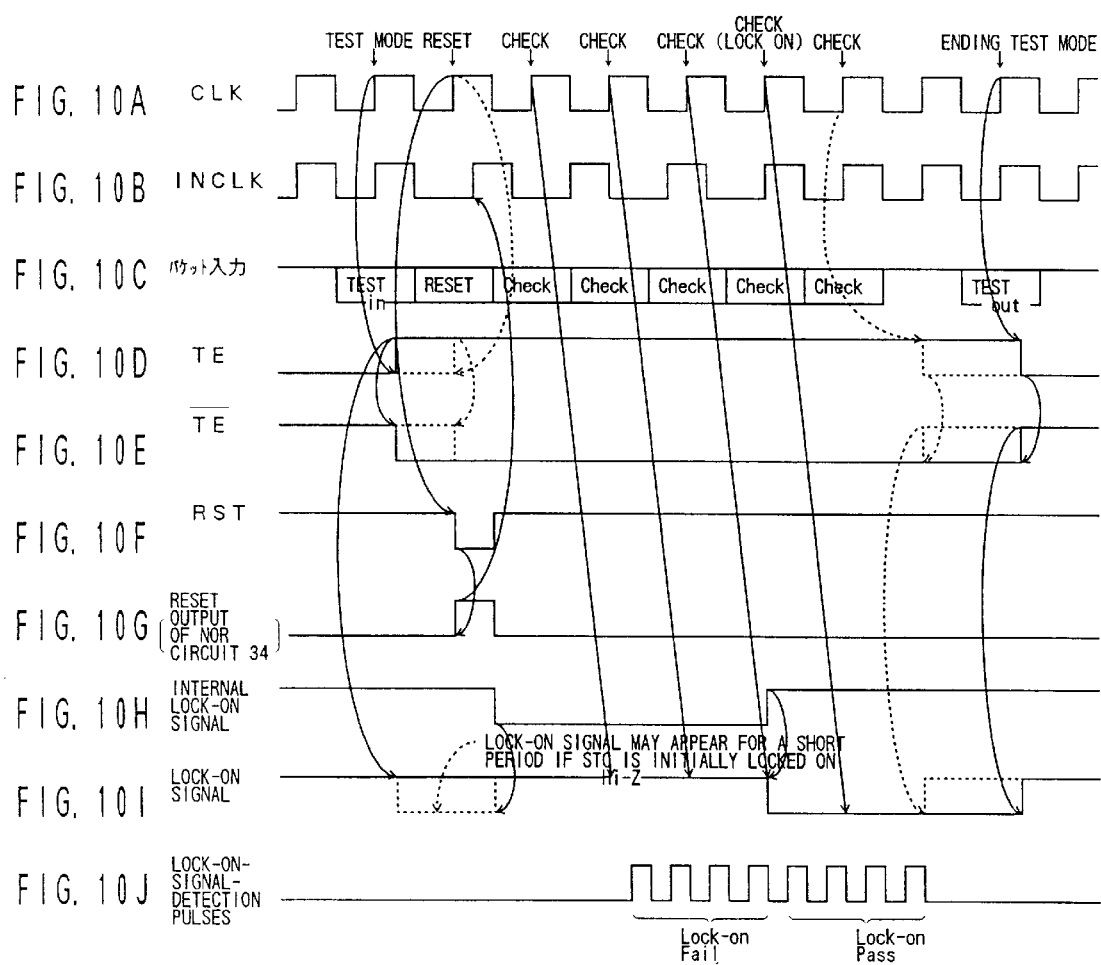
FIG. 10A through 10J are timing charts showing another example in which the lock-on-time-measurement method of the present invention is applied to a Sync-Link DRAM.

In the example of FIG. 9I, the lock-on signal, which is output in response to the internal lock-on signal, maintains a HIGH-impedance state before the locking on, and changes to a LOW-impedance state after the locking on. In this manner, the lock-on signal may indicate a lock-on status by using impedance conditions or the like rather than by using HIGH/LOW-signal levels.

When the tester detects the lock-on signal by using the lock-on-signal-detection pulses, a packet TESTout is input to exit from the test mode. As the test mode ends, the test-mode signal TE is changed to LOW, and the lock-on signal returns to the HIGH-impedance state.

FIGS. 10A through 10J are timing charts showing another example in which the lock-on-time-measurement method of the present invention is applied to a Sync-Link DRAM.

The example of FIGS. 10A through 10J differs from the example of FIGS. 9A through 9J in that check packets Check are successively input until the lock-on signal indicates the lock-on state. In this example, two-cycle latency (delay) is present from the input of a check packet Check to the output of the check result on the lock-on signal.

In the example of FIGS. 10A through 10J, the packet TESTin is first input to indicate the test mode, and the packet TESTout is supplied to exit from the test mode after the lock-on state is detected. Alternately, as shown by dotted lines in the figures, a packet RESET may be input to change the test-mode signal TE to HIGH, and a packet Check input after the locking on may be used to change the test-mode signal TE to LOW. In this case, input of the packet TESTin and the packet TESTout is no longer necessary.

The lock-on signal described above may be output from a particular node such as a DQS node of a DDR SDRAM or an I/O common node of a Sync-Link DRAM during a normal operation mode in addition to the test mode. In this configuration, the lock-on signal can be used as a signal indicating completion of the locking-on operation or indicating that the device is ready to operate.

In the following, a description will be given with regard to a semiconductor device equipped with a timing-stabilization circuit as well as functions for allowing tests to be readily conducted for measuring characteristics of the semiconductor device.

In recent years, there has a trend to equip semiconductor devices with a timing-stabilization circuit such as a DLL circuit or a PLL circuit in order to supply stable clock signals to internal circuits, thereby matching a demand for increased operation speed. The applicant of the present invention discloses a semiconductor device equipped with a timing-stabilization circuit based on a DLL circuit in Japanese Patent Applications No. 8-213882 and No. 8-245118, for example. In particular, a configuration in which a DLL circuit is provided for a synchronous DRAM is disclosed in these documents.

Figure 11:
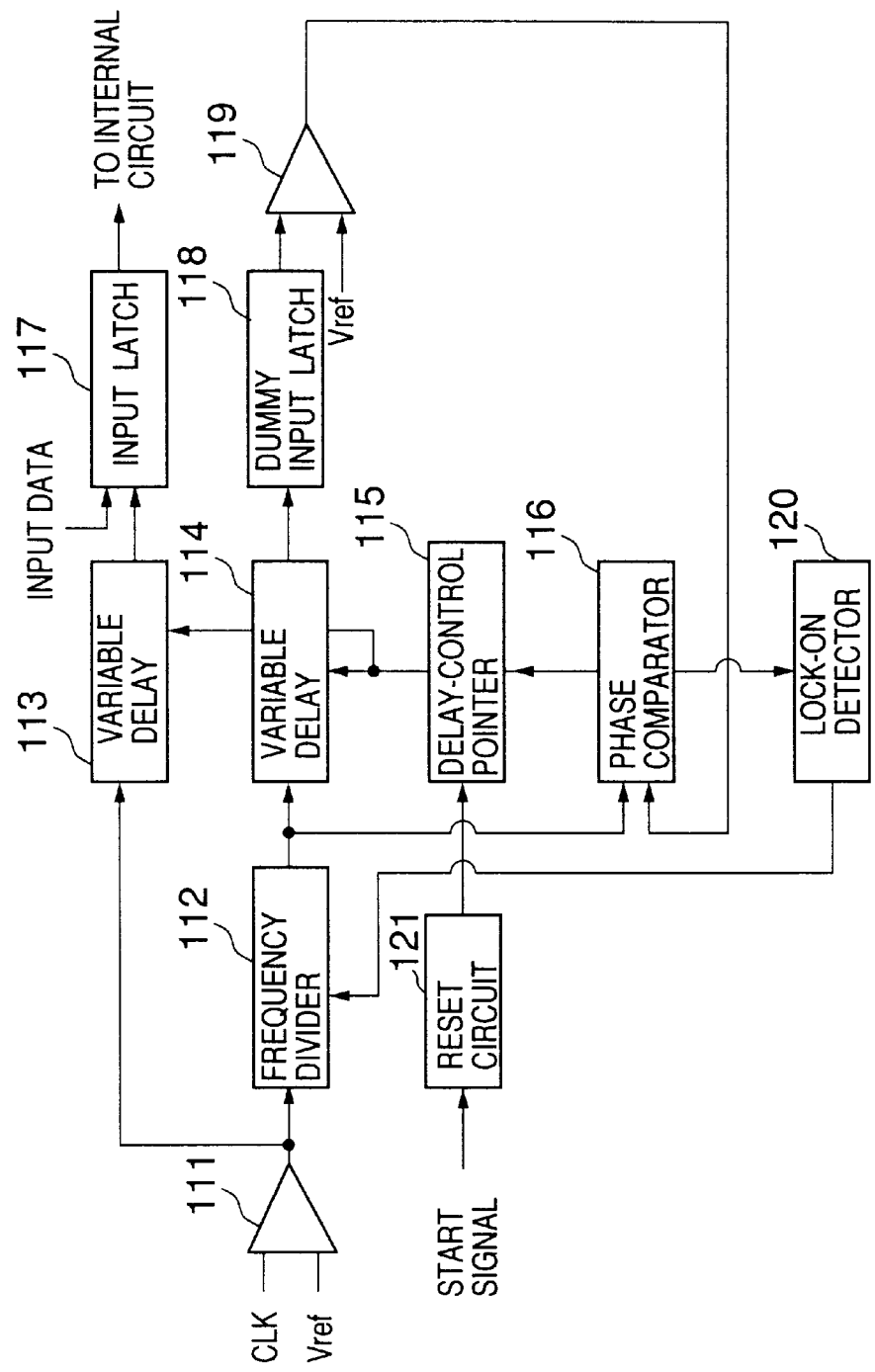
FIG. 11 is a block diagram of a related-art timing-stabilization it employing a DLL circuit.

FIG. 11 is a block diagram of a related-art timing-stabilization circuit employing a DLL circuit.

This circuit makes an internal clock signal (input clock signal) synchronize with an external clock signal when the input clock signal is supplied to an input latch 117, thereby allowing input data to be received with high accuracy.

As shown in FIG. 11, the external clock CLK is received by an input buffer 111 to be supplied to the inside of the device. The received clock is subjected to frequency division in a frequency divider 112, and is supplied to a DLL circuit comprised of a variable delay 113, a variable delay 114, a delay-control pointer 115, a phase comparator 116, a dummy input latch 118, and a dummy input buffer 119. The variable delay 113 and the variable delay 114 are equivalent to each other, and are controlled with regard to delays thereof by control signals from the delay-control pointer 115. The dummy input latch 118 latches dummy data in synchronism with a clock signal delayed by the variable delay 114, and the latched dummy data is supplied to the phase comparator 116 via the dummy input buffer 119. The phase comparator 116 compares phases between the output of the frequency divider 112 and the output of the dummy input buffer 119, and provides the delay-control pointer 115 with comparison results indicating whether the output of the dummy input buffer 119 is behind or ahead of the output of the frequency divider 112. Based on the comparison results, the delay-control pointer 115 changes the delays of the variable delays 113 and 114 in an attempt to achieve a phase match between the output of the frequency divider 112 and the output of the dummy input buffer 119.

The input buffer 111 and the dummy input buffer 119 are equivalent to each other. When the output of the frequency divider 112 and the output of the dummy input buffer 119 have the same phase, therefore, the clock signal supplied from the variable delay 114 to the dummy input latch 118 must have the same phase as and be in synchronism with the external clock CLK. The variable delay 113 and the variable delay 114 are equivalent to each other, so that the internal clock (input timing clock) supplied to the input latch 117 ends up being in synchronism with the external clock CLK, thereby achieving the input of input data based on an accurately synchronized clock signal. In FIG. 11, the clocks respectively supplied to the input latch 117 and the dummy input latch 118 have a phase displacement therebetween matching a delay of the frequency divider 112. This delay, however, has been regarded as negligible in the above description. If the delay cannot be ignored, a circuit element introducing an equivalent delay should be provided in front of the variable delay 113.

In the timing-stabilization circuit as described above, control variables of the delay-control pointer 115 are reset to their initial values by a start signal when the start signal is generated at a time of switching on of the device. When a clock is input after the reset, the timing-stabilization circuit performs the phase-comparison operations to make an automatic adjustment of the delays. A lock-on detector 120 generates a lock-on signal indicating completion of the delay adjustment when finding that the two signals compared by the phase comparator 116 have a phase difference falling in a predetermined range.

In general, semiconductor devices are provided with defined specifications regarding input timings of input data, etc., and are tested at a final stage of manufacture as to whether these specifications are satisfied. In the case of the semiconductor devices equipped with the timing-stabilization circuit as described above, there is a need to conduct a test with regard to the DLL circuit included in the timing-stabilization circuit.

Related-art semiconductor devices, however, are not designed to allow performance of the DLL circuit to be tested, which makes it difficult to guarantee that the DLL circuit operates perfectly well under conditions set by users themselves. For example, characteristics such as a time period required by the DLL circuit to lock on after the switching on of the device, a time period required by the DLL circuit to lock on again after the locking on is lost due to changes in conditions, the number of operating delay elements when the DLL circuit is locking on, etc., cannot be tested in the related-art configuration.

Semiconductor devices having the timing-stabilization circuit can operate at high speed. Because of this, an accurate timing measurement is necessary for test items such as an input setup time and an input hold time that specify a required time period around the input timing when the input data needs to be kept valid during this required time period. Such test items need to be tested by an extremely accurate tester, thereby adding to an increase in the costs of testing. Also, if the operation speed of the semiconductor device is further enhanced to exceed the capacity of available high performance testers, the test itself can no longer be conducted.

Moreover, when the DLL circuit succeeds in locking on, it is possible to reduce a frequency of phase comparisons by a significant amount with an aim of suppressing power consumption. To this end, a reduction in the frequency of phase comparisons is made by switching a frequency dividing ratio of a frequency divider from a small ratio to a large ratio when the locking on is achieved. The frequency divider is provided in a signal path of the dummy clock for this purpose. When frequency of phase comparisons is returned to that of the small frequency dividing ratio at a time of condition changes regarding a power-down-reset cycle or a self-refresh cycle, there is no clue as to at which clock cycle the phase comparison is restarted. This is because related-art DLL circuits are not provided with a function to initialize internal conditions of the frequency divider. If the phase comparison is restarted at a first cycle after the return, an accurate comparison cannot be made owing to unstable conditions of a DLL-circuit power voltage.

Accordingly, there is a need for a semiconductor device which allows a test of DLL characteristics and other characteristics to be readily performed despite difficulties in measuring these characteristics when operation speed is enhanced by use of the DLL circuit.

In order to achieve the above object according to the present invention, a semiconductor device equipped with a timing-stabilization circuit based on a DLL circuit is provided with: (1) a function to allow a control value of the delay-control pointer for controlling delays of the variable delays to be set to desired initial values; (2) a function to stop temporarily phase-comparison operations of the phase comparator; (3) a function to output a signal indicating a lock-on state of the DLL circuit; (4) a function to output the control value of the delay-control pointer; and (5) a function to compare output data with data which is obtained by an input circuit when the input circuit receives the output data that is output from a newly provided internal data-output circuit or from an existing data-output circuit. When a frequency divider with a variable frequency dividing ratio is provided for the purpose of a reduction in power consumption, the semiconductor device is provided with (6) a function to bring the frequency dividing ratio back to a predetermined frequency dividing ratio such as a small frequency dividing ratio. Further, the above-mentioned function of allowing the control value of the delay-control pointer to be set to desired initial values includes (1A) a function to set the control value to a predetermined initial value and (1B) a function to set the control value to a desired initial value input from outside.

With regard to the issues concerning a time period required for a lock-on operation, a time period needs to be measured from when the variable delays are set to predetermined conditions to when the locking on is completed. To this end, the variable delays are set to predetermined conditions by using the function (1A) or the function (1B), and, then, phase-comparison operations of the DLL circuit are started, with the function (3) being used to measure the time period marked by an output signal which indicates the lock-on states. In order to make an accurate measurement, the functions (2), (4), and (6) are necessary. The function (4) allows the control value of the delay-control pointer to be checked, and the function (2) ensures that the phase comparison is started at the last cycle of the predetermined number of clock cycles after the input of the clock signal is restarted with newly set predetermined conditions of the variable delays.

The issues of the frequency divider can be settled by making the functions (2) and (3) operative during normal operations.

In order to cope with the issues of accurate measurement of an input setup time and an input hold time, an accurate assessment of a delay time is made with regard to a single stage of the variable delay by using the functions (3) and (4), and the function (1B) is used to make successive changes to the timing of the input timing clock, with the function (5) being used to check relations between the received data and the output data. This makes it possible to check the measurement results even at low speed, thereby eliminating a need for a highly accurate tester.

Tests of semiconductor-device characteristics include a test which is conducted by gradually changing a clock frequency. When such a test is conducted, feedback control is automatically effected in the related-art DLL circuits, so that the control value of the delay-control pointer is undesirably changed. This test should be conducted by changing the clock frequency without changing the control value of the delay-control pointer. The functions (1) and (2) allow such a test to be properly performed.

The function (1A) can be implemented by providing a reset-signal-generation circuit generating a reset signal for a predetermined duration in response to a power-on-reset signal or a test-mode signal, for example, and by connecting a reset-signal line to a circuit portion which defines the control value of the delay-control pointer. The function (1B) can be implemented by allowing, in addition to the function (1A), the comparison results of the phase comparator for incrementing or decrementing the values of the delay-control pointer to be output in response to an externally provided signal.

The function (1B) can also be implemented by allowing an externally provided value to be directly written in a circuit portion which defines the control value of the delay-control pointer. Each of the variable delays is comprised of a series of delay elements. The control value of the delay-control pointer, which indicate a position along the series of delay elements, can specify various positions. Because of this, the externally provided value to be written in the above circuit portion is preferably supplied in a form of serial data. A value defined by the serial data is converted into parallel data by using a shift register, and, then, is written in the delay-control pointer. Alternately, the value may be input as a code, which is converted before being written.

The function (1B) can also be implemented by attaching an adjustment delay to a variable delay of the related-art DLL circuit such that a setting of a delay can be made to the adjustment delay via an external input. In this case, a phase displacement controlled by the DLL circuit can be set to an arbitrary value.

By the same token, when the function (4) is implemented, it is preferable to use a latch circuit to latch the control value of the delay-control pointer, and to use a shift register to convert the latched values into serial data before outputting the latched values. In this case, the control values of the delay-control pointer may be output after the values are coded by an encoder. If a difference between the control values of the delay-control pointers is necessary in a configuration having a plurality of variable delays and a plurality of delay-control pointers, an arithmetic logic circuit for obtaining the difference in the control values is internally provided so as to output the obtained results. For example, a difference in the control values may be obtained between a 0°-DLL circuit and another DLL circuit, or may be obtained between a DLL circuit corresponding to a variable delay having the largest number of operating stages of delay elements and another DLL circuit. Alternately, such a difference may be obtained between a 180°-DLL circuit and another DLL circuit.

The function (2) can be implemented by allowing the phase comparator to stop comparison operations thereof in response to a reset signal or the like.

The function (3) can be implemented by sending a lock-on signal of the DLL circuit to the outside of the device. When there are a plurality of DLL circuits, a lock-on signal output from the semiconductor device may be obtained by taking a logic product of a plurality of lock-on signals corresponding to the respective DLL circuits. Alternately, a lock-on signal of a DLL circuit having a variable delay of the largest number of operating delay-element stages may be output from the semiconductor device.

The applicant of the present invention discloses a DLL circuit which is capable of making a fine delay adjustment over a wide delay range in the Japanese Patent Application No. 9-142441. This is made possible by using a rough delay with each stage thereof having a relatively large delay and a fine delay with each stage thereof having a relatively small delay. When such a DLL circuit is employed, the delay-control pointer and the phase comparator are provided for both the rough delay and the fine delay, and pointer-position-control circuits are also tuned to a rough adjustment and a fine adjustment, respectively.

In this case, a lock-on signal is preferably generated when both the rough DLL circuit and the fine DLL circuit lock on. In the presence of clock jitters, however, the fine DLL circuit may never lock on. If this is expected, a lock-on status may be declared when a fine lock-on signal is not output for a predetermined time period after a rough lock-on signal is generated. A phase error of a generated delayed clock is smaller than the delay of one delay stage of the rough variable delay.

The function (5) can be implemented by allowing the frequency divider to be reset to an initial frequency dividing ratio in response to a reset signal or the like when the frequency divider is provided to supply a frequency-divided clock to the variable delays.

The DLL circuit described above may be employed in an input-timing-clock generation circuit as disclosed in the Japanese Patent Application No. 8-245118. In such an application, the DLL circuit is used as a dummy circuit, and a variable delay equivalent to a dummy variable delay of the DLL circuit is provided in parallel. A dummy clock is then used to compare phases so that an adjustment is made based on the comparison results with regard to a phase of a clock used as an actual input-timing clock. In order to implement the functions (1A) and (1B) in this configuration, a normal delay-control pointer for controlling a delay of the variable delay and a dummy delay-control pointer for controlling a delay of the dummy variable delay are separately provided, so that control values can be separately set to respective predetermined values.

If the phase comparator is designed to output the comparison results for incrementing or decrementing the values of the normal delay-control pointer and the dummy delay-control pointer in response to an externally provided signal during a period when the phase comparator is not in operation after the control values of the normal delay-control pointer and the dummy delay-control pointer are set to predetermined values through the function (1A), a phase difference between a dummy clock and a normal clock used as a timing clock can be set to any desirable amount by a unit of a delay of one variable-delay stage.

Moreover, if the control values of the normal delay-control pointer and the dummy delay-control pointer can be separately set to any arbitrary values, a phase difference between the normal clock and the dummy clock can also be set to any amount. In this case, the control values of the normal delay-control pointer and the dummy delay-control pointer are preferably output from the device.

As described above, when the variable delay is comprised of a rough delay and a fine delay, delays are set independently of each other.

Further, if an adjustment delay is attached to the variable delay and a dummy adjustment delay is attached to the dummy variable delay while allowing settings to be made to delays of these adjustment delays, a phase difference between the normal clock and the dummy clock can be set to any desirable amount. Alternately, only one of the adjustment delay and the dummy adjustment delay may be set from outside the device, and the remaining one may have a fixed delay. In this case, the fixed delay is equal to a delay of the other adjustment delay that is achieved when the number of operating delay stages of the other adjustment delay is set to zero, or is equal to a delay of the other adjustment delay that is achieved when half the total stages of the other adjustment delay are activated. When the fixed delay is set to the former delay, the delay of the other adjustment delay can only be adjustable toward a larger delay. If the fixed delay is set to the latter delay, the delay of the other adjustment delay can be adjustable towards an increased delay or towards a decreased delay with an adjustable range extending the same length in both directions.

As previously described, the function (1B) allows an accurate measurement to be made with regard to the input setup time and the input hold time. In this case, an output buffer for outputting data in synchronism with a clock may be provided, and the DLL circuit generates a shift clock by shifting the input-timing clock backward or forward by a predetermined phase amount in response to the test mode signal. An input buffer latches the output data in synchronism with the shift clock, and the latched data is output to the outside of the device as measured data. A measured-data output circuit is provided for this purpose. Further, an output-timing-clock-generation circuit for generating a timing clock to output the data may be provided with the function (1B), so that the output data may be output with a phase displacement in the clock by shifting the clock backward or forward by the predetermined phase amount.

In this manner, a measurement can be made based on the output data supplied by the semiconductor device, so that there is no need to take into account a synchronization error between the output data and the clock. If the measured data is output after frequency division, there is no need to use a highly accurate tester.

Moreover, if a comparison circuit is provided inside the semiconductor device to make a comparison of the latched data with the output data, outputting the comparison results as the measured data makes the measurement easier, and eliminates a need for a special tester. This allows the measurement to be made during the test mode while the device is in use. The output buffer outputs the output data from data-output nodes which are used during normal operations of the semiconductor device, and the input buffer latches the output data appearing at these nodes. In order to output the measured data during the measurement, the measured data needs to be supplied to data-output nodes other than the data-output nodes outputting the output data. If the measured data is temporarily stored in a register, the measured data may be output from the data-output nodes after the measurement is complete. The output buffer may apply dummy output data to dummy data-output nodes without actually outputting the dummy output data from the semiconductor device.

In a method of measuring the input setup time and the input hold time of the semiconductor device, a check operation is performed to check the comparison results while changing a shift of the shift clock under control from the outside, and the shift which brings about a change in the comparison results is regarded as the input-setup time and the input-hold time.

Figure 12:
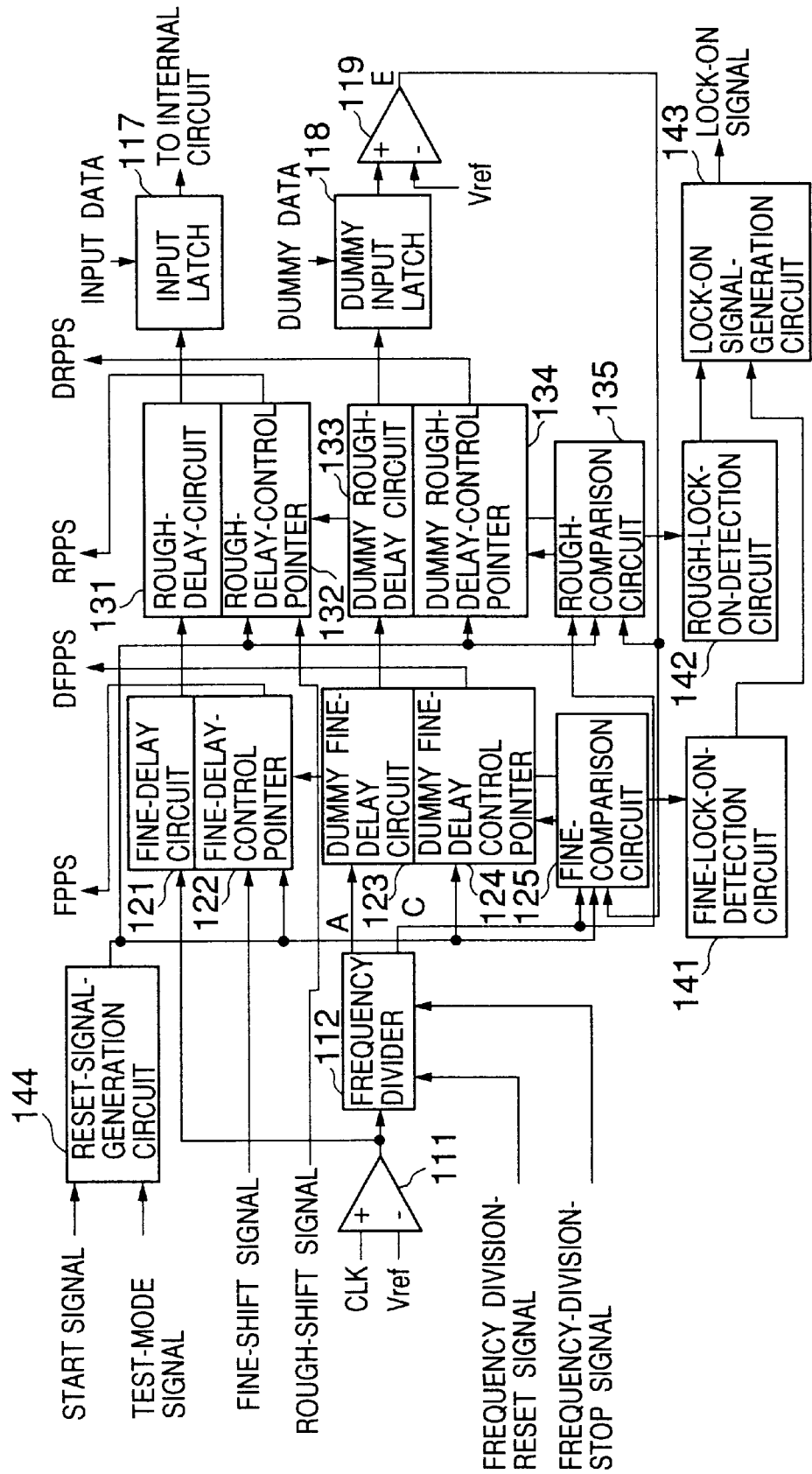
FIG. 12 is a block diagram showing a configuration of a timing-stabilization circuit according to a first embodiment of the present invention.

FIG. 12 is a block diagram showing a configuration of a timing-stabilization circuit according to a first embodiment of the present invention.

The first embodiment concerns a case in which the present invention is applied to an input-timing-clock-generation circuit (input-timing-stabilization circuit). As shown in FIG. 12, the circuit of the first embodiment includes the input buffer 111 for receiving an external clock CLK and supplying an internal clock (hereinafter, the internal clock is also designated as CLK), the frequency divider 112 for dividing a frequency of the internal clock, a fine-delay circuit 121 for delaying the internal clock by a delay indicated by a control value of a fine-delay-control pointer 122, a rough delay circuit 131 for delaying the output of the fine-delay circuit 121 by a delay indicated by a control value of a rough-delay-control pointer 132, and the input latch 117 for latching input data in synchronism with an input-timing clock supplied from the rough delay circuit 131. The circuit further includes a dummy fine-delay circuit 123 for delaying the frequency-divided clock by a delay indicated by a control value of a dummy fine-delay-control pointer 124, a dummy rough-delay circuit 133 for delaying the output of the dummy fine-delay circuit 123 by a delay indicated by a control value of a dummy rough-delay-control pointer 134, and the dummy input latch 118 for latching dummy data in synchronism with a dummy input-timing clock supplied from the dummy rough-delay circuit 133. The circuit also includes the dummy input buffer 119 for supplying the dummy data latched by the dummy input latch 118, a fine-comparison circuit 125 and a rough-comparison circuit 135 for comparing phases between the frequency-divided clock and the output of the dummy input buffer 119, and a fine-lock-on-detection circuit 141 and a rough-lock-on-detection circuit 142 for respectively generating a fine-lock-on signal and a rough-lock-on signal when the fine-comparison circuit 125 and the rough-comparison circuit 135 respectively find that a phase difference between the frequency-divided clock and the output of the dummy input buffer 119 becomes smaller than a predetermined amount. The circuit further includes a lock-on-signal-generation circuit 143 for generating a lock-on signal by using the fine-lock-on signal and the rough-lock-on signal, and a reset-signal-generation circuit 144 for generating a reset signal in response to a start signal and a test-mode signal which are generated at a time of switching on. The dummy input buffer 119 has a configuration equivalent to that of the input buffer 111, so that delays introduced in the dummy input buffer 119 and the input buffer 111 are identical.

In the configuration of FIG. 12, the variable delay 113 and the variable delay 114 of FIG. 11 are respectively divided into two circuits for a fine-adjustment purpose and a rough-adjustment purpose, and, by the same token, the delay-control pointer 115 and the phase comparator 116 of FIG. 11 are respectively divided into two circuits. Further, separate delay-control pointers are provided for a dummy-variable delay and a normal variable delay generating the input-timing clock, so that the normal variable delay and the dummy-variable delay can be set to different control values. In detail, the fine-delay-control pointer 122, the rough-delay-control pointer 132, the dummy fine-delay-control pointer 124, and the dummy rough-delay-control pointer 134 are provided in order to control delays of the fine-delay circuit 121, the rough delay circuit 131, the dummy fine-delay circuit 123, and the dummy rough-delay circuit 133, respectively. The fine-delay-control pointer 122 and the dummy fine-delay-control pointer 124 have control values thereof changed in accordance with the comparison results made by the fine-comparison circuit 125. Because of this, the control values are subjected to the same change during a normal operation. By the same token, the rough-delay-control pointer 132 and the dummy rough-delay-control pointer 134 have control values thereof changed according to the comparison results of the rough-comparison circuit 135, so that these control values are changed in the same manner during the normal operation.

Figures 13, 14:
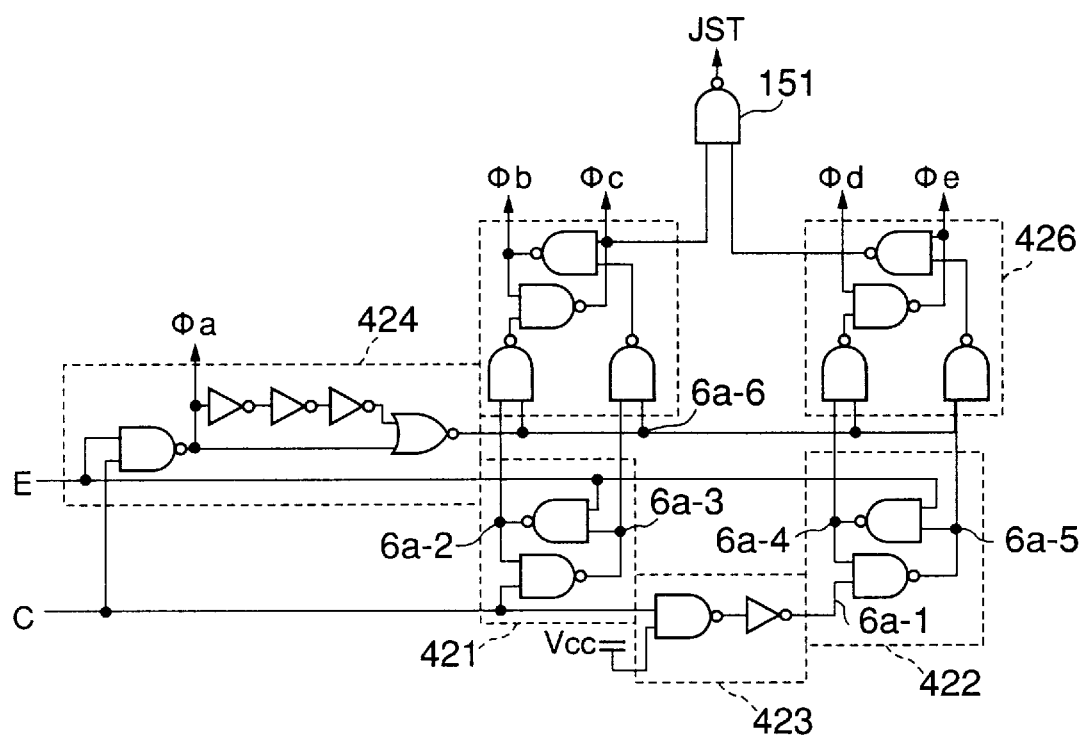
FIG. 13 is a circuit diagram showing a comparison portion of a rough-comparison circuit and a rough-lock-on-detection circuit according to the first embodiment.
FIG. 14 is a table chart showing logic levels of signals with regard to operations of the circuit of FIG. 13.

FIG. 13 is a circuit diagram showing a comparison portion of the rough-comparison circuit 135 and the rough-lock-on-detection circuit 142 according to the first embodiment.

A comparison portion of the fine-comparison circuit 125 and the fine-lock-on-detection circuit 141 have a similar configuration. The circuit of FIG. 13 is disclosed in the Japanese Patent Application No. 8-213882, and a detailed description thereof will be omitted. In the following, however, basic operations of this circuit will be described. This circuit checks a phase of an output E of the dummy input buffer 119 by using a frequency-divided clock C output from the frequency divider 112 as a reference clock.

FIG. 14 is a table chart showing logic levels of signals with regard to operations of the circuit of FIG. 13.

In a case where Φa changes from HIGH to LOW, Φb is HIGH, Φc is LOW, Φd is HIGH, and Φe is LOW if a signal E has a phase which is ahead of a phase of a signal C. If the signal E and the signal C have substantially the same phase, Φb is LOW, Φc is HIGH, Φd is HIGH, and Φe is LOW. If the signal E has a phase which is behind the phase of the signal C, Φb is LOW, Φc is HIGH, Φd is LOW, and Φe is HIGH. A NAND circuit 151 constitutes a lock-on-signal-detection circuit, and generates an output JST based on the inputs Φc and Φd. The output JST becomes LOW when the signal E and the signal C have substantially the same phase. Otherwise the output JST becomes HIGH. As disclosed in the Japanese Patent Application No. 9-142441, the comparison portion of the fine-comparison circuit 125 can make a check as to which one of the signals is ahead of the other even if there is only a small phase difference. This is achieved by some additional gate circuits provided in the comparison portion.

Figure 15:
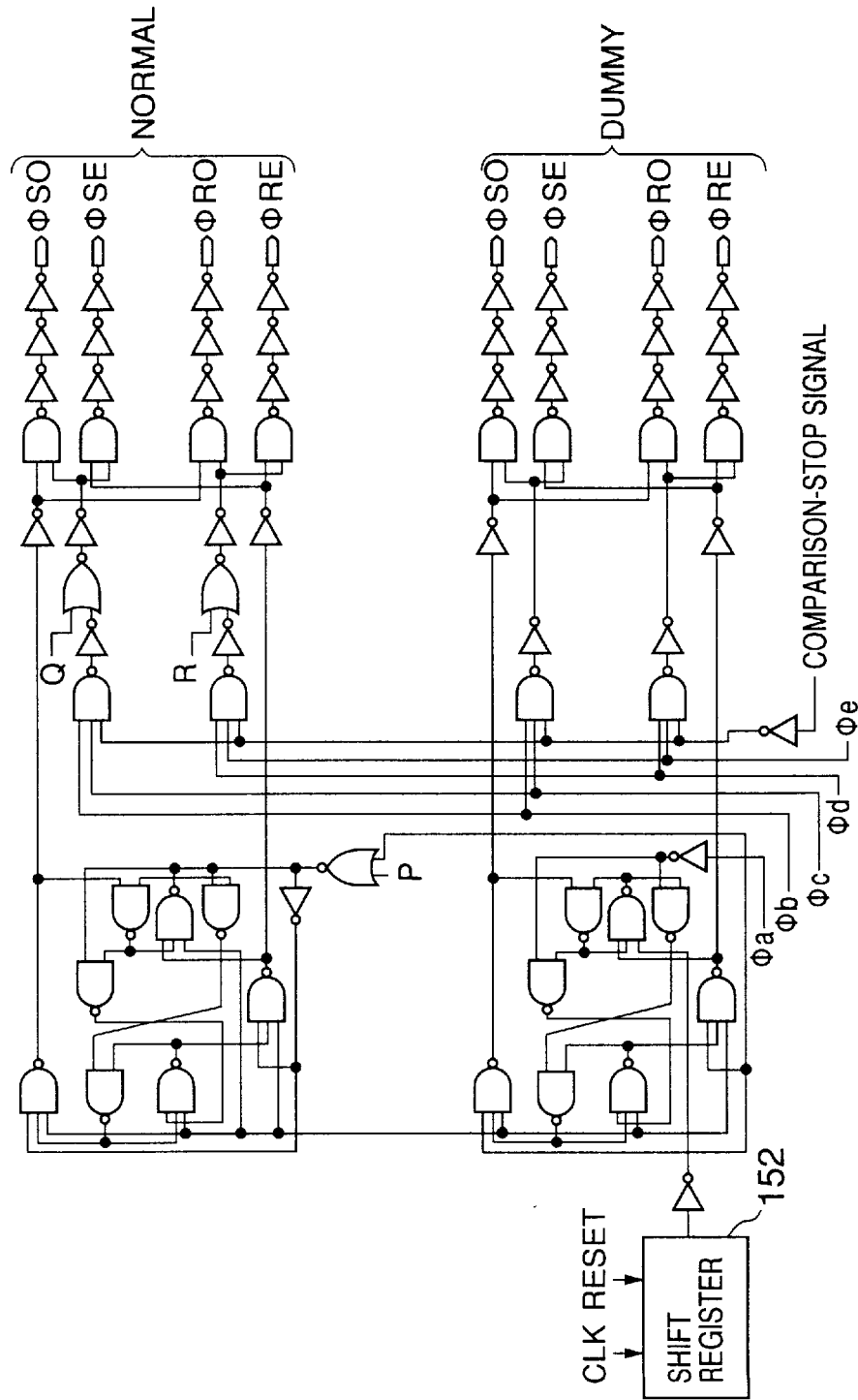
FIG. 15 is a circuit diagram showing an amplifier portion of the rough-comparison circuit according to the firs embodiment.

FIG. 15 is a circuit diagram showing an amplifier portion of the rough-comparison circuit 135 according to the first embodiment.

The circuit of FIG. 15 is also disclosed in the Japanese Patent Application No. 8-213882, and a detailed description thereof will be omitted. In the following, however, basic operations of this circuit will be described. This circuit receives Φa through Φe from the comparison portion shown in FIG. 13, and generates comparison results ΦSO, ΦSE, ΦRO, and ΦRE, which are then supplied to the delay-control pointers. An amplifier portion of the fine-comparison circuit 125 has a similar configuration. As shown in FIG. 12, the rough-delay-control pointer 132 and the dummy rough-delay-control pointer 134 are provided in this embodiment, so that the amplifier portion of the rough-comparison circuit 135 of FIG. 15 generates the comparison results to be supplied to the rough-delay-control pointer 132 and the comparison results to be supplied to the dummy rough-delay-control pointer 134. During normal operations, ΦSO and ΦSE exhibit changes while ΦRO and ΦRE are fixed to LOW if the phase of the signal E is ahead of the phase of the signal C. On the other hand, if the signal E and the signal C have almost the same phase, all of ΦSO, ΦSE, ΦRO, and ΦRE are fixed to LOW. Further, if the phase of the signal E is behind the phase of the signal C, ΦSO and ΦSE are fixed to LOW whereas ΦRO and ΦRE exhibit changes.

A circuit portion shown in the upper half in the figure generates the comparison results to be supplied to the rough-delay-control pointer 132. This circuit portion is provided with nodes P, Q, and R, which receive rough-shift signals shown in FIG. 12. By controlling the rough-shift signals, the comparison results can be generated so as to effect a desirable increment or decrement in the control value of the delay-control pointer. The rough-shift signals are normally fixed to LOW. When there is a need to increment a delay, the node Q receives HIGH, and the node R receives LOW, with the node P receiving a shift clock for testing purposes. This forces ΦSO and ΦSE to be fixed to LOW, and forces ΦRO and ΦRE to exhibit changes, which corresponds to the comparison results that would be obtained if the phase of the signal E was behind the phase of the signal C. When there is a need to decrement a delay, the node Q receives LOW, and the node R receives HIGH, with the node P receiving the shift clock for the testing purposes. This forces ΦSO and ΦSE to exhibit changes, and forces ΦRO and ΦRE to be fixed to LOW, which corresponds to the comparison results that would be obtained when the phase of the signal E was ahead of the phase of the signal C.

A shift register 152 generates a signal corresponding to a reset signal in synchronism with the clock CLK. While the reset signal is input, the shift register 152 stops the amplifier portion of the rough-comparison circuit 135 from generating the comparison results, so that ΦSO, ΦSE, ΦRO, and ΦRE are all LOW. In the absence of the reset signal input, the shift register 152 allows the amplifier portion of the rough-comparison circuit 135 to perform the above-described operations.

Figure 16A:
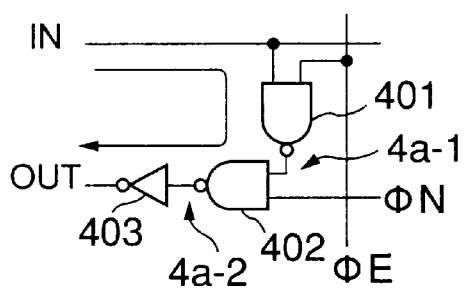
FIGS. 16A through 16C are illustrative drawings for explaining a configuration and operations of a rough delay circuit or a dummy rough-delay circuit.
Figure 16B:
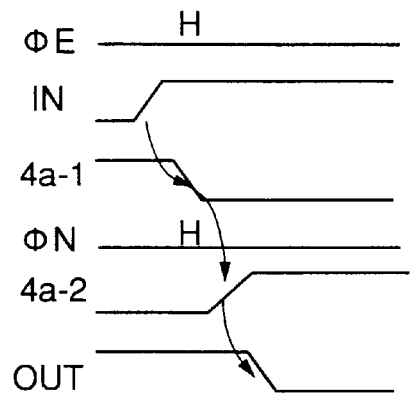
Figure 16C:
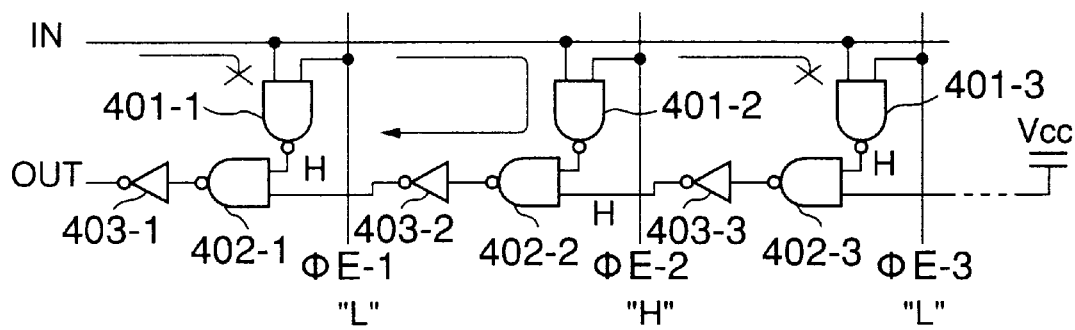
Figure 17:
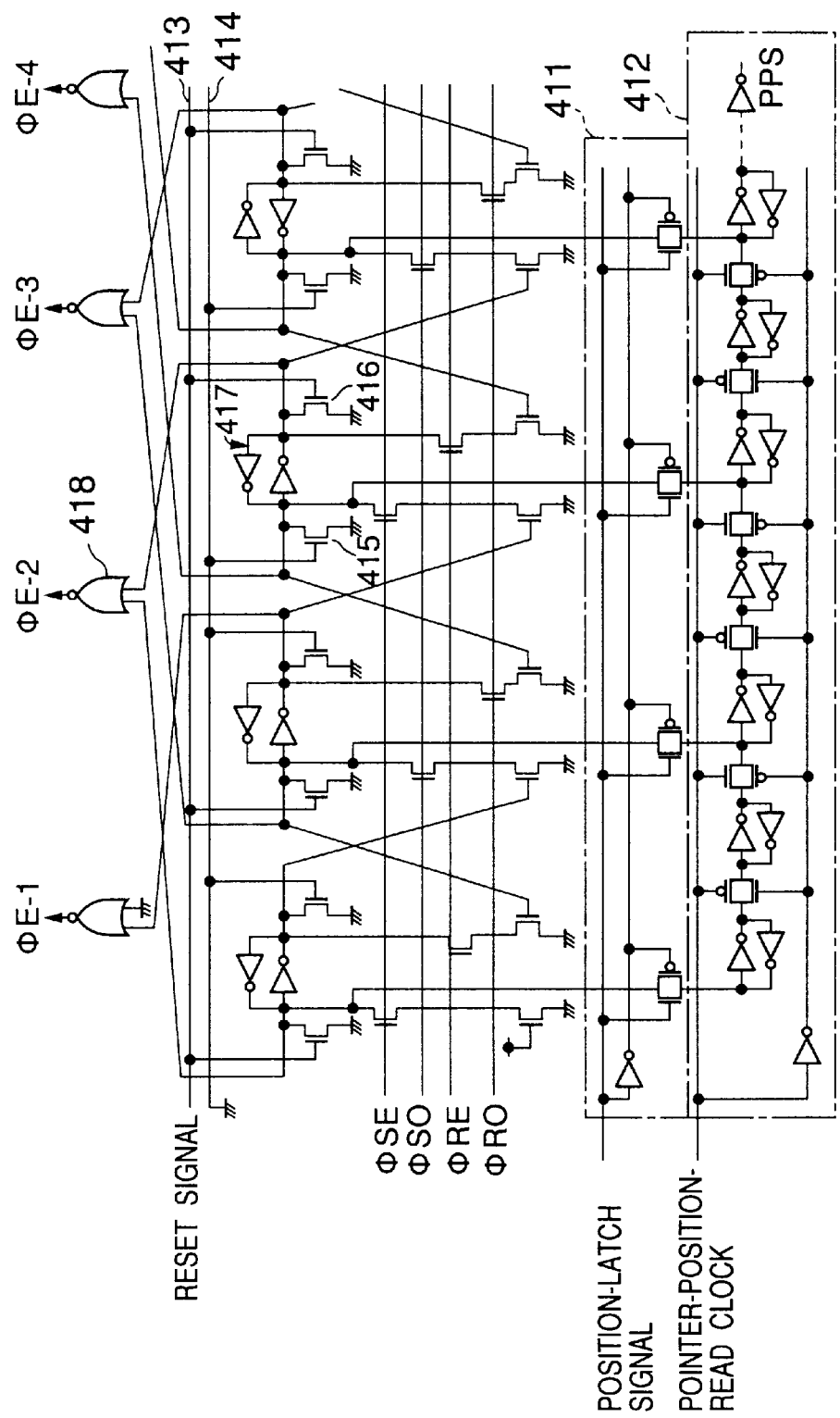
FIG. 17 is a circuit diagram of a rough-delay-control pointer or a deputy rough-delay-control pointer.

FIGS. 16A through 16C are illustrative drawings for explaining a configuration and operations of the rough delay circuit 131 or the dummy rough-delay circuit 133. FIG. 17 is a circuit diagram of the rough-delay-control pointer 132 or the dummy rough-delay-control pointer 134.

These circuits are disclosed in the Japanese Patent Application No. 8-213882, and a detailed description thereof will be omitted. In what follows, however, basic operations will be described. The delay circuit includes a series of delay stages, each of which includes NAND gates 401 and 402 and an inverter 403 as shown in FIGS. 16A and 16C. Only one of signals ΦE-1, ΦE-2, ΦE-3, . . . , becomes HIGH, or only two adjacent signals among these signals become HIGH. The NAND gate 401 in a delay stage corresponding to a HIGH signal ΦE is open, so that the number of delay stages which an input signal IN has to go through varies when the input signal IN is output as an output signal OUT, thereby changing the delay amount. Here, the fine-delay-control pointer 122 and the dummy fine-delay-control pointer 124 have the same configuration as that of FIG. 17. On the other hand, the fine-delay circuit 121 and the dummy fine-delay circuit 123 are designed to have a smaller delay with respect to each of the delay stages as disclosed in the Japanese Patent Application No. 9-142441.

The delay-control pointer of FIG. 17 changes a position of a HIGH output among a plurality of the outputs ΦE-1, ΦE-2, . . . , based on the comparison results ΦSO, ΦSE, ΦRO, and ΦRE supplied from the phase-comparison circuit. Namely, when ΦSO and ΦSE are fixed to LOW, and ΦRO and ΦRE are changed, a shift of the position of the HIGH output is made toward the right, thereby increasing the delay. On the other hand, when ΦSO and ΦSE are changed while ΦRO and ΦRE are fixed to LOW, the position of the HIGH output is shifted to the left, resulting in a decrease in the delay. When ΦSO, ΦSE, ΦRO, and ΦRE are all LOW, the position of the HIGH output is not moved, so that the delay does not change.

A condition of each stage is stored in a flip-flop comprised of two inverters. Both nodes of this flip-flop are connected to the ground via two corresponding transistors, so that selective turning on of the transistors makes it possible to set a desired condition to the flip-flop. A reset-signal line 413 and a ground-signal line 414 are provided as shown in the figure. One of the two transistors has a gate thereof connected to the reset-signal line 413, and the other has a gate thereof connected to the ground-signal line 414. If a flip-flop has a right-hand-side one of the two corresponding transistors connected to the reset-signal line 413, ΦE of a corresponding stage becomes HIGH when the reset signal is HIGH. In an example of FIG. 17, wiring connections are such that activation of the reset signal results in ΦE-3 and ΦE-4 being changed to HIGH. The wiring connections are fixed at a time of manufacture.

As previously described, the phase-comparison circuit of FIG. 15 changes the comparison results ΦSO, ΦSE, ΦRO, and ΦRE based on the shift signals P, Q, and R such that the position of the HIGH output(s) ΦE is shifted either to the right or to the left. After changing ΦE to HIGH at a predetermined position by using the reset signal, therefore, the position of the HIGH signal ΦE can be shifted to the right or to the left by using the shift signals P, Q, and R, thereby setting the delay of the delay circuit to a desired amount.

Moreover, a switch 411 and a shift register 412 are provided in order to read a condition of a flip-flop with respect to each stage. The switch 411 is normally in a closed position. When there is a need to read a condition of a flip-flop with respect to each stage, a position-latch signal is changed to LOW to stored the condition of each flip-flop in the shift register 412. When a pointer-position-read clock is supplied while the position-latch signal is LOW, the shift register 412 converts the stored conditions of the flip-flops into serial data, and outputs the serial data as a pointer-position signal PPS. In FIG. 12, the pointer-position signal is designated as FPPS for the fine-delay-control pointer 122, DFPPS for the dummy fine-delay-control pointer 124, RPPS for the rough-delay-control pointer 132, and DRPPS for the dummy rough-delay-control pointer 134. It should be noted that the position-latch signal and the pointer-position-read signal are omitted in FIG. 12.

In this manner, the control values of the delay-control pointers can be read.

Figure 18A:
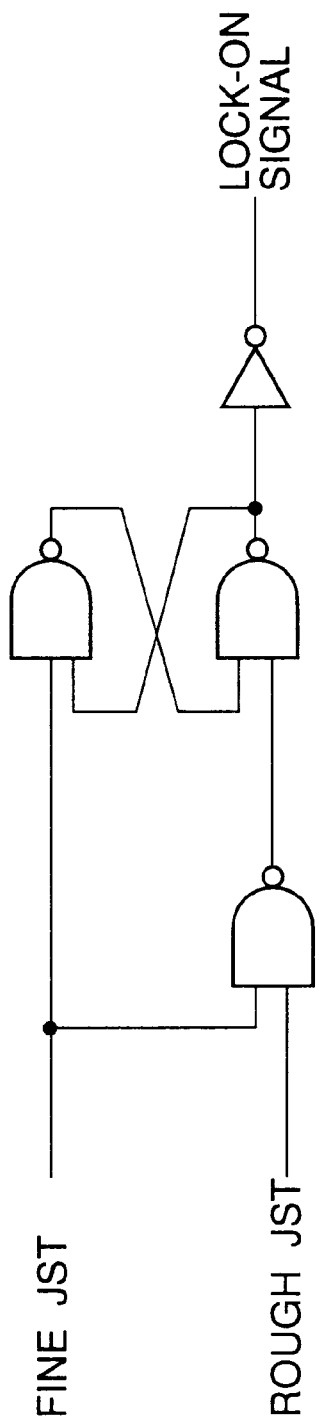
FIG. 18A is a circuit diagram of a lock-on-signal-generation circuit.
Figure 18B:
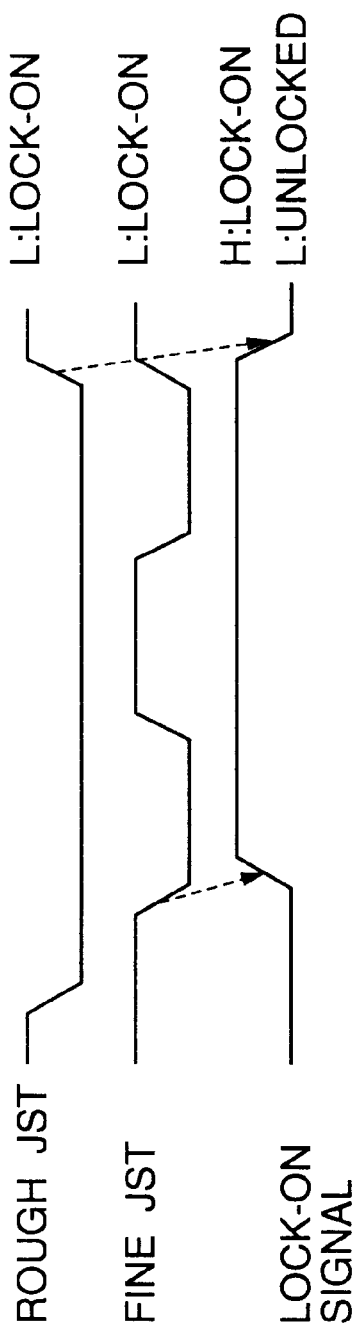
FIG. 18B is a timing chart showing operations of a lock-on-signal-generation circuit.

FIG. 18A is a circuit diagram of the lock-on-signal-generation circuit 143, and FIG. 18B is a timing chart showing operations of the lock-on-signal-generation circuit 143. The circuit of FIG. 18A generates the lock-on signal to be output from the semiconductor device based on the fine-lock-on signal JST and the rough-lock-on signal JST, which are output from the NAND gate 151 shown in FIG. 13. The fine-lock-on signal JST and the rough-lock-on signal JST are LOW when the lock-on condition is in place. The fine-comparison circuit 125 can detect a smaller phase displacement than the rough-comparison circuit 135, so that the rough-lock-on signal JST is quicker to lock on (i.e., become LOW) after the timing-stabilization circuit is switched on. When a condition is switched from the lock-on condition to an unlocked condition owing to clock jitters or the like, the fine-lock-on signal JST and the rough-lock-on signal JST simultaneously become HIGH, or the fine-lock-on signal JST is faster to become HIGH. The lock-on-signal-generation circuit of FIG. 18A generates the lock-on signal when the fine-lock-on signal JST becomes LOW after the rough-lock-on signal JST is first changed to LOW during a transition from the unlocked condition to the lock-on condition. Once the lock-on condition is detected, the lock-on signal is not unlocked even if the fine-lock-on signal JST becomes HIGH. Only when the rough-lock-on signal JST becomes HIGH along with the fine-lock-on signal JST, does the lock-on signal become unlocked.

Figure 19:
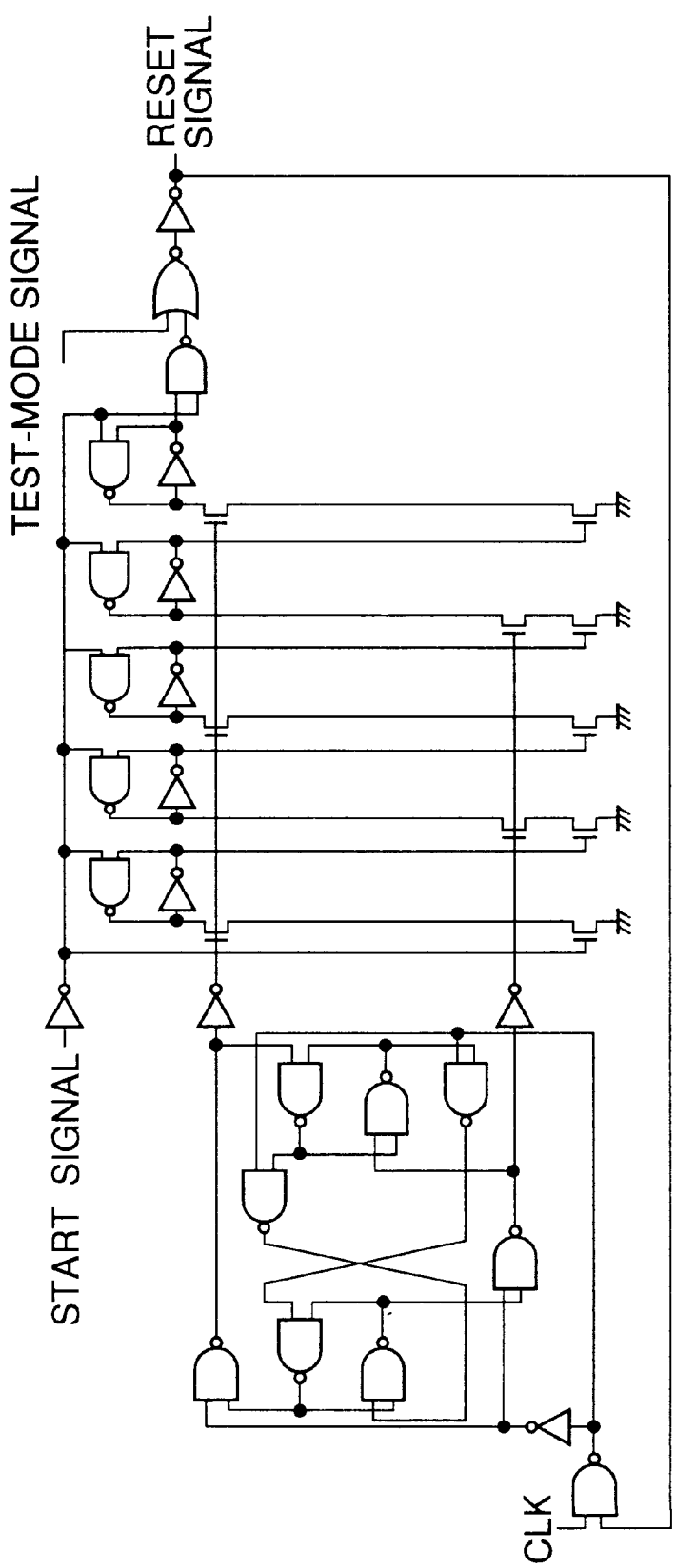
FIG. 19 is a circuit diagram of a reset-signal-generation circuit.

FIG. 19 is a circuit diagram of the reset-signal-generation circuit 144. The circuit of FIG. 19 changes the reset signal to LOW upon counting a predetermined number of pulses of the clock CLK after a start signal is input at a time of switching on. The start signal is generated at the time of switching on based on a check signal of a power-voltage-level-check circuit. The change to LOW in the reset signal starts operations of the DLL circuits. Here, a test-mode signal can be used for forcing the reset signal to change to HIGH, thereby resetting the operations of the DLL circuit.

Figure 20:
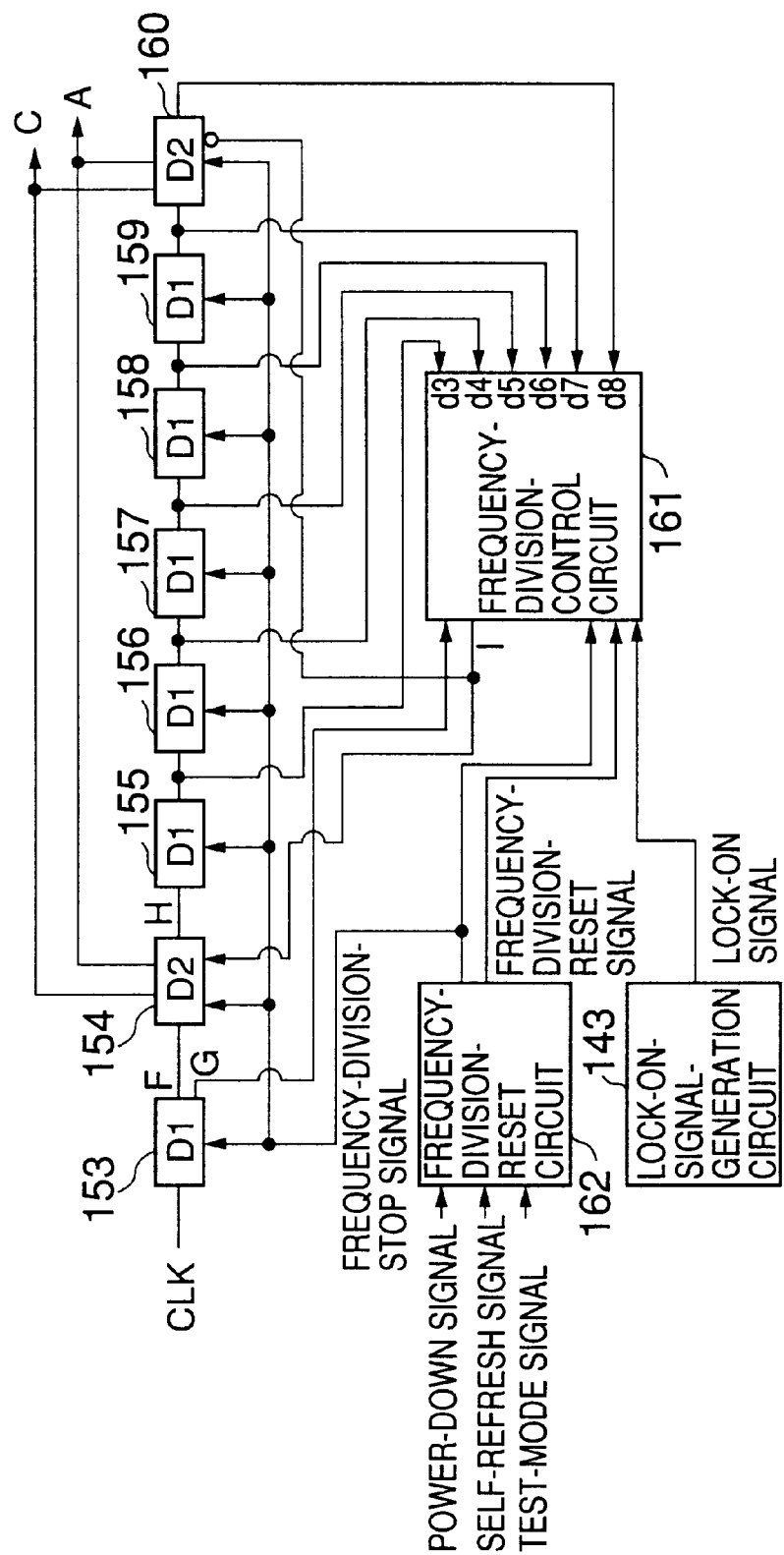
FIG. 20 is a block diagram showing a configuration of a frequency divider.

FIG. 20 is a block diagram showing a configuration of the frequency divider 112. In FIG. 20, frequency dividers D1 designated as 153 and 155 through 160 and a frequency divider designated as 154 are ½ frequency dividers.

Figure 21:
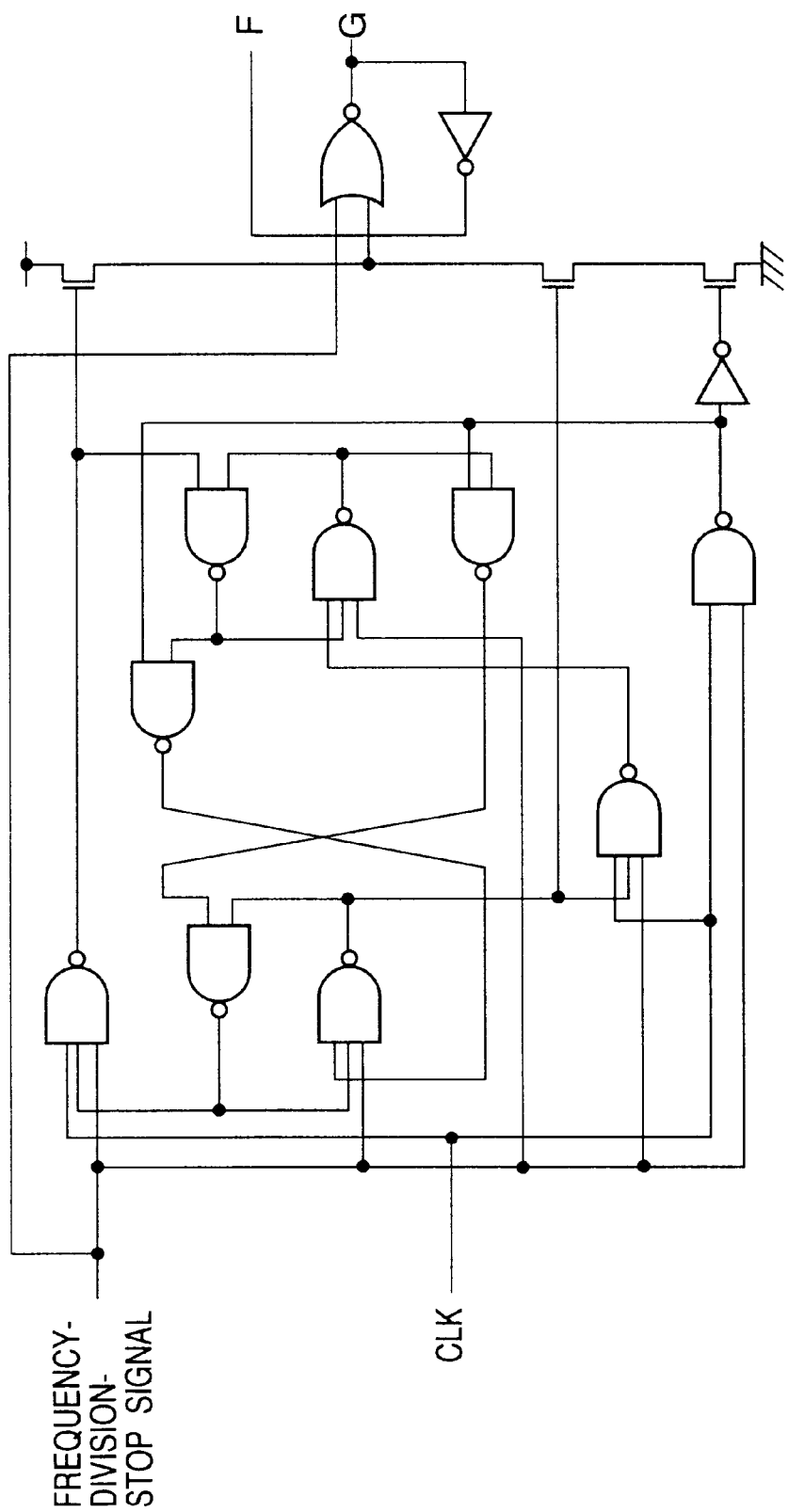
FIG. 21 is a circuit diagram showing a configuration of a frequency divider D1.
Figure 22:
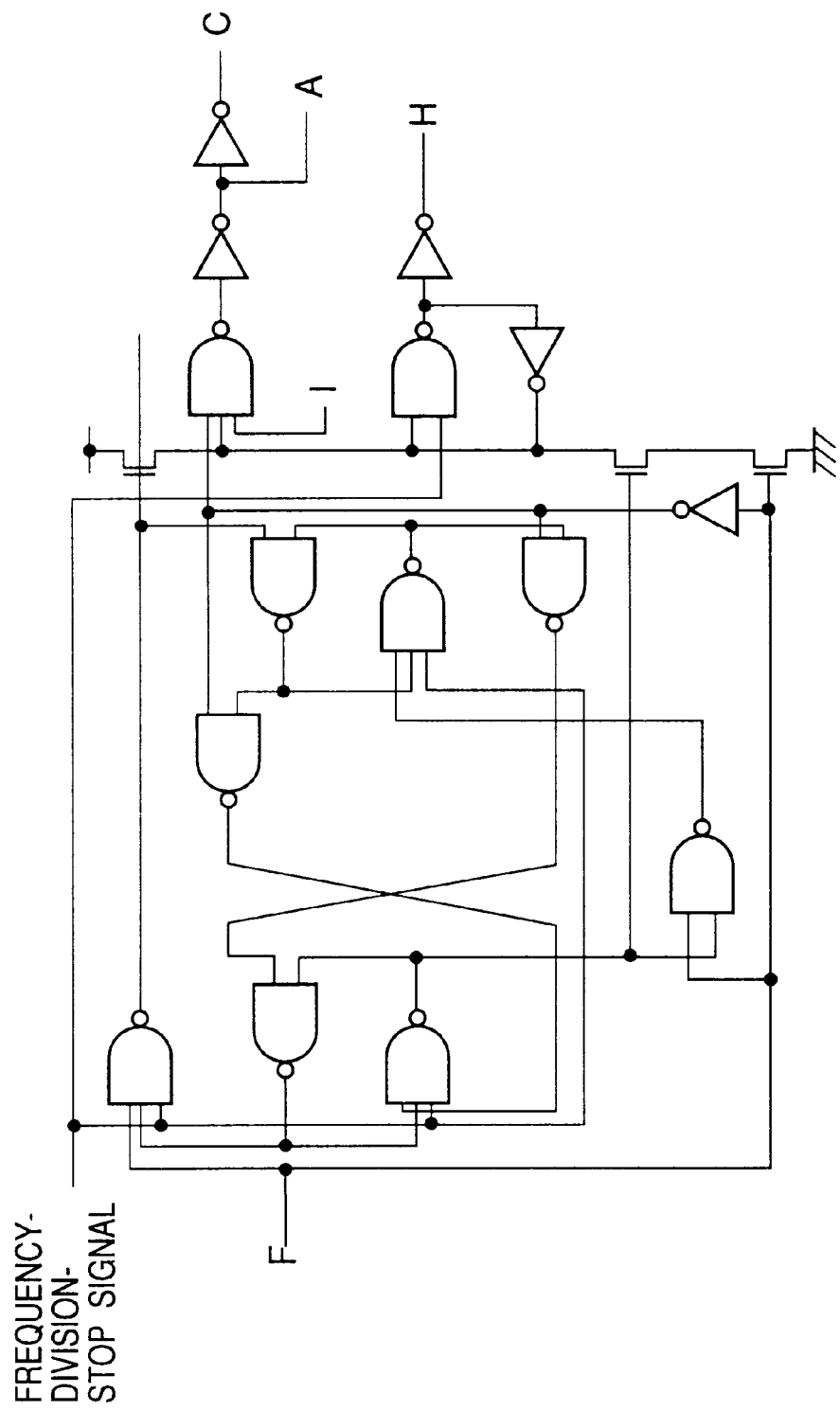
FIG. 22 a circuit diagram showing a configuration frequency divider D2.
Figure 23:
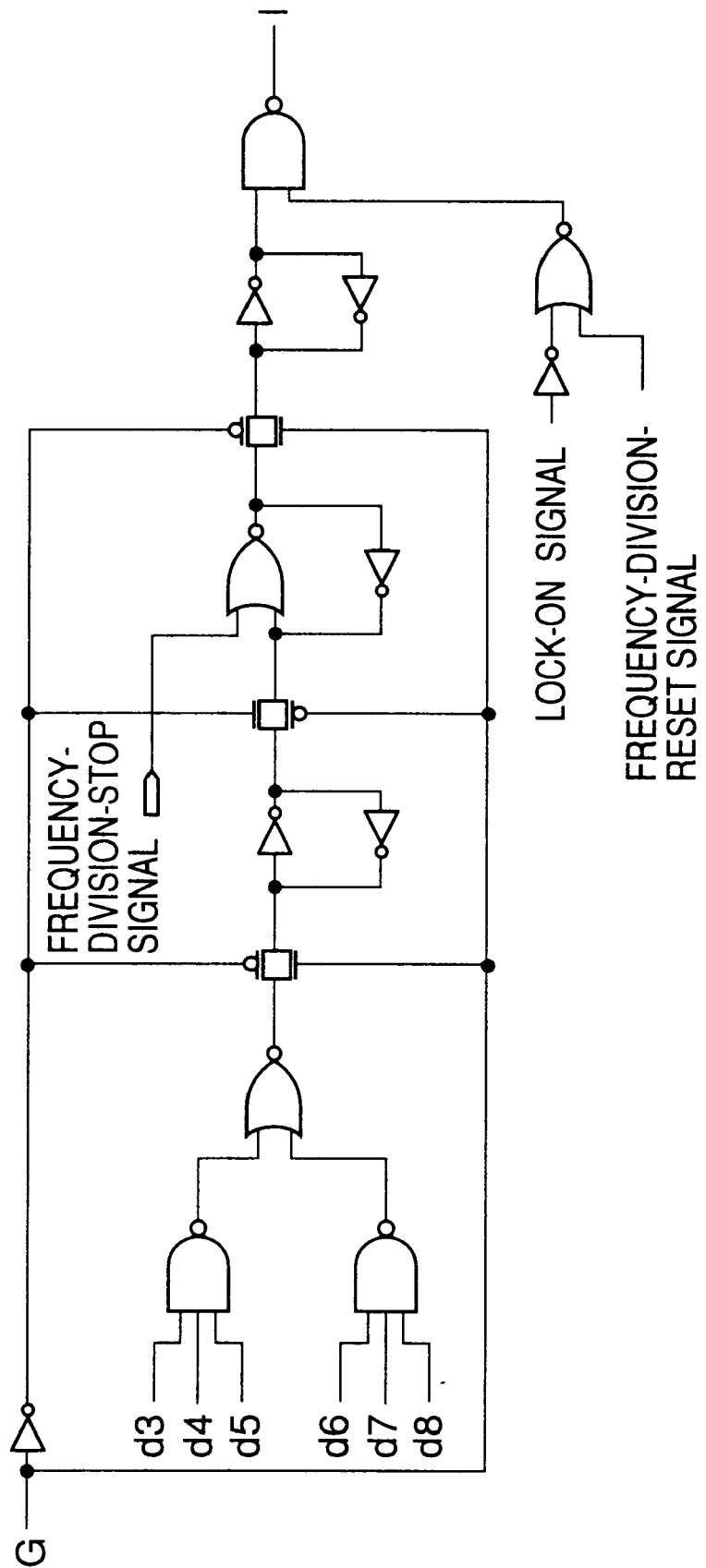
FIG. 23 is a circuit diagram showing a configuration of r frequency divider.

FIG. 21 is a circuit diagram showing a configuration of the frequency divider D1. FIG. 22 is a circuit diagram showing a configuration of the frequency divider D2. Further, FIG. 23 is a circuit diagram showing a configuration of a frequency-division-control circuit 161.

The lock-on-signal-generation circuit 143 of FIG. 20 is shown in FIG. 12. A frequency-division-reset circuit 162 receives a power-down signal, a self-refresh signal, and a test-mode signal, and generates a frequency-division-reset signal and a frequency-division-stop signal according to the received signals. In FIG. 12, the frequency-division-reset circuit 162 is supposed to be situated outside the figure, so that the frequency-division-reset signal and the frequency-division-stop signal are input to the frequency divider 112. As shown in FIG. 20, the ½ frequency dividers D1 and the ½ frequency dividers D2 are connected in series, and the total number of the frequency dividers provided in this series is eight. The frequency divider D1 at the first stage receives the clock CLK, and supplies an output F after ½ frequency division to the frequency divider D2 at the second stage. The frequency divider D1 at the first stage further provides an output G to the frequency-division-control circuit 161. The frequency divider D2 at the second stage generates outputs A and C to the dummy DLL circuit, and supplies an output H to the frequency divider D1 at the third stage. The frequency dividers D1 from the third stage through the seventh stage receive an output of the preceding stage as the clock CLK, and supply the output F after the ½ frequency division to the next stage. The frequency divider D2 at the eighth stage supplies the outputs A and C to the dummy DLL circuit, and provides the output H to the frequency-division-control circuit 161. The frequency dividers D2 at the second stage and the eighth stage have the outputs A and C thereof controlled by a signal I from the frequency-division-control circuit 161. When the signal I is HIGH, the frequency divider D2 at the second stage supplies the outputs A and C. Whereas the frequency divider D2 at the eighth stage supplies these outputs when the signal I is LOW. The clock CLK input to the first stage is successively subjected to the ½ frequency division, so that the output of the last stage has a frequency that is 1/256 of the original frequency. The ½ frequency dividers D1 and D2 are stopped and initialized by the frequency-division-stop signal.

The frequency-division-control circuit 161 controls the above-mentioned outputs A and C as to whether the outputs A and C are a ¼-frequency clock generated by the frequency divider D2 at the second stage or a 1/256-frequency clock from the frequency divider D2 at the eighth stage. Here, the output A is supplied to the dummy fine-delay circuit 123, and the output C is sent to the fine-comparison circuit 125 and the rough-comparison circuit 135. When the lock-on signal is inactive, the signal I is HIGH at all times, so that the outputs A and C have the ¼ frequency. In this case, the frequency divider D2 at the eighth stage stops outputting the 1/256-frequency clock. When the lock-on signal is active, on the other hand, the signal I is changed to LOW, and thereby the outputs A and C have the 1/256 frequency. Here, the signal I becomes LOW at a timing when all the signals d3 through d8 are changed to HIGH.

The frequency-division-reset signal temporarily nullifies the lock-on condition. When the signal I becomes HIGH, the outputs A and C are supplied at the ¼ frequency. When the frequency-division-reset signal becomes HIGH, however, the signal I is immediately changed to LOW, thereby outputting the outputs A and C at the 1/256 frequency.

At a time when the device enters one of the power-down cycle or the self-refresh cycle or when the device exits from one of these cycles, changes to HIGH in the frequency-division-stop signal and the frequency-division-reset signal force the frequency divider 112 to stop operations thereof and initialize internal conditions thereof. After this, if the frequency-division-stop signal is changed to LOW, a frequency comparison is made four clocks later. The same applies in the case of the test-mode signal. During these four clocks, no frequency-divided clock is supplied to the fine-comparison circuit 125 and the rough-comparison circuit 135, and, thus, these circuits start comparison operations after the passage of these four cycles and when stable conditions are secured.

In what follows, a measurement circuit for measuring an input setup time and an input hold time will be described with regard to a semiconductor device having the timing-stabilization circuit of the first embodiment.

Figure 24:
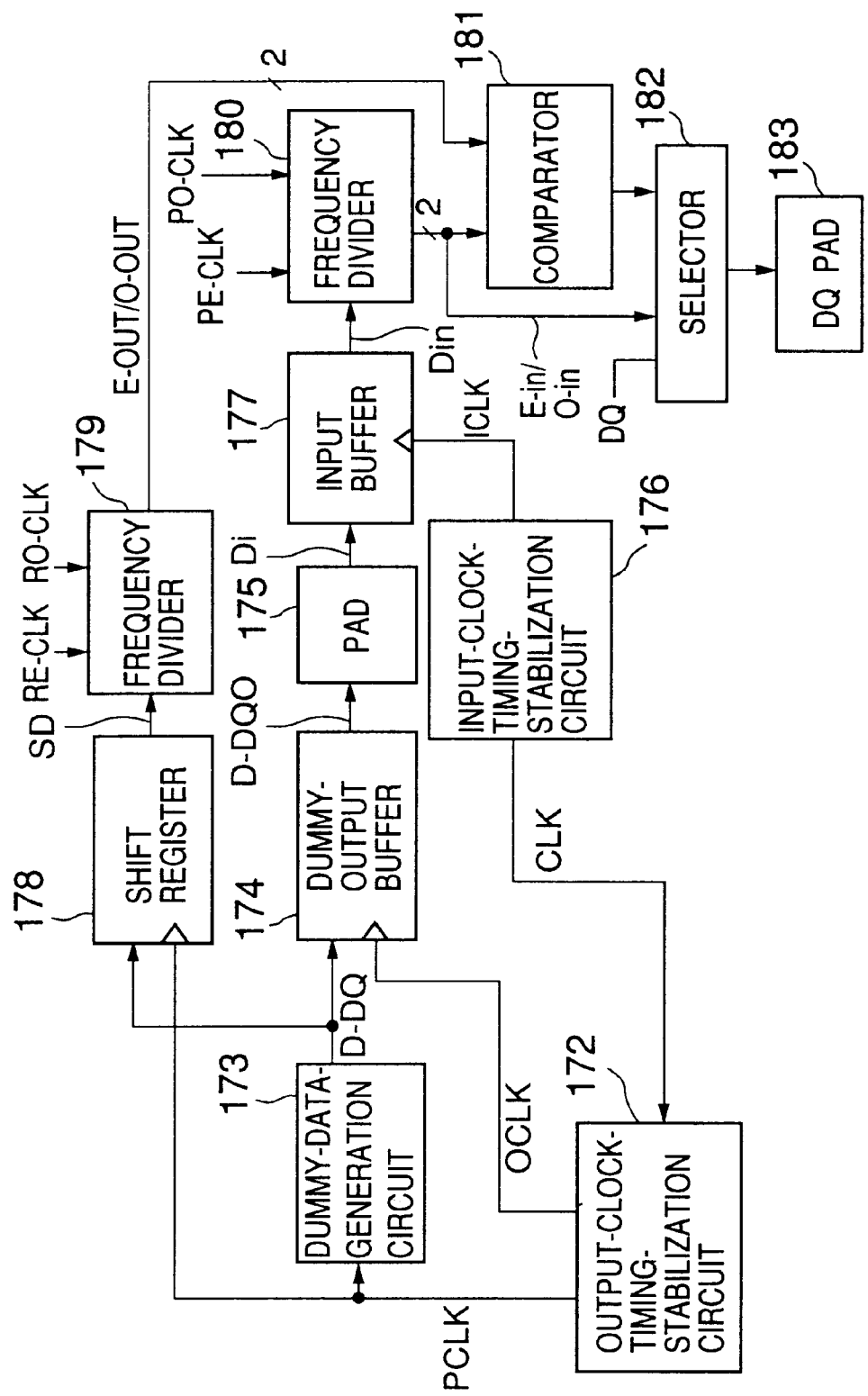
FIG. 24 is a block diagram showing a configuration of a measurement circuit for measuring an input setup time and an input hold time which is provided for a semiconductor device having the timing-stabilization circuit of the first embodiment.

FIG. 24 is a block diagram showing a configuration of a measurement circuit for measuring an input setup time and an input hold time which is provided for a semiconductor device having the timing-stabilization circuit of the first embodiment.

In the figure, the timing-stabilization circuit of the first embodiment is shown as an input-clock-timing-stabilization circuit 176. An input buffer 177 latches input data supplied to a pad 175 by using an input clock ICLK, which is output from the input-clock-timing-stabilization circuit 176. This configuration is inherently provided for a semiconductor device. Semiconductor devices are generally bound to output some data. For the purpose of output-timing control, the semiconductor device of FIG. 24 includes an output-clock-timing-stabilization circuit 172 having the DLL circuit as described in connection with the first embodiment. The input-clock-timing-stabilization circuit 176 supplies the clock CLK to the output-clock-timing-stabilization circuit 172. The semiconductor device of this embodiment further includes a dummy-data-generation circuit 173 for generating dummy output data D-DQ in accordance with an output clock PCLK, which is supplied from the output-clock-timing-stabilization circuit 172. The semiconductor device further includes a dummy-output buffer 174 for supplying the dummy output data D-DQ to the pad 175 as data D-DQO in synchronism with an output clock OCLK, which is output from the output-clock-timing-stabilization circuit 172. The semiconductor device further includes a shift register 178 for shifting the dummy output data D-DQ in synchronism with the output clock PCLK, a frequency divider 179 for dividing a frequency of an output SD from the shift register 178 in synchronism with a clock RE-CLK and a clock RO-CLK, a frequency divider 180 for dividing a frequency of input data Din in synchronism with a clock PE-CLK and a clock PO-CLK after the input data Din is latched by the input buffer 177, a comparator 181 for comparing outputs E-OUT and O-OUT from the frequency divider 179 respectively with outputs E-in and O-in, and a selector 182 for selecting one of the outputs E-in and 0-in from the frequency divider 180, a comparison result of the comparator 181, and normal output data DQ.

Figure 25:
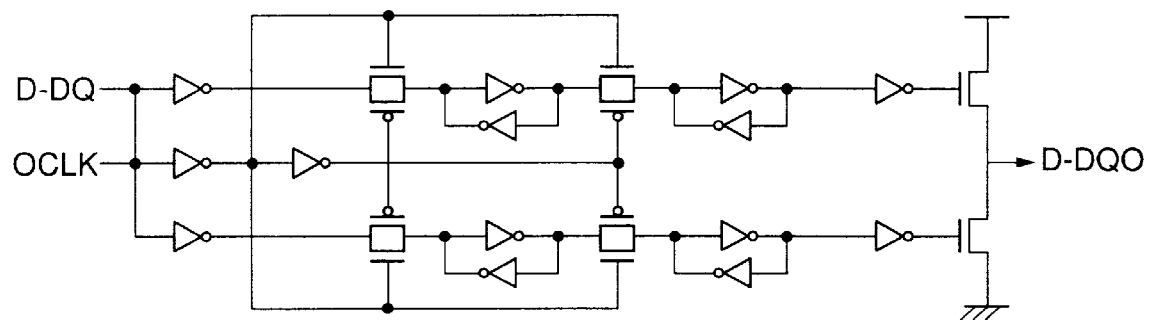
FIG. 25 is a circuit diagram of a dummy-output buffer.
Figure 26:
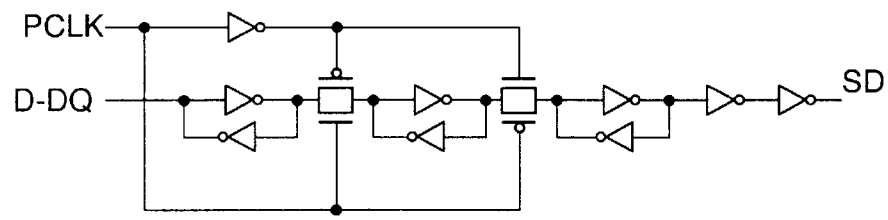
FIG. 26 is a circuit diagram of a shift register.
Figure 27:
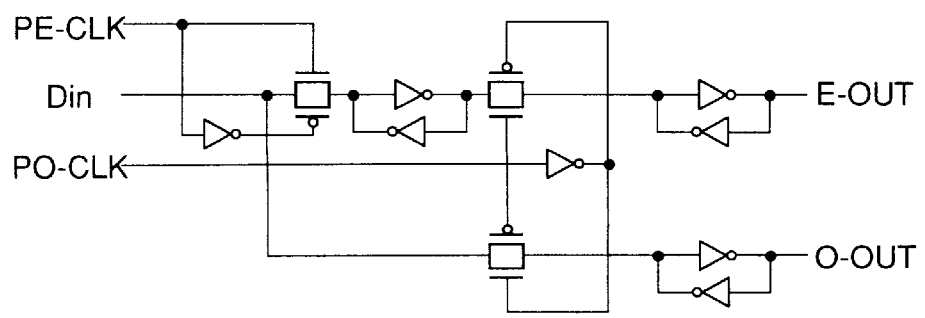
FIG. 27 is a circuit diagram of a frequency divider.
Figure 28:
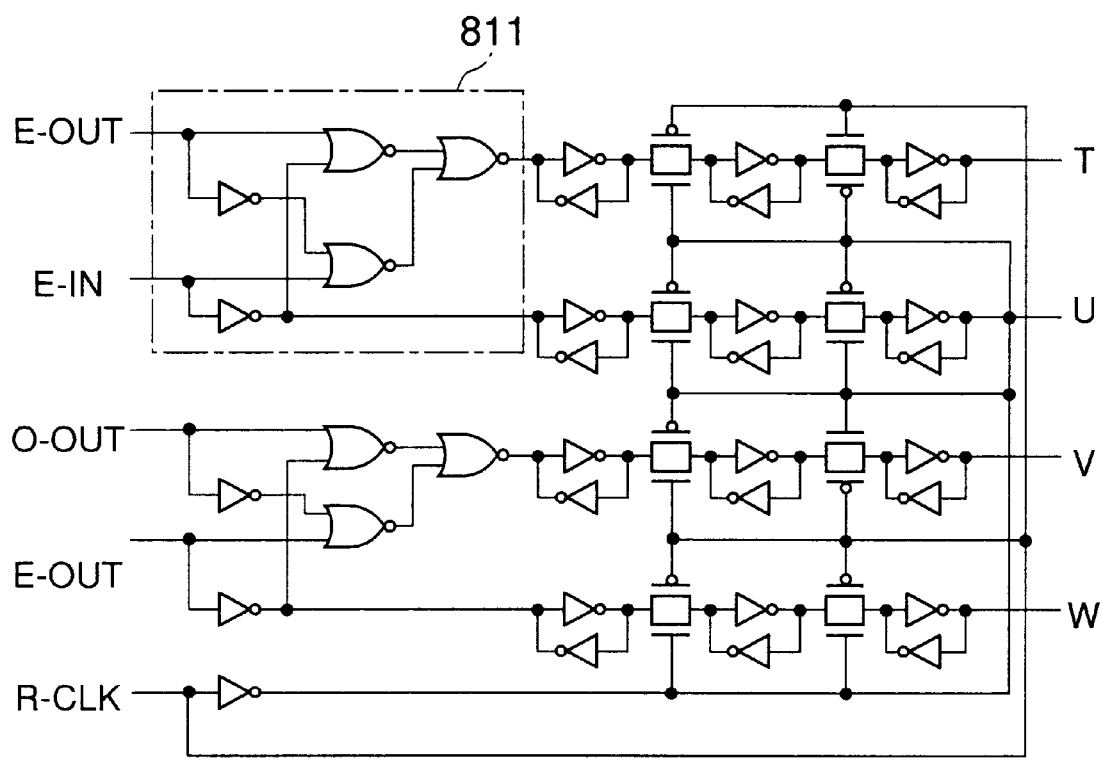
FIG. 28 is a circuit diagram of a comparator.
Figure 29:
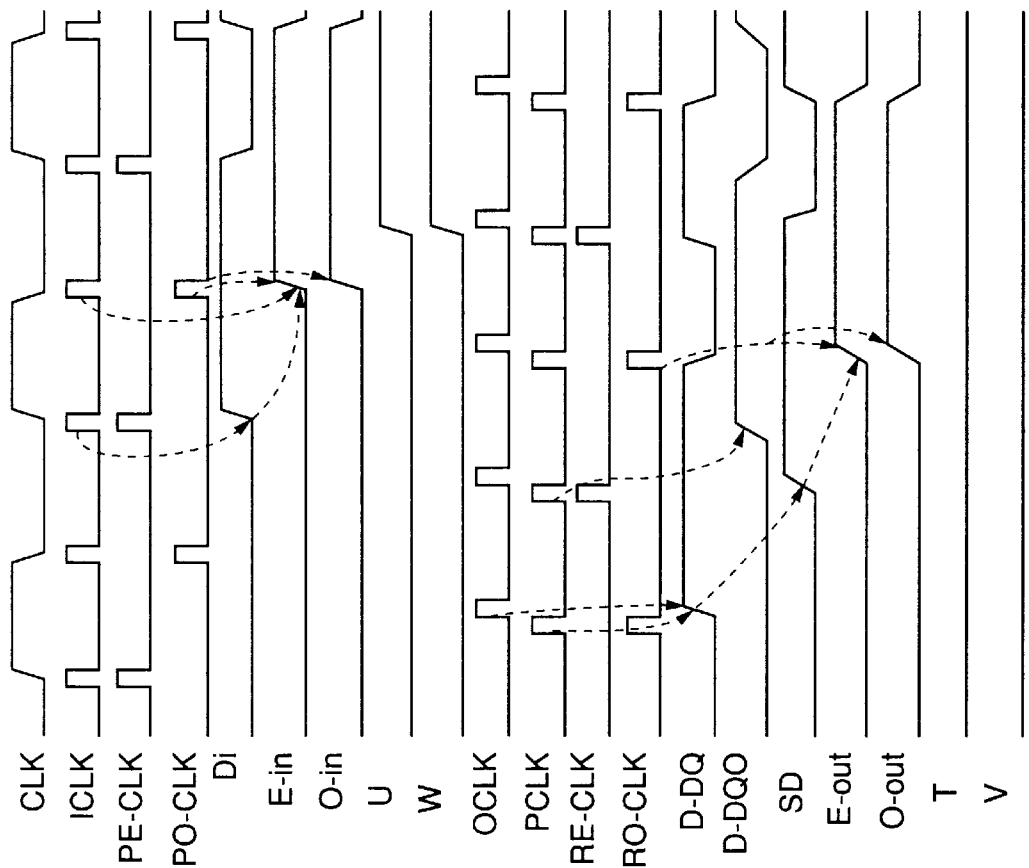
FIGS. 29A through 29T are time charts showing operations of the measurement circuit of FIG. 24.

FIG. 25 is a circuit diagram of the dummy-output buffer 174. FIG. 26 is a circuit diagram of the shift register 178. FIG. 27 is a circuit diagram of the frequency divider 180. FIG. 28 is a circuit diagram of the comparator 181. FIGS. 29A through 29T are time charts showing operations of the measurement circuit of FIG. 24. The circuits shown from FIG. 25 through FIG. 28 are well known in the art, and descriptions thereof will be omitted. In the following, operations of the measurement circuit shown in FIG. 24 will be explained with reference to FIGS. 29A through 29T.

In this example, data is assumed to be provided as a signal of a double-clock rate, which means that the data changes at a rate of half the clock cycle. The input-clock-timing-stabilization circuit 176 receives the external clock CLK, and supplies it to the output-clock-timing-stabilization circuit 172. Further, the input-clock-timing-stabilization circuit 176 generates the input clock ICLK having the same phase as the external clock CLK. At the same time, the clock PE-CLK and the clock PO-CLK, each of which is comprised of every other pulse of the input clock ICLK and is staggered with the other, are generated. As shown in FIGS. 29A through 29D, the clock PE-CLK has pulses thereof at rising edges of the external clock CLK, and the clock PO-CLK has pulses at falling edges of the external clock CLK. A circuit which generates such clocks is well known in the art, and a description thereof will be omitted. The input data Din from the input buffer 177 is provided at the double-clock rate, and is converted by the frequency divider 180 in synchronism with the clock PE-CLK and the clock PO-CLK into the data E-in and the data O-in, which have a normal clock rate.

The output-clock-timing-stabilization circuit 172 generates the output clock PCLK and the clock OCLK slightly delayed behind the output clock PCLK by using the external clock CLK. The output clock PCLK is supplied to the dummy-data-generation circuit 173 and the shift register 178, and the clock OCLK is provided to the dummy-output buffer 174. In response, the dummy-data-generation circuit 173 generates the dummy output data D-DQ which is suitable for measurement purposes. The dummy-output buffer 174 passes the dummy output data D-DQ to the pad 175 as the dummy output D-DQO in synchronism with the clock OCLK. The dummy output D-DQO changes in synchronism with edges of the external clock CLK. The dummy output D-DQO supplied to the pad 175 is provided to the input buffer 177 as the input data Di. The input buffer 177 reads the input data Di in synchronism with the input clock ICLK.

The shift register 178 delays the dummy output data D-DQ by half the cycle of the external clock CLK to generate the data SD. The frequency divider 179 converts the data SD in synchronism with the clocks RE-CLK and RO-CLK into the data E-out and O-out, which have the normal clock rate. Since the data E-out and O-out are signals obtained by shifting the dummy-output data which is not related to the data-input timing, a comparison of the data E-in and O-in with the data E-out and O-out can determine whether data preceding a given edge of the dummy output data or data following this given edge is input. This comparison is made by the comparator 181, which generates comparison results T, U, V, and W. The comparison results T, U, V, and W and the data E-in and Oin are output outside via the DQ pad 183. These pieces of data, however, cannot be output simultaneously. Further, the DQ pad 183 is usually used for outputting the output data, so that there is a need to select one of these different types of data according to a signal indicated from the outside.

Both the input clock ICLK and the dummy output D-DQO change at edge timings of the external clock CLK. Because of this, if the dummy output D-DQO is latched by the input clock ICLK, uncertainty remains as to whether data before a given edge or data after the given edge is latched. In consideration of this, the function to make a desired timing shift in the input clock ICLK of the input-clock-timing-stabilization circuit 176 is used, so that the input clock CLK is shifted backward or forward by small steps according to instruction data provided from the outside. The data is latched at each step to obtain the comparison results. When the input clock ICLK is delayed, the larger the delay, the more stable the data latched after the given edge can be.

A minimum delay which ensures a stable data latch corresponds to the input setup time. When the input clock ICLK is advanced, the larger the advancement, the more stable the data latched before the given edge can be. A minimum advancement which ensures the stability corresponds to the input hold time. This measurement is conducted under various conditions to obtain the input setup time and the input hold time.

The measurement circuit described above shifts a phase of the input clock signal by using the function of the present invention when measuring the input setup time and the input hold time. Conversely, the same function may be provided for the output-clock-timing-stabilization circuit 172 to shift a phase of the output data. This also makes it possible to measure the input setup time and the input hold time in the same manner.

The measurement circuit described above uses the input buffer 177 for latching the dummy output data for the measurement purposes while the input buffer 177 is also used for inputting normal data. Alternately, a dummy input buffer may be used for the same purposes. Also, an output buffer may be used in place of the dummy output buffer for outputting the measurement purpose output data.

Figure 30:
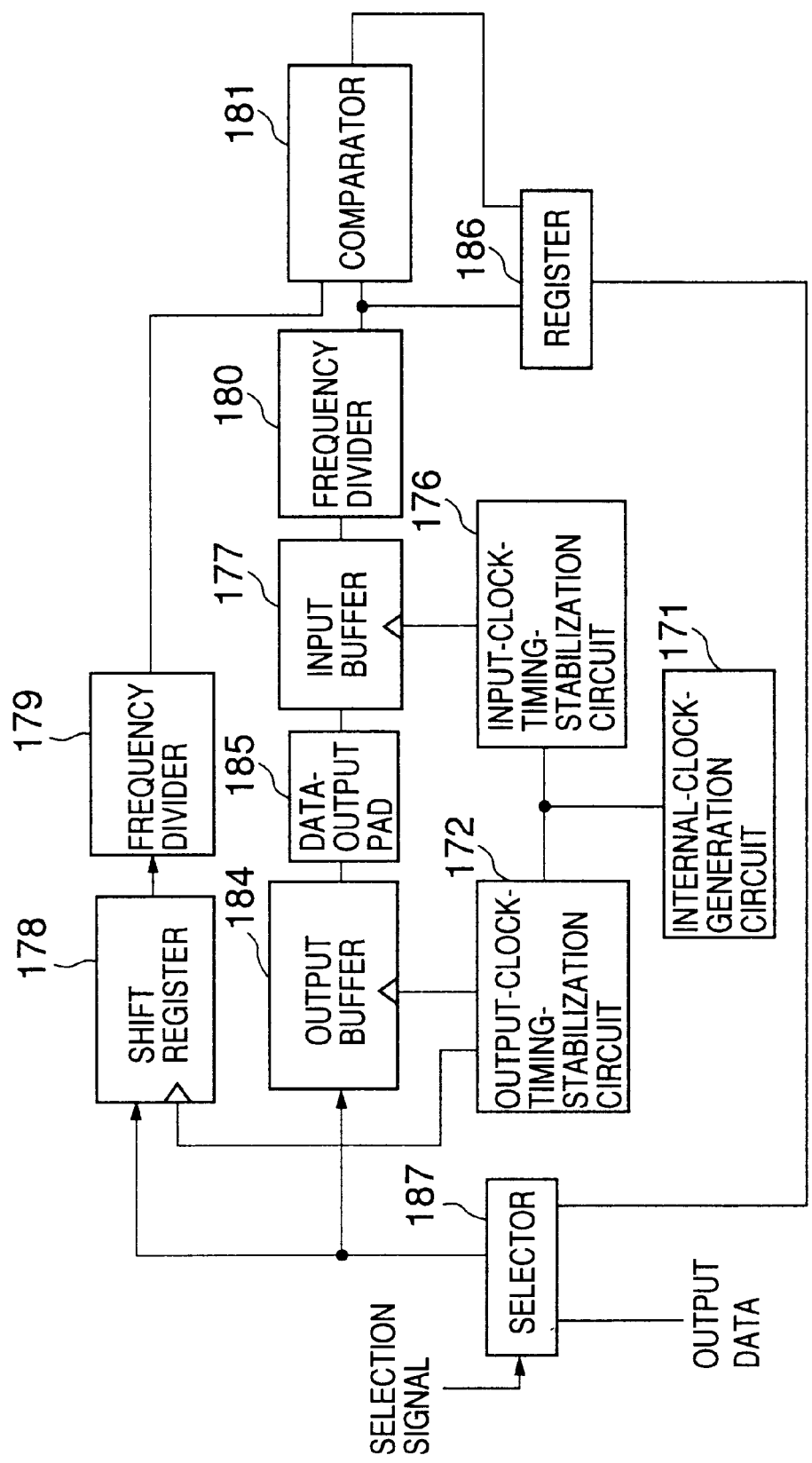
FIG. 30 is a block diagram of another configuration of the measurement circuit shown in FIG. 24.

FIG. 30 is a block diagram of another configuration of the measurement circuit shown in FIG. 24.

In the measurement circuit of FIG. 24, the output data is output from the dummy-output buffer 174, and the measurement results are output from the DQ pad 183. In the measurement circuit of FIG. 30, on the other hand, the output data is output from an output buffer 184. In this case, a data-output pad 185 is already in use because the output buffer 184 supplies the output data to the data-output pad 185. The measurement results thus cannot be output from the data-output pad 185. To cope with this problem, the measurement circuit of FIG. 30 uses a register 186 to store the output of the frequency divider 180 and the comparison results (measurement results). After completion of the measurement, the measurement results stored in the register 186 are supplied from the output buffer 184 to the data-output pad 185.

Figure 31:
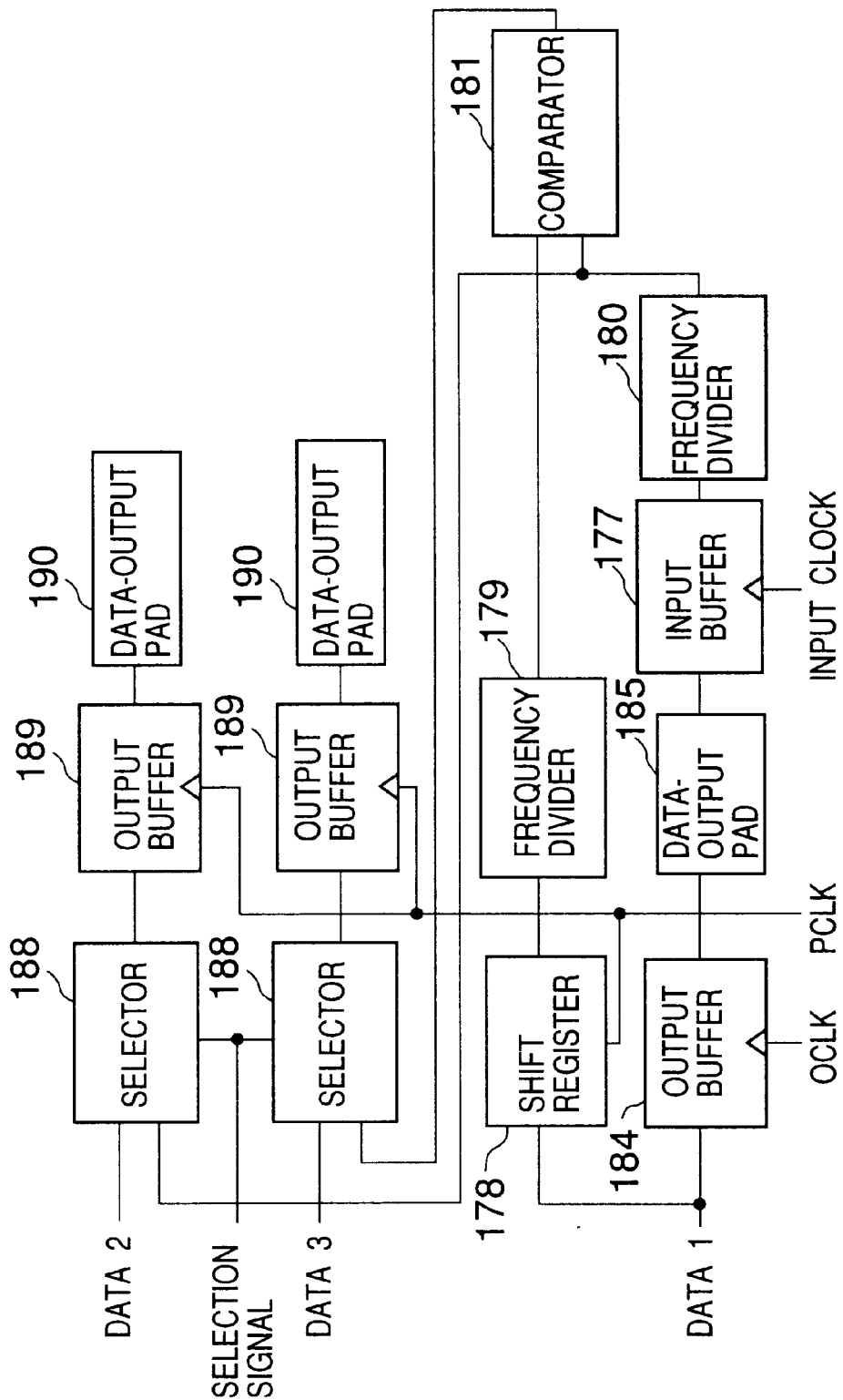
FIG. 31 is a block diagram of yet another configuration of the measurement circuit.

FIG. 31 is a block diagram of yet another configuration of the measurement circuit.

In this measurement circuit, the output data is output from the output buffer 184 to the data-output pad 185, and is latched by the input buffer 177 for comparison purposes. The measurement results are then output from other output buffers 188 to other data-output pads 190. Use of this configuration eliminates a need for a register since the measurement results can be output while the measurement is being made.

Figure 32:
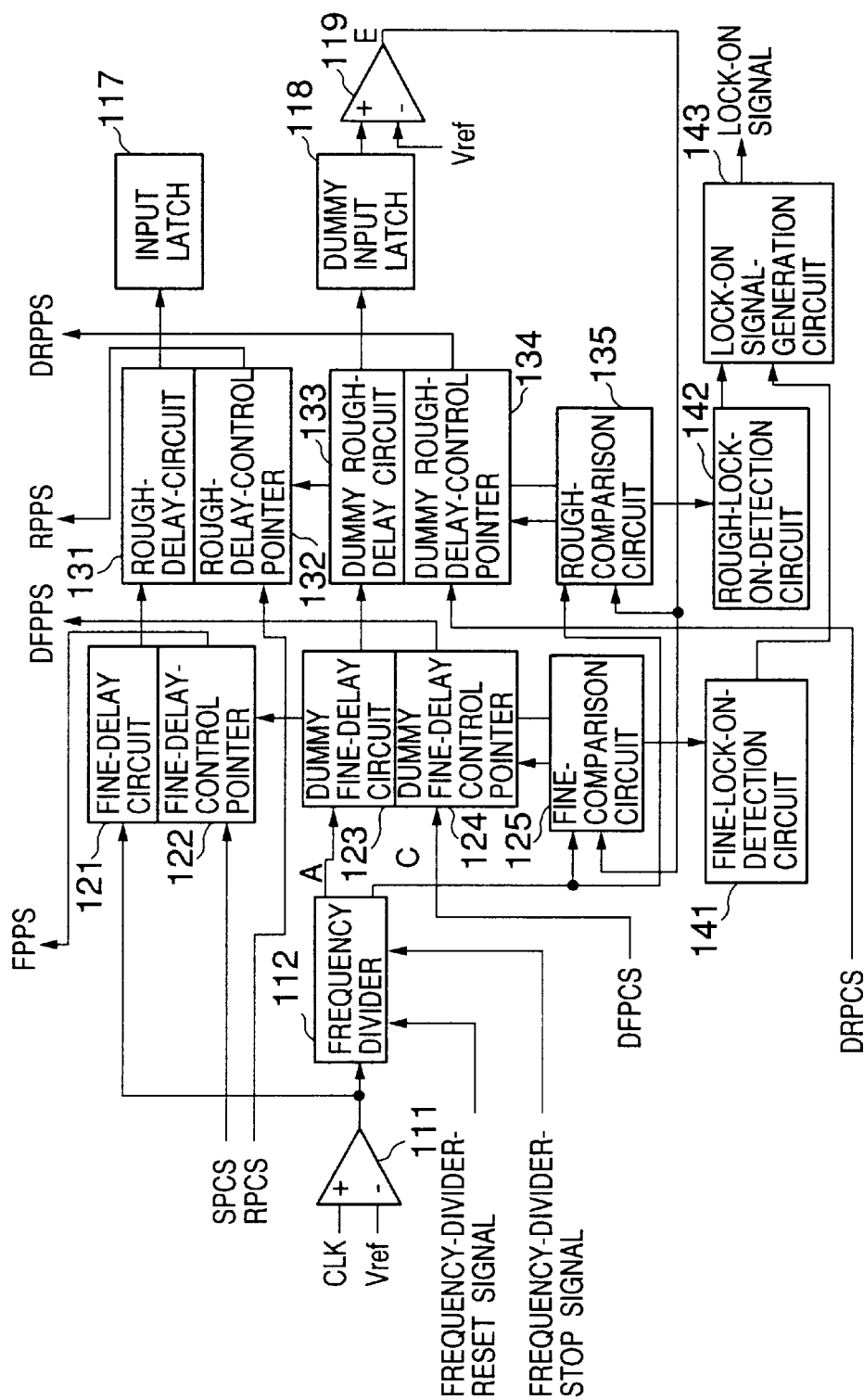
FIG. 32 is a block diagram showing a configuration of a timing-stabilization circuit according to a second embodiment.

FIG. 32 is a block diagram showing a configuration of a timing-stabilization circuit according to a second embodiment.

The second embodiment differs from the first embodiment in that settings can be made directly from the outside to the control value of each delay-control pointer. Further, a configuration of the lock-on-signal-generation circuit 143 differs between these two embodiments. In the following, only the differences between these embodiments will be described.

Figure 33:
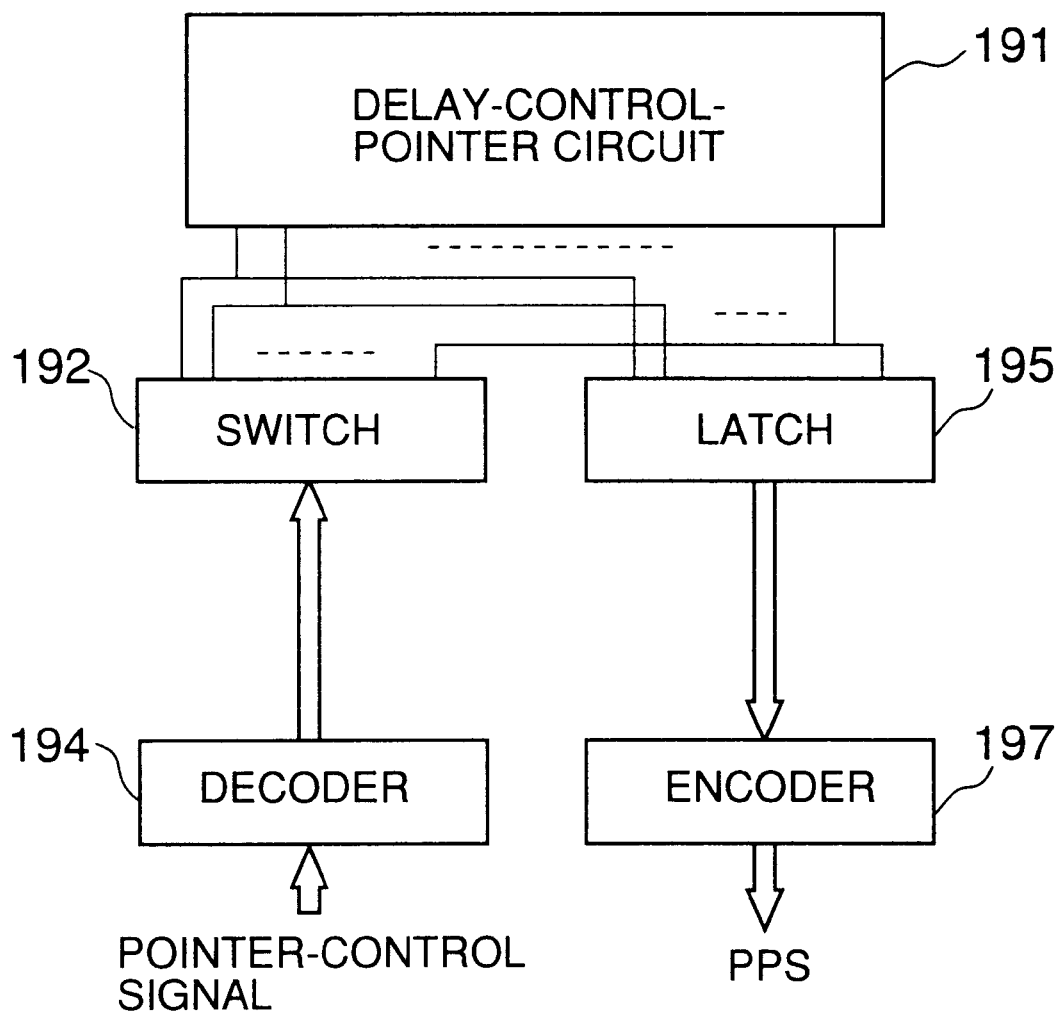
FIG. 33 is a block diagram of a delay-control pointer of the second embodiment.

FIG. 33 is a block diagram of a delay-control pointer of the second embodiment.

A delay-control-pointer circuit 191 corresponds to the circuit of FIG. 17 excluding the switch 411 and the shift register 412. A switch 192 and a decoder 194 are provided for the purpose of setting the control value of the delay-control pointer. A latch 195 and an encoder 197 are provided in order to read the control value of the delay-control pointer.

When the variable delay is comprised of 64 stages, for example, the same number of ΦEs are provided as delay-control pointers. Only one or two of these pointers are set to a state different from the state of the remaining pointers. Accordingly, data used for the setting can be represented by 6-bit data when coded. In the second embodiment, therefore, settings of the control value of the delay-control pointer are input as a code. The input may be given as parallel data, or may be given as serial data. The coded setting data is converted by the decoder 194 into data that specifies which one or adjacent two of the 64 outputs are set to a different state. According to the converted data, the 64 flip-flops of the delay-control pointer are set to appropriate states.

When the control values of the delay-control pointer need to be read to the outside, the latch 195 latches states of the 64 flip-flops included in the delay-control pointer. The encoder 197 encodes the latched states to obtain 6-bit data, which is then output to the outside.

In the first embodiment previously described, the shift register is used to convert the parallel data into the serial data when the control value of the delay-control pointer needs to be read to the outside. By the same token, when a setting is to be made to the control value of the delay-control pointer, the setting may be supplied in the form of serial data, and may be converted into parallel data by a shift register, so that the control value can be set via a switch.

In FIG. 32, pointer-control signals for setting the control values of the fine-delay-control pointer 122, the dummy fine-delay-control pointer 124, the rough-delay-control pointer 132, and the dummy rough-delay-control pointer 134 are respectively designated as SPCS, DSPCP, RPCS, and DRPCS.

Figure 34:
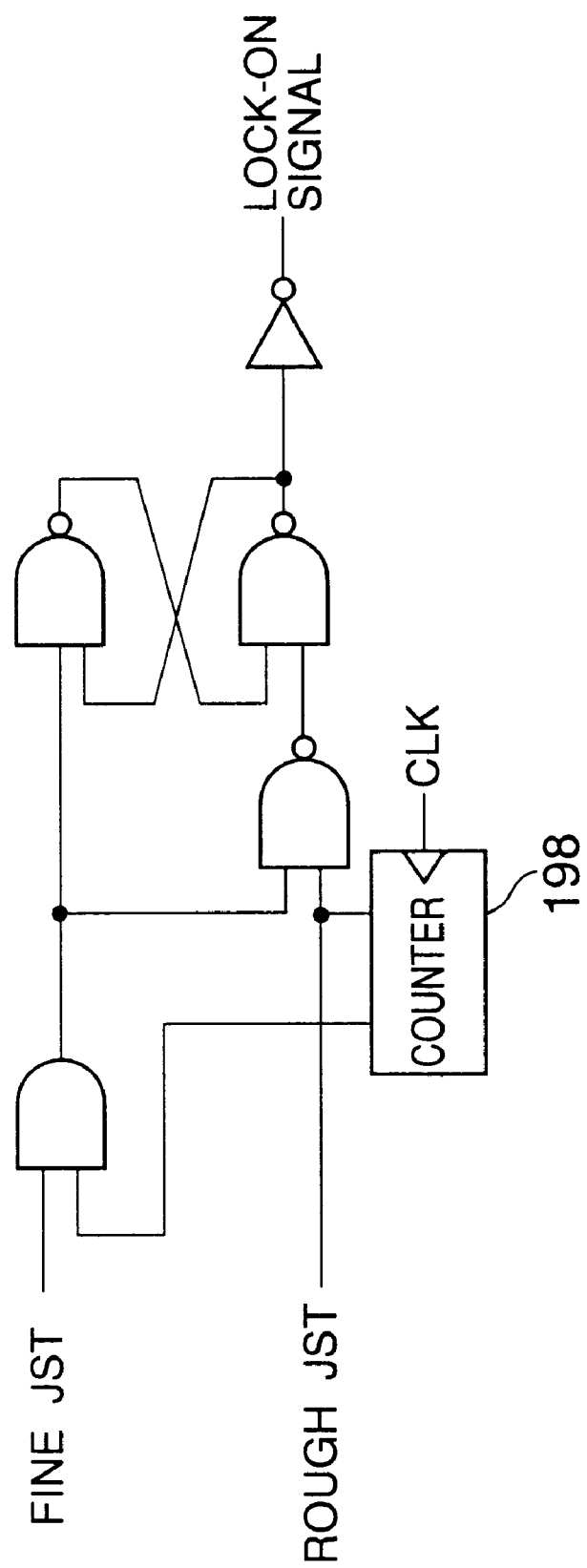
FIG. 34 is a circuit diagram of a lock-on-signal-generation circuit of the second embodiment.

FIG. 34 is a circuit diagram of the lock-on-signal-generation circuit of the second embodiment.

As is apparent from a comparison with FIG. 18, the lock-on-signal-generation circuit of FIG. 34 differs from that of the first embodiment in that an AND gate and a counter 198 are additionally provided. When the clock has jitters, it is possible that the fine-DLL circuit does not lock on. In this case, no lock-on signal is output, so that the semiconductor device cannot start operations thereof. If the clock jitters are smaller than a range covered by a single stage of the rough delay, a rough-lock-on signal is generated. In consideration of this, the second embodiment declares a lock-on state even if only a rough-lock-on signal is generated. In the circuit of FIG. 34, a lock-on signal is generated if the fine-lock-on signal does not change to LOW within a period of a predetermined number of clock cycles after the rough-lock-on signal becomes LOW. Here, the number of clock cycles is counted by a counter 198. The predetermined number of clock cycles is determined such that the number of comparison operations performed by the fine-comparison circuit 125 during this period exceeds the number of delay stages of the fine delay. This is because it is fair to assume that a lock-on state will never be achieved because of the clock jitters if the fine-DLL circuit fails to lock on after performing comparison operations more times than the number of the delay stages. In this case, therefore, the lock-on state is forcibly put in place.

Figure 35:
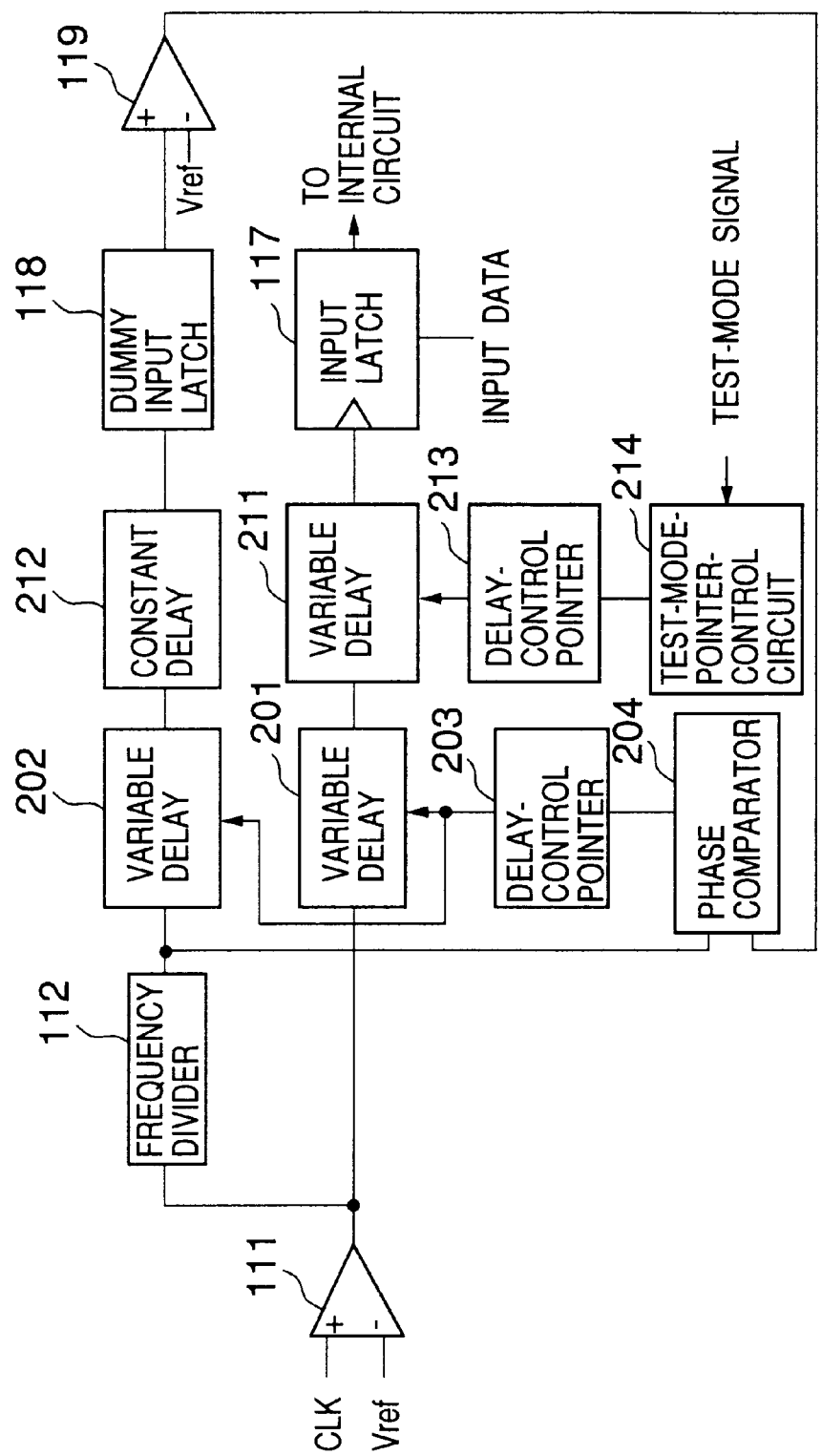
FIG. 35 is a block diagram showing a configuration of a timing-stabilization circuit according to a third embodiment.

FIG. 35 is a block diagram showing a configuration of a timing-stabilization circuit according to a third embodiment.

In the third embodiment, a constant delay 212 having a fixed delay is attached to an output of a variable delay 202, and a variable delay 211 with an externally adjustable delay is attached to an output of a variable delay 201. A delay-control pointer 213 controls the delay of the variable delay 211, and a test-mode-pointer-control circuit 214 is used for setting the control value of the delay-control pointer 213 from the outside at a time of test-mode operations. The delay-control pointer 213 and the test-mode-pointer-control circuit 214 may have the same configurations as those of the delay-control pointer and the circuit for setting the control value which are shown in FIG. 33 as the second embodiment.

In the timing-stabilization circuit of the third embodiment, a dummy clock is used for attending to phase adjustment relative to the external clock, and the input clock can be shifted by a desired amount. If the delay of the constant delay 212 is set equal to a delay that is obtained when the number of operating delay stages of the variable delay 211 is zero, the input clock can only be shifted in one direction to be delayed behind the dummy clock. If the delay of the constant delay 212 is set equal to that of half the total delay stages of the variable delay 211, the input clock can be shifted in either direction to be delayed behind or advanced ahead of the dummy clock within the same range of a possible shift in either direction.

Figure 36:
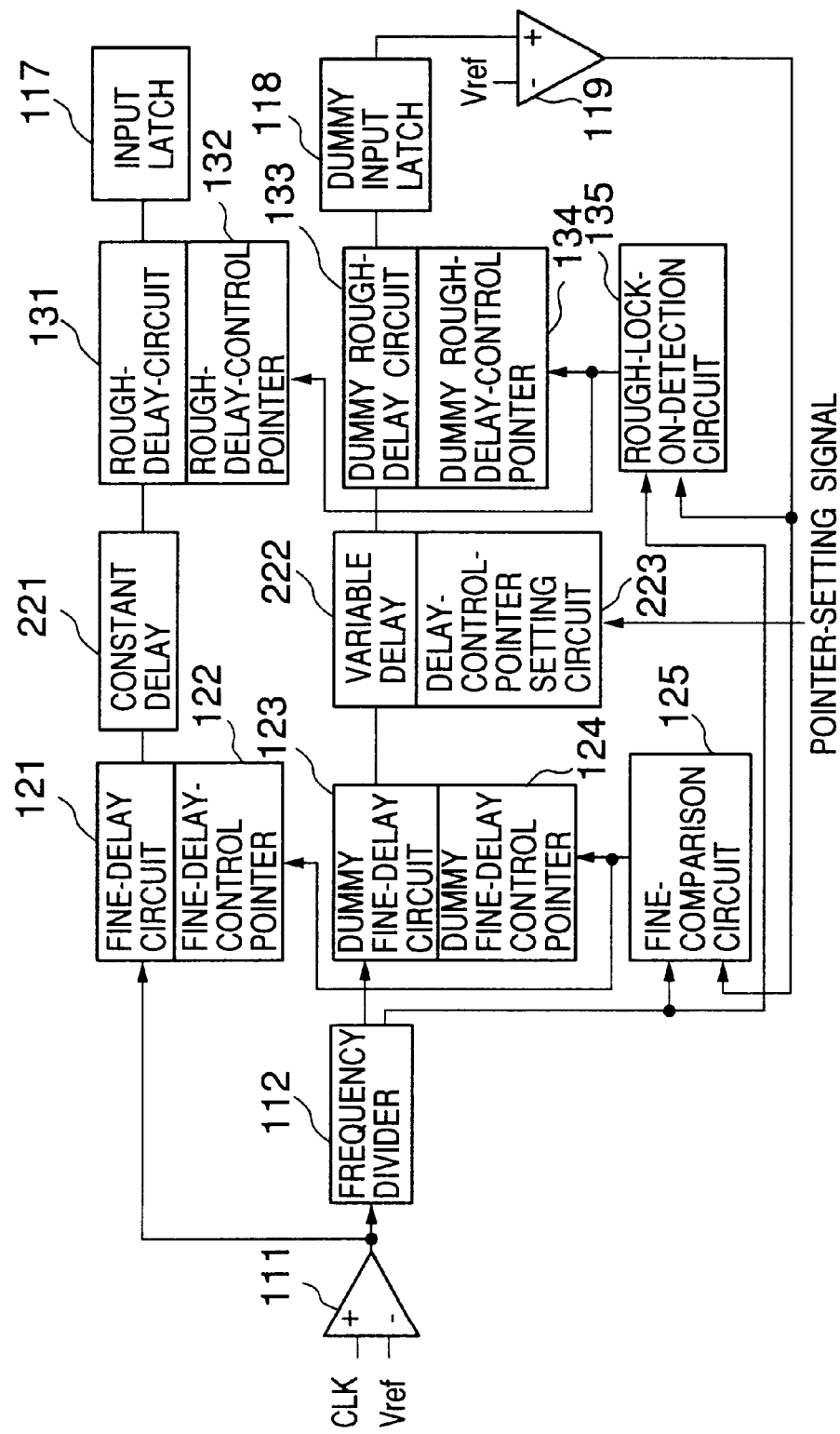
FIG. 36 is a block diagram showing a configuration of a timing-stabilization circuit according to a fourth embodiment.

FIG. 36 is a block diagram showing a configuration of a timing-stabilization circuit according to a fourth embodiment.

In the fourth embodiment, the variable delays are divided into a fine delay and a rough delay with one of a constant delay 221 and a variable delay 222 placed therebetween. The variable delay 222 allows settings thereof to be made externally. In the fourth embodiment, the constant delay 221 is situated on a path of the input clock, and the variable delay 222 is placed on a path of the dummy clock. Operations of the fourth embodiment are the same as those of the third embodiment.

Figure 37:
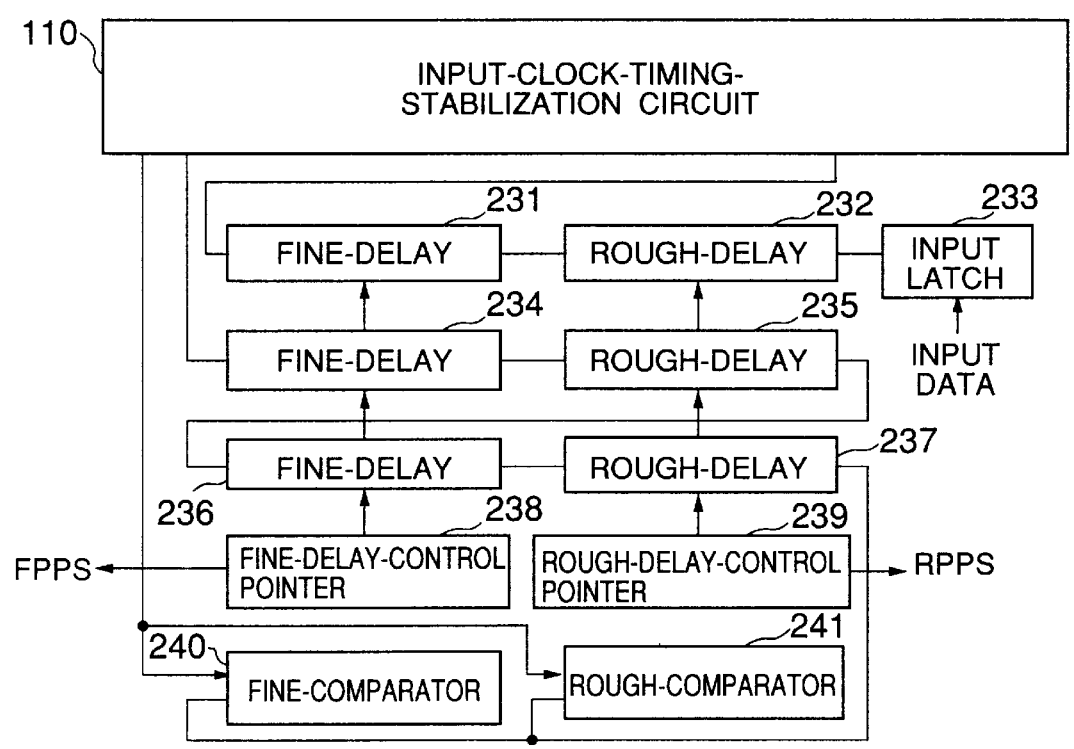
FIG. 37 is a block diagram showing a configuration of a timing-stabilization circuit according to a fifth embodiment.

FIG. 37 is a block diagram showing a configuration of a timing-stabilization circuit according to a fifth embodiment.

An input-clock-timing-stabilization circuit 110 in FIG. 37 is used for 0°-timing stabilization, and has the same configuration as that of FIG. 12 or FIG. 32, except for that the position of the delay-control pointer cannot be read. When the double-clock-rate scheme as previously described is employed, an input clock having a 180°-phase displacement needs to be generated. Block elements referred to as 236 through 241 together generate a 180°-phase-displaced input clock. An input clock supplied to the input latch 117 of the input-clock-timing-stabilization circuit 110 is delayed by a fine delay 231 and a rough delay 232 to generate a 180°-phase-displaced input clock. The frequency-divided clock A supplied from the frequency divider 112 of the input-clock-timing-stabilization circuit 110 is delayed by a fine delay 234 and a rough delay 235, and is further delayed by a fine delay 236 and a rough delay 237. A fine comparator 240 and a rough comparator 241 respectively compare phases between an output of the rough delay 237 and the frequency-divided clock C output from the frequency divider 112. A fine-delay-control pointer 238 and a rough-delay-control pointer 239 change a delay time of the delays based on comparison results of the fine comparator 240 and the rough comparator 241, respectively, such that the output of the rough delay 237 has the same phase as that of the frequency-divided clock C. Here, the fine delays 231, 234, and 236 are equivalent to each other, and the rough delays 232, 235, and 237 are also equivalent to each other. Since the fine delays 231, 234, and 236 are under the same control of the fine-delay-control pointer 238, and the rough delays 232, 235, and 237 are also under the same control of the rough-delay-control pointer 239, the output of the rough delay 232 and the output of the rough delay 235 are the same when the output of the rough delay 237 has the same phase as that of the frequency-divided clock C. Because of this, the output of the rough delay 232 is displaced exactly by 180° relative to the output of the rough delay 237, i.e., relative to the frequency-divided clock C.

In the first and second embodiments, the control value of the delay-control pointer can be read. The purpose is to obtain a delay of a single delay stage of the variable delay, so that the obtained delay can be used for the testing of the input setup time and the input hold time by utilizing the DLL circuit. Because of this, presence of the dummy input latch 118 or the dummy input buffer 119 on a path of a signal for a phase comparison, as in the first through fourth embodiments, is not desirable for the purpose of accurately measuring the delay of the single delay stage of the variable delay. As shown in FIG. 37, a path for a phase comparison aimed at generating the 180°-phase-displaced input clock does not need such elements as the dummy input latch 118 or the dummy input buffer 119, so that the delay amount of the variable delay can be accurately measured. In the fifth embodiment, the control value of the delay-control pointer for generating the 180°-phase-displaced input clock can be read. By finding correspondences between the control value of the delay-control pointer and the measured delay amount of the variable delay, the delay amount of a single delay of the variable delay can be precisely measured. It should be noted that the variable delays are manufactured through the same process in a given semiconductor device, and thereby have the same characteristics.

Figure 38:
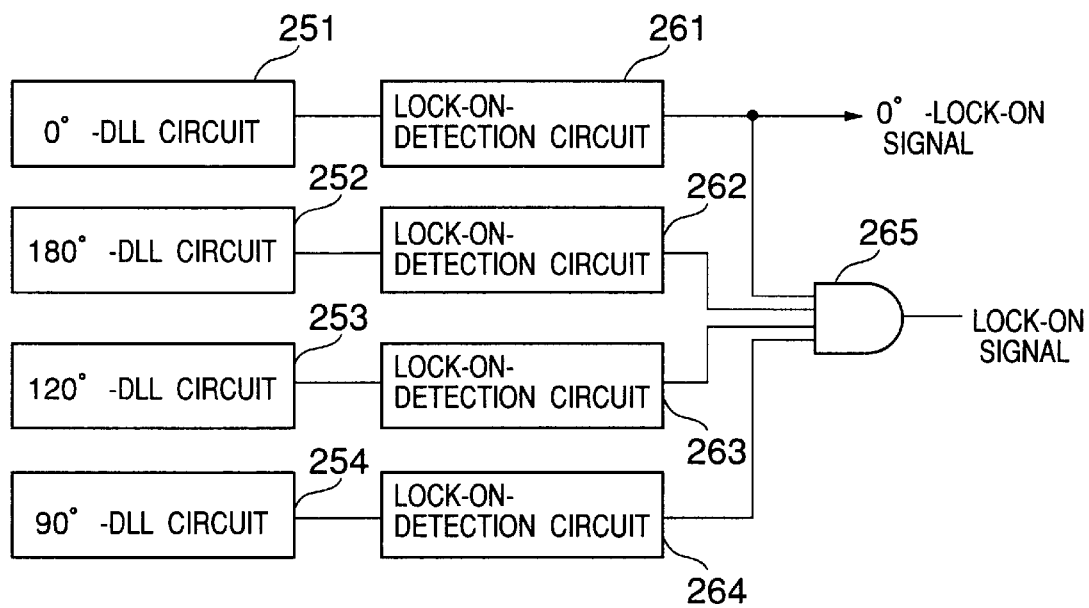
FIG. 38 is a block diagram of a lock-on-signal-generation circuit according to the fifth embodiment.

FIG. 38 is a block diagram of a lock-on-signal-generation circuit according to the fifth embodiment.

In the semiconductor device of the fifth embodiment, the 0°-DLL circuit and the 180°-DLL circuit are provided as shown in FIG. 37, and a 90°-DLL circuit and/or a 270°-DLL circuit may be additionally provided. When many DLL circuits are implemented, each of these DLL circuits has the NAND gate 151 as shown in FIG. 13 to generate a lock-on signal. As the semiconductor device as a whole, a lock-on state is declared when all the DLL circuits lock on. The lock-on-signal-generation circuit of the fifth embodiment includes a 0°-DLL circuit 251 with a lock-on-detection circuit 261 attached thereto, a 180°-DLL circuit 252 with a lock-on-detection circuit 262 attached thereto, a 120°-DLL circuit 253 with a lock-on-detection circuit 263 attached thereto, and a 90°-DLL circuit 254 with a lock-on-detection circuit 264 attached thereto. An AND gate 265 takes a logical product of outputs of the lock-on-detection circuits 261 through 264 to generate a lock-on signal.

Alternately, one of the DLL circuits 251 through 254 may be selected as a representative. Namely, the 0°-DLL circuit 251 may be selected, and the output of the lock-on-detection circuit 261 may be used as the lock-on signal of the semiconductor device.

Figure 39:
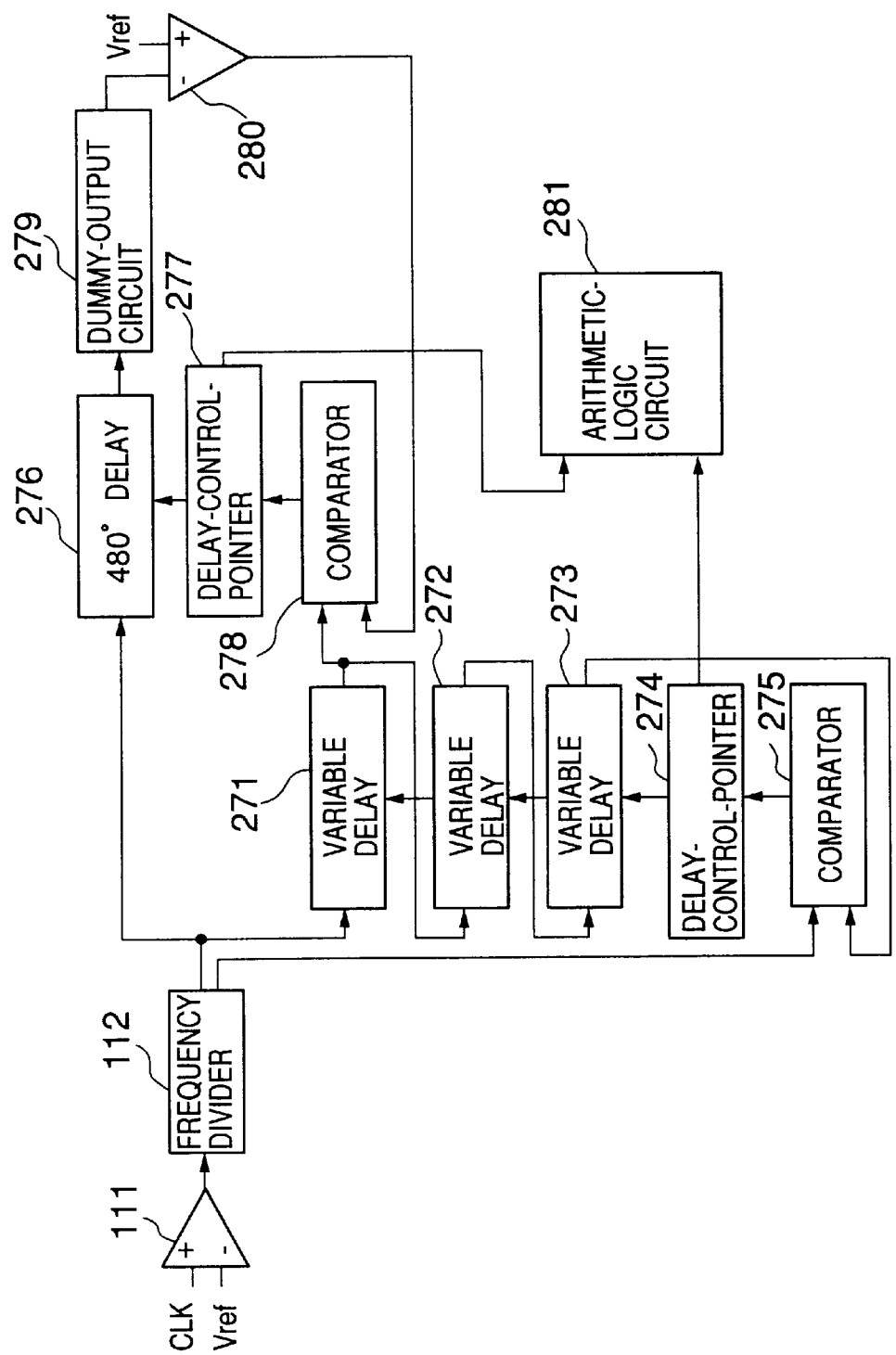
FIG. 39 is a block diagram showing a configuration of a timing-stabilization circuit according to a sixth embodiment.

FIG. 39 is a block diagram showing a configuration of a timing-stabilization circuit according to a sixth embodiment.

FIG. 39 shows an exemplary configuration for measuring a delay of a single delay stage of a variable delay. The circuit of FIG. 39 includes a variable delay 271, a variable delay 272, a variable delay 273, a delay-control pointer 274, a comparator 275, a 480° delay 276, a delay-control pointer 277, a comparator 278, a dummy-output circuit 279, a dummy input buffer 280, an arithmetic-logic circuit 281, the input buffer 111, and the frequency divider 112.

The elements referred to as 271 through 275 together generate a clock signal having a 120° displacement, and the elements designated as 276 through 278 together generate a clock signal having a 480° displacement. The comparator 278 compares, in terms of phase, a 120°-phase-displaced clock from the variable delay 271 with a signal passing through the dummy-output circuit 279 and the dummy input buffer 280 after experiencing a 480° delay through the 480° delay 276. Based on the comparison results, the delay-control pointer 277 controls a delay of the 480° delay 276. When the two DLL circuits lock on, therefore, the control value of the delay-control pointer 274 is different from the control value of the delay-control pointer 277 by 360° exactly, i.e., by one clock cycle. The number of delay stages of the variable delay, which is equivalent to one clock cycle, can thus be obtained when a difference in the control values between the delay-control pointer 274 and the delay-control pointer 277 is calculated by the arithmetic-logic circuit 281. This difference is to be output from the semiconductor device.

As described above, according to the present invention, a test of a semiconductor device having a DLL circuit, especially a test regarding DLL-circuit characteristics, can be readily conducted. Namely, an input setup time and an input hold time can be precisely measured without using highly accurate testers, so that a time period required before the DLL circuit locks on can be measured under various conditions.

Further, the present invention is not limited to these embodiments, but various variations and modifications may be made without departing from the scope of the present invention.

What is claimed is:

1. A method of measuring a time which a timing-stabilization circuit requires in order to complete timing stabilization with regard to a semiconductor device which is provided with a first function to reset said timing-stabilization circuit and a second function to output a signal indicative of completion of said timing stabilization, said method comprising the steps of:

a) activating said timing-stabilization circuit;

b) detecting a timing of said completion of said timing stabilization by using said second function; and c) measuring said time which said timing-stabilization circuit requires to complete said timing stabilization based on said timing.

2. The method as claimed in claim 1, wherein said step a) comprises a step of activating said timing-stabilization circuit by providing a power voltage for said semiconductor device so as to drive said timing-stabilization circuit.

3. The method as claimed in claim 2, further comprising a step of resetting said timing-stabilization circuit by using said first function immediately after said step a), wherein said step c) measures a time period between a timing of said resetting and said timing of said completion of said timing stabilization.

4. The method as claimed in claim 1, wherein said step a) comprises a step a1) of activating said timing-stabilization circuit by switching said semiconductor device from a condition in which said timing-stabilization circuit is inactive while a power voltage is supplied to said semiconductor device.

5. The method as claimed in claim 4, wherein said step a) further comprises, before said step a1), a step of deactivating said timing-stabilization circuit after making said timing-stabilization circuit complete timing stabilization.

6. The method as claimed in claim 1, further comprising a step of setting said timing-stabilization circuit to a test mode by inputting a first signal to said semiconductor device.

7. The method as claimed in claim 6, wherein said first signal is input to said semiconductor device via a packet-data input.

8. The method as claimed in claim 3, wherein said step of resetting said timing-stabilization circuit comprises a step of resetting said timing-stabilization circuit by inputting a second signal to said semiconductor device.

9. The method as claimed in claim 8, wherein said second signal is input to said semiconductor device via a packet-data input.

10. The method as claimed in claim 1, further comprising a step of making said timing-stabilization circuit exit from a test mode by inputting a third signal to said semiconductor device.

11. The method as claimed in claim 10, wherein said third signal is input to said semiconductor device via a packet-data input.

12. A machine readable medium having a program embodied therein for causing a tester to measure a time which a timing-stabilization circuit requires in order to complete timing stabilization with regard to a semiconductor device which is provided with a first function to reset said timing-stabilization circuit and a second function to output a signal indicative of completion of said timing stabilization, said program comprising:
first program-code means for activating said timing-stabilization circuit;
second program-code means for detecting a timing of said completion of said timing stabilization by using said second function; and
third program-code means for measuring said time which said timing-stabilization circuit requires to complete said timing stabilization based on said timing.

13. The machine readable medium as claimed in claim 12, wherein said first program-code means comprises program-code means for activating said timing-stabilization circuit by providing a power voltage for said semiconductor device so as to drive said timing-stabilization circuit.

14. The machine readable medium as claimed in claim 13, further comprising program-code means for resetting said timing-stabilization circuit by using said first function immediately after said first program-code means activates said timing-stabilization circuit, wherein said third program-code means measures a time period between a timing of said resetting and said timing of said completion of said timing stabilization.

15. The machine readable medium as claimed in claim 12, wherein said first program-code means comprises program-code means for activating said timing-stabilization circuit by switching said semiconductor device from a condition in which said timing-stabilization circuit is inactive while a power voltage is supplied to said semiconductor device.

16. The machine readable medium as claimed in claim 15, wherein said first program-code means further comprises program-code means for deactivating said timing-stabilization circuit before said timing-stabilization circuit is activated and after making said timing-stabilization circuit complete timing stabilization.

17. A semiconductor device comprising a timing-stabilization circuit which includes:
a variable delay supplying a delayed clock by delaying a clock;
a timing-adjustment-signal-generation circuit generating a target signal in accordance with said delayed clock, said target signal being subjected to a timing adjustment;
a phase comparator comparing phases between said target signal and said clock;
a delay-control pointer controlling a delay of said variable delay based on comparison results of said phase comparator such that said target signal has a predetermined phase relation with said clock; and
a pointer-position-control circuit setting a control value of said delay-control pointer to a predetermined value in response to a set signal such that said delay of said variable delay becomes a desired amount.

18. The semiconductor device as claimed in claim 17, wherein said phase comparator stops operations thereof in response to said set signal.

19. The semiconductor device as claimed in claim 17, further comprising a reset-signal-generation circuit which generates a reset signal in synchronism with said clock in response to a signal regarding an on/off state of a power voltage, and supplying said reset signal as said set signal.

20. The semiconductor device as claimed in claim 17, wherein said pointer-position-control circuit comprises:
a reset-signal-generation circuit generating said set signal for a predetermined time period in response to one of a power-on-reset signal and a test-mode signal; and
a connection circuit providing a connection for said set signal to said delay-control pointer.

21. The semiconductor device as claimed in claim 20, wherein said phase comparator increments or decrements said control value of said delay-control pointer according to an external signal supplied to said semiconductor device.

22. The semiconductor device as claimed in claim 17, further comprising a pointer-value writing circuit which writes said predetermined value to said delay-control pointer when said predetermined value is externally input to said semiconductor device.

23. The semiconductor device as claimed in claim 22, wherein said predetermined value is input as serial data to said semiconductor device, and wherein said pointer-value writing circuit includes a shift register for converting said serial data into parallel data, and writes said parallel data to said delay-control pointer.

24. The semiconductor device as claimed in claim 22, wherein said predetermined value is input as a code to said semiconductor device, and wherein said pointer-value writing circuit includes a decoder for decoding said code.

25. The semiconductor device as claimed in claim 17, further comprising a pointer-value reading circuit which outputs said control value of said delay-control pointer from said semiconductor device.

26. The semiconductor device as claimed in claim 25, wherein said pointer-value reading circuit comprises:
a latch circuit latching said control value of said delay-control pointer; and
a shift register which converts an output of said latch circuit into serial data.

27. The semiconductor device as claimed in claim 25, wherein said pointer-value reading circuit comprises an encoder for encoding said control value of said delay-control pointer, so that said control value of said delay-control pointer is output as an encoded value from said semiconductor device.

28. The semiconductor device as claimed in claim 25, further comprising:
a plurality of variable delays, said variable delay being one of said plurality of variable delays;
a plurality of delay-control pointers, said delay-control pointer being one of said plurality of delay-control pointers; and an arithmetic logic circuit which calculates a difference in said control value between said plurality of delay-control pointers, wherein a calculation result of said arithmetic logic circuit is output from said semiconductor device.

29. The semiconductor device as claimed in claim 28, further comprising a plurality of timing-stabilization circuits, said timing-stabilization circuit being one of said plurality of timing-stabilization circuits, and said plurality of timing-stabilization circuits including a 0°-phase timing-stabilization circuit which generates a 0°-phase clock, wherein said arithmetic logic circuit calculates a difference in said control value between said 0°-phase timing-stabilization circuit and another one of said plurality of timing-stabilization circuits.

30. The semiconductor device as claimed in claim 29, wherein said another one of said plurality of timing-stabilization circuits having a largest number of variable-delay stages among said plurality of timing-stabilization circuits.

31. The semiconductor device as claimed in claim 29, wherein said another one of said plurality of timing-stabilization circuits is a 180°-phase timing-stabilization circuit which generates a 180°-phase clock.

32. The semiconductor device as claimed in claim 17, wherein said timing-stabilization circuit further includes a lock-on-detection circuit which outputs a lock-on signal to an outside of said semiconductor device when said target signal falls within a predetermined phase range relative to said clock.

33. The semiconductor device as claimed in claim 32, further comprising:

a plurality of timing-stabilization circuits, said timing-stabilization circuit being one of said plurality of timing-stabilization circuits; and a logic circuit taking a logic product of lock-on signals supplied from said plurality of timing-stabilization circuits, said logic product being output as a lock-on-signal of said semiconductor device.

34. The semiconductor device as claimed in claim 32, further comprising a plurality of timing-stabilization circuits, said timing-stabilization circuit being one of said plurality of timing-stabilization circuits, wherein a lock-on signal of one of said plurality of timing-stabilization circuits which has a largest number of variable-delay stages is output as a lock-on signal of said semiconductor device.

35. The semiconductor device as claimed in claim 17, wherein said variable delay includes a fine variable delay for a fine adjustment of a first delay thereof and a rough variable delay for a rough adjustment of a second delay thereof, said fine variable delay and said rough variable delay being connected in series;

said delay-control pointer includes a fine delay-control pointer for controlling said first delay and a rough delay-control pointer for controlling said second delay;

said phase comparator includes a fine phase comparator making a fine phase comparison for said fine delay-control pointer and a rough phase comparator making a rough phase comparison for said rough delay-control pointer; and said pointer-position-control circuit includes a fine pointer-position-control circuit setting a first predetermined value to said fine delay-control pointer and a rough pointer-position-control circuit setting a second predetermined value to said rough delay-control pointer, so that said first delay and said second delay can be set to respective desired amounts.

36. The semiconductor device as claimed in claim 35, further comprising:

a fine lock-on-signal-detection circuit which generates a fine lock-on signal when said target signal falls within a predetermined phase range relative to said clock;

a rough lock-on-signal-detection circuit which generates a rough lock-on signal when said target signal falls within said predetermined phase range relative to said clock; and a lock-on-signal-generation circuit which outputs a lock-on signal indicating a lock-on state of said timing-stabilization circuit when said fine lock-on signal and said rough lock-on signal are generated.

37. The semiconductor device as claimed in claim 36, wherein said lock-on-signal-generation circuit outputs said lock-on signal when a predetermined time period passes after said rough lock-on signal is generated even if said fine lock-on signal is not generated.

38. The semiconductor device as claimed in claim 37, wherein said predetermined time period is such that a number of comparison operations performed by said fine phase comparator during said predetermined time period is more than a number of variable-delay stages of said fine variable delay.

39. The semiconductor device as claimed in claim 35, further comprising a rough lock-on-signal-detection circuit which generates a rough lock-on signal when said target signal falls within a predetermined phase range relative to said clock, wherein said rough lock-on signal is regarded as an indicator of a lock-on state of said timing-stabilization circuit.

40. The semiconductor device as claimed in claim 17, further comprising a frequency divider which divides a frequency of said clock by a variable frequency-division ratio, wherein said variable delay receives a frequency-divided clock obtained by said frequency divider dividing said frequency of said clock, and said phase comparator compares phases between said target signal and said frequency-divided clock.

41. The semiconductor device as claimed in claim 40, wherein said frequency divider resets said variable frequency-division ratio to an initial ratio thereof in response to said set signal.

42. A semiconductor device comprising a timing-stabilization circuit which includes:

a variable delay supplying a delayed clock by delaying a clock;

a timing-adjustment-signal-generation circuit generating a target signal in accordance with said delayed clock, said target signal being subjected to a timing adjustment;

a phase comparator comparing phases between said target signal and said clock;

a delay-control pointer controlling a delay of said variable delay based on comparison results of said phase comparator such that said target signal has a predetermined phase relation with said clock; and an adjustment delay attached to said variable delay, said adjustment delay delaying said delayed clock and allowing a delay thereof to be externally set.

43. A semiconductor device comprising a timing-stabilization circuit which includes:

a variable delay supplying a delayed clock by delaying a clock;

a dummy variable delay supplying a dummy delayed clock by delaying said clock, said dummy variable delay being equivalent to said variable delay;

a timing-adjustment-signal-generation circuit generating a target signal from said dummy delayed clock, said target signal being subjected to a timing adjustment;

a phase comparator comparing phases between said target signal and said clock;

a delay-control pointer controlling delays of said variable delay and said dummy variable delay based on comparison results of said phase comparator such that said target signal has a predetermined phase relation with said clock, wherein said delay-control pointer includes a normal delay-control pointer for controlling a delay of said variable delay and a dummy delay-control pointer for controlling a delay of said dummy variable delay;

a normal pointer-position-control circuit setting a control value of said normal delay-control pointer to a first predetermined value in response to a set signal; and a dummy pointer-position-control circuit setting a control value of said dummy delay-control pointer to a second predetermined value in response to said set signal, wherein a phase difference between said delayed clock and said dummy delayed clock can be set to a desired amount.

44. The semiconductor device as claimed in claim 43, wherein said phase comparator can supply said comparison results for incrementing or decrementing said control value of said normal delay-control pointer and said control value of said dummy delay-control pointer in response to an externally provided signal during a period when said phase comparator stops comparison operations thereof.

45. The semiconductor device as claimed in claim 43, further comprising a pointer-value writing circuit which writes said first predetermined value and said second predetermined value to said delay-control pointer when said first predetermined value and said second predetermined value are externally provided.

46. The semiconductor device as claimed in claim 43, further comprising a pointer-value reading circuit which outputs said control value of said normal delay-control pointer and said control value of said dummy delay-control pointer to an outside of said semiconductor device.

47. The semiconductor device as claimed in claim 43, wherein said variable delay includes a fine variable delay for a fine adjustment of a first delay thereof and a rough variable delay for a rough adjustment of a second delay thereof, said fine variable delay and said rough variable delay being connected in series;

said dummy variable delay includes a dummy fine variable delay for a fine adjustment of a third delay thereof and a dummy rough variable delay for a rough adjustment of a fourth delay thereof, said dummy fine variable delay and said dummy rough variable delay being connected in series;

said normal delay-control pointer includes a fine delay-control pointer for controlling said first delay and a rough delay-control pointer for controlling said second delay;

said dummy delay-control pointer includes a dummy fine delay-control pointer for controlling said third delay and a dummy rough delay-control pointer for controlling said fourth delay;

said phase comparator includes a fine phase comparator making a fine phase comparison for said fine delay-control pointer and said dummy fine delay-control pointer, and further includes a rough phase comparator making a rough phase comparison for said rough delay-control pointer and said dummy rough delay-control pointer;

said normal pointer-position-control circuit includes a fine pointer-position-control circuit making a setting to said fine delay-control pointer and a rough pointer-position-control circuit making a setting to said rough delay-control pointer; and said dummy pointer-position-control circuit includes a dummy fine pointer-position-control circuit making a setting to said dummy fine delay-control pointer and a dummy rough pointer-position-control circuit making a setting to said dummy rough delay-control pointer.

48. A semiconductor device comprising a timing-stabilization circuit which includes:

a variable delay supplying a delayed clock by delaying a clock;

a dummy variable delay supplying a dummy delayed clock by delaying said clock, said dummy variable delay being equivalent to said variable delay;

a timing-adjustment-signal-generation circuit generating a target signal from said dummy delayed clock, said target signal being subjected to a timing adjustment;

a phase comparator comparing phases between said target signal and said clock;

a delay-control pointer controlling delays of said variable delay and said dummy variable delay based on comparison results of said phase comparator such that said target signal has a predetermined phase relation with said clock;

an adjustment delay attached to said variable delay and delaying said delayed clock; and a dummy adjustment delay attached to said dummy variable delay and delaying said dummy delayed clock, wherein at least one of said adjustment delay and said dummy adjustment delay allows a delay thereof to be externally set, and a phase difference between said delayed clock and said dummy delayed clock can be set to a desired amount.

49. The semiconductor device as claimed in claim 48, wherein said delay of said adjustment delay can be externally set, and said delay of said dummy adjustment delay is fixed.

50. The semiconductor device as claimed in claim 48, wherein said delay of said adjustment delay is fixed, and said delay of said dummy adjustment delay can be externally set.

51. The semiconductor device as claimed in claim 48, wherein one of said adjustment delay and said dummy adjustment delay allows a delay thereof to be externally set, and another one of said adjustment delay and said dummy adjustment delay has a fixed delay, said fixed delay being equal to a delay of said one of said adjustment delay and said dummy adjustment delay when a number of operating delay stages in said one of said adjustment delay and said dummy adjustment delay is zero.

52. The semiconductor device as claimed in claim 48, wherein one of said adjustment delay and said dummy adjustment delay allows a delay thereof to be externally set, and another one of said adjustment delay and said dummy adjustment delay has a fixed delay, said fixed delay being substantially equal to half a delay of total delay stages in said one of said adjustment delay and said dummy adjustment delay.

53. The semiconductor device as claimed in claim 48, wherein
   said variable delay includes a fine variable delay for a fine adjustment of a first delay thereof and a rough variable delay for a rough adjustment of a second delay thereof, said fine variable delay and said rough variable delay being connected in series;
   said dummy variable delay includes a dummy fine variable delay for a fine adjustment of a third delay thereof and a dummy rough variable delay for a rough adjustment of a fourth delay thereof, said dummy fine variable delay and said dummy rough variable delay being connected in series;
   said delay-control pointer includes a fine delay-control pointer for controlling said first delay and said third delay and a rough delay-control pointer for controlling said second delay and said fourth delay; and
   said phase comparator includes a fine phase comparator making a fine phase comparison for said fine delay-control pointer and a rough phase comparator making a rough phase comparison for said rough delay-control pointer.

54. The semiconductor device as claimed in claim 48, further comprising a frequency divider which divides a frequency of said clock by a variable frequency-division ratio, where in said variable delay receives a frequency-divided clock obtained by said frequency divider dividing said frequency of said clock, and said phase comparator compares phases between said target signal and said frequency-divided clock.

55. The semiconductor device as claimed in claim 54, wherein said frequency divider resets said variable frequency-division ratio to an initial ratio thereof in response to said set signal.

56. A semiconductor device comprising:
   an input-timing-clock-generation circuit which delays a clock to generate a delayed clock and adjusts a delay of said delayed clock to generate an input-timing clock having a first predetermined phase displacement with said clock;
   an output buffer which outputs output data in synchronism with said clock;
   an input buffer which latches said output data in synchronism with said input-timing clock; and
   a measured-data outputting circuit;
   wherein said input-timing-clock-generation circuit, in response to a test-mode signal, generates shift clocks having a second predetermined phase displacement with said input-timing clock by shifting said input-timing clock forward and backward, respectively, and said input buffer latches said output data as latched data in synchronism with said shift clocks, said measured-data outputting circuit outputting said latched data as measured data.

57. The semiconductor device as claimed in claim 56, further comprising a comparison circuit which compares said latched data with said output data, said measured-data outputting circuit outputting comparison results of said comparison circuit as said measured data.

58. The semiconductor device as claimed in claim 56, wherein said second predetermined phase displacement can be externally set.

59. The semiconductor device as claimed in claim 56, wherein
   said output buffer supplies said output data to a data output node of said semiconductor device;
   said input buffer latches said output data appearing on said data output node; and
   said measured-data outputting circuit outputs said measured data to another data output node different from said data output node.

60. The semiconductor device as claimed in claim 56, wherein
   said output buffer supplies said output data to a data output node of said semiconductor device;
   said input buffer latches said output data appearing on said data output node; and
   said measured-data outputting circuit includes a register which stores said measured data temporarily, and outputs said measured data to said data output node.

61. The semiconductor device as claimed in claim 56, wherein
   said output buffer supplies dummy output data as said output data to a dummy data output node, said dummy output data being internally generated inside said semiconductor device only for internal use; and
   said input buffer latches said dummy output data appearing on said dummy data output node as said output data.

62. The semiconductor device as claimed in claim 61, wherein said measured-data outputting circuit outputs said measured data to a data output node of said semiconductor device.

63. A semiconductor device comprising:
   an input-timing-clock-generation circuit which delays a clock to generate a delayed clock and adjusts a delay of said delayed clock to generate an input-timing clock having a first predetermined phase displacement with said clock;
   an input buffer which latches output data as latched data in synchronism with said input-timing clock;
   output-timing-clock-generation circuit which generates shift clocks having a second predetermined phase displacement with said clock by shifting said clock forward and backward, respectively, in response to a test-mode signal;
   an output buffer which outputs said output data in synchronism with said shift clocks; and
   a measured-data outputting circuit outputting said latched data as measured data.

64. The semiconductor device as claimed in claim 63, further comprising a comparison circuit which compares said latched data with said output data, said measured-data outputting circuit outputting comparison results of said comparison circuit as said measured data.

65. The semiconductor device as claimed in claim 63, wherein said second predetermined phase displacement can be externally set.

66. The semiconductor device as claimed in claim 63, wherein
   said output buffer supplies said output data to a data output node of said semiconductor device;
   said input buffer latches said output data appearing on said data output node; and
   said measured-data outputting circuit outputs said measured data to another data output node different from said data output node.

67. The semiconductor device as claimed in claim 63, wherein
   said output buffer supplies said output data to a data output node of said semiconductor device;

said input buffer latches said output data appearing on said data output node; and said measured-data outputting circuit includes a register which stores said measured data temporarily, and outputs said measured data to said data output node.

68. The semiconductor device as claimed in claim 63, wherein said output buffer supplies dummy output data as said output data to a dummy data output node, said dummy output data being internally generated inside said semiconductor device only for internal use; and said input buffer latches said dummy output data appearing on said dummy data output node as said output data.

69. The semiconductor device as claimed in claim 68, wherein said measured-data outputting circuit outputs said measured data to a data output node of said semiconductor device.

70. A semiconductor device comprising a timing-stabilization circuit which includes:

a variable delay supplying a delayed clock by delaying a clock;

a timing-adjustment-signal-generation circuit generating a target signal in accordance with said delayed clock, said target signal being subjected to a timing adjustment;

a phase comparator comparing phases between said target signal and said clock; and a delay-control pointer controlling a delay of said variable delay based on comparison results of said phase comparator such that said target signal has a predetermined phase relation with said clock, wherein said phase comparator stops comparison operations thereof in response to a test-mode signal.

71. A semiconductor device comprising a timing-stabilization circuit which includes:

a frequency divider having a variable frequency-division ratio to divide a frequency of a clock;

a variable delay supplying a delayed clock by delaying a frequency-divided clock from said frequency divider;

a timing-adjustment-signal-generation circuit generating a target signal in accordance with said delayed clock, said target signal being subjected to a timing adjustment;

a phase comparator comparing phases between said target signal and said frequency-divided clock; and a delay-control pointer controlling a delay of said variable delay based on comparison results of said phase comparator such that said target signal has a predetermined phase relation with said clock, wherein said frequency divider resets said frequency-division ratio to an initial ratio in response to a set signal.

72. A semiconductor device comprising:

a pointer-value reading circuit; and a timing-stabilization circuit which includes:

a frequency divider having a variable frequency-division ratio to divide a frequency of a clock;

a variable delay supplying a delayed clock by delaying a frequency-divided clock from said frequency divider;

a timing-adjustment-signal-generation circuit generating a target signal in accordance with said delayed clock, said target signal being subjected to a timing adjustment;

a phase comparator comparing phases between said target signal and said frequency-divided clock; and a delay-control pointer controlling a delay of said variable delay based on comparison results of said phase comparator such that said target signal has a predetermined phase relation with said clock, wherein said pointer-value reading circuit outputs a control value of said delay-control pointer to an outside of said semiconductor device.

73. A method of measuring a setup time and a hold time of a semiconductor device which includes an input-timing-clock-generation circuit using a variable delay for delaying a clock to generate an input-timing clock and by adjusting a delay of said variable delay such that said input-timing clock has a first predetermined phase displacement with said clock, and an input buffer for latching output data in synchronism with said input-timing clock, said method comprising the steps of:

a) generating, inside said semiconductor device, shift clocks having a second predetermined phase displacement with said input-timing clock by shifting said input-timing clock forward and backward, respectively, in response to a test-mode signal;

b) outputting output data from an output buffer provided inside said semiconductor device in synchronism with said clock;

c) latching said output data in synchronism with said shift clocks by use of said input buffer;

d) comparing said output data with data latched at said step c);

e) repeatedly outputting comparison results of said step d) as measured data by making successive changes to said second predetermined phase displacement.

* * * * *